(12) United States Patent
Khazaei et al.

(10) Patent No.: US 7,031,355 B2
(45) Date of Patent: *Apr. 18, 2006

(54) HIGH EFFICIENCY SINGLE AND MULTIPLE WAVELENGTH STABILIZED SYSTEMS

(75) Inventors: Hamid R. Khazaei, Westford, MA (US); Hongmin Chen, Acton, MA (US); David Kirk Lewis, Maynard, MA (US); Hsing Cheng, San Jose, CA (US)

(73) Assignee: Optovia Corporation, Action, MA (US)

( * ) Notice: Subject to any disclaimer, the term of this patent is extended or adjusted under 35 U.S.C. 154(b) by 86 days.

This patent is subject to a terminal disclaimer.

(21) Appl. No.: 10/776,808

(22) Filed: Feb. 11, 2004

(65) Prior Publication Data

US 2005/0175046 A1    Aug. 11, 2005

(51) Int. Cl.
*H01S 3/13*        (2006.01)
*H01S 3/10*        (2006.01)

(52) U.S. Cl. .................. 372/32; 372/29.02; 372/20

(58) Field of Classification Search ............. 372/20, 372/29.02, 32
See application file for complete search history.

(56) References Cited

U.S. PATENT DOCUMENTS

| | | | |
|---|---|---|---|
| 3,676,799 A * | 7/1972 | Danielmeyer | 372/32 |
| 4,975,919 A * | 12/1990 | Amada et al. | 372/32 |
| 6,052,394 A | 4/2000 | Lee et al. | 372/6 |
| 6,351,583 B1 | 2/2002 | Bergmann et al. | 385/14 |
| 6,400,860 B1 | 6/2002 | Chandrasekhar et al. | 385/24 |
| 6,459,829 B1 | 10/2002 | Yamauchi et al. | 385/24 |
| 6,525,872 B1 | 2/2003 | Ziari et al. | 359/341.3 |
| 2002/0061039 A1* | 5/2002 | Le Gall et al. | 372/32 |
| 2003/0112836 A1* | 6/2003 | Kim et al. | 372/18 |
| 2005/0036527 A1* | 2/2005 | Khazaei et al. | 372/29.02 |

OTHER PUBLICATIONS

Papez entitled "Wavelength and intensity stabilization of 980nm diode lasers coupled to fibre Bragg gratings" by R. F. Ventrudo et al., Electronic Letters, Dec. 8th, 1994, vol. 30, No. 25, at pp. 2147-2149, and cited at p. 159 of the specification.

(Continued)

*Primary Examiner*—James Menefee
(74) *Attorney, Agent, or Firm*—Irwin Ostroff; Erwin W. Pfeifle

(57) ABSTRACT

In a stabilized laser system, a an output signal is to be generated having a desired central wavelength. At least one laser, which, while emitting light and having a preselected portion thereof fed back thereto, causes the output signal of the laser to be shifted in wavelength in a first direction which is spaced apart from the center wavelength of the fed back signal. A feedback generating arrangement processes a first portion of the output signal from each laser and generates a feedback signal having a spectral response peaking at a wavelength shifted in an opposite direction to the first direction generated by each laser. The feedback signal each laser to provide an output signal at the output of the stabilized laser system having a spectral response that peaks essentially at the desired wavelength.

78 Claims, 32 Drawing Sheets

OTHER PUBLICATIONS

Book entitled "Diode Lasers and Photonic Integrated Circuits" by L. A. Coldren and S. W. Corzine, Published by Wiley & Sons, 1995, pp. 252-257, and cited at p. 159 of the specification, no month.

Book entitled "Fundamentals of Optical Waveguides" by K. Okamaoto, Published by Academic Press, 2000, pp. 161-165, no month.

Paper entitled "Fiber Loop Reflectors" by D. B. Mortimore, Journal of Lightwave Technology, vol. 6, No. 7, Jul. 1988, at pp. 1212-1223.

Paper entitled "Optical Fiber Filter Comprising a Single-Coupler Fiber Ring (or Loop) and a Double-Coupler Fiber Mirror" by Y. H. Ja, Journal of Lightwave Technology, vol. 9, No. 8, Aug. 1991.

* cited by examiner

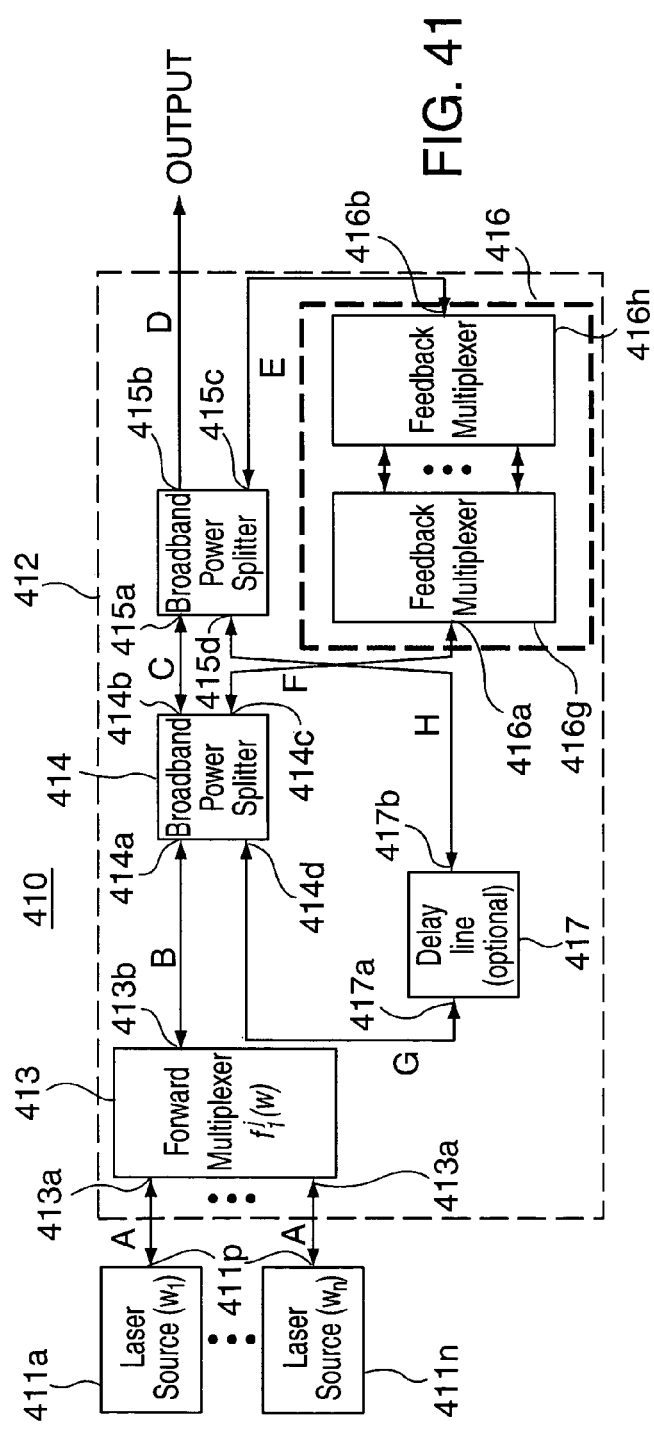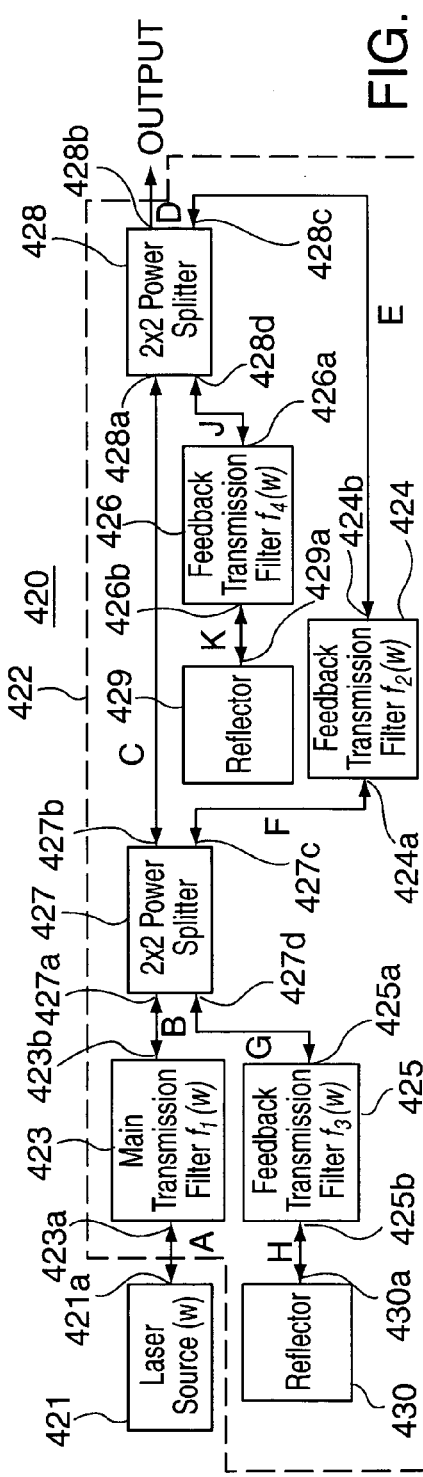

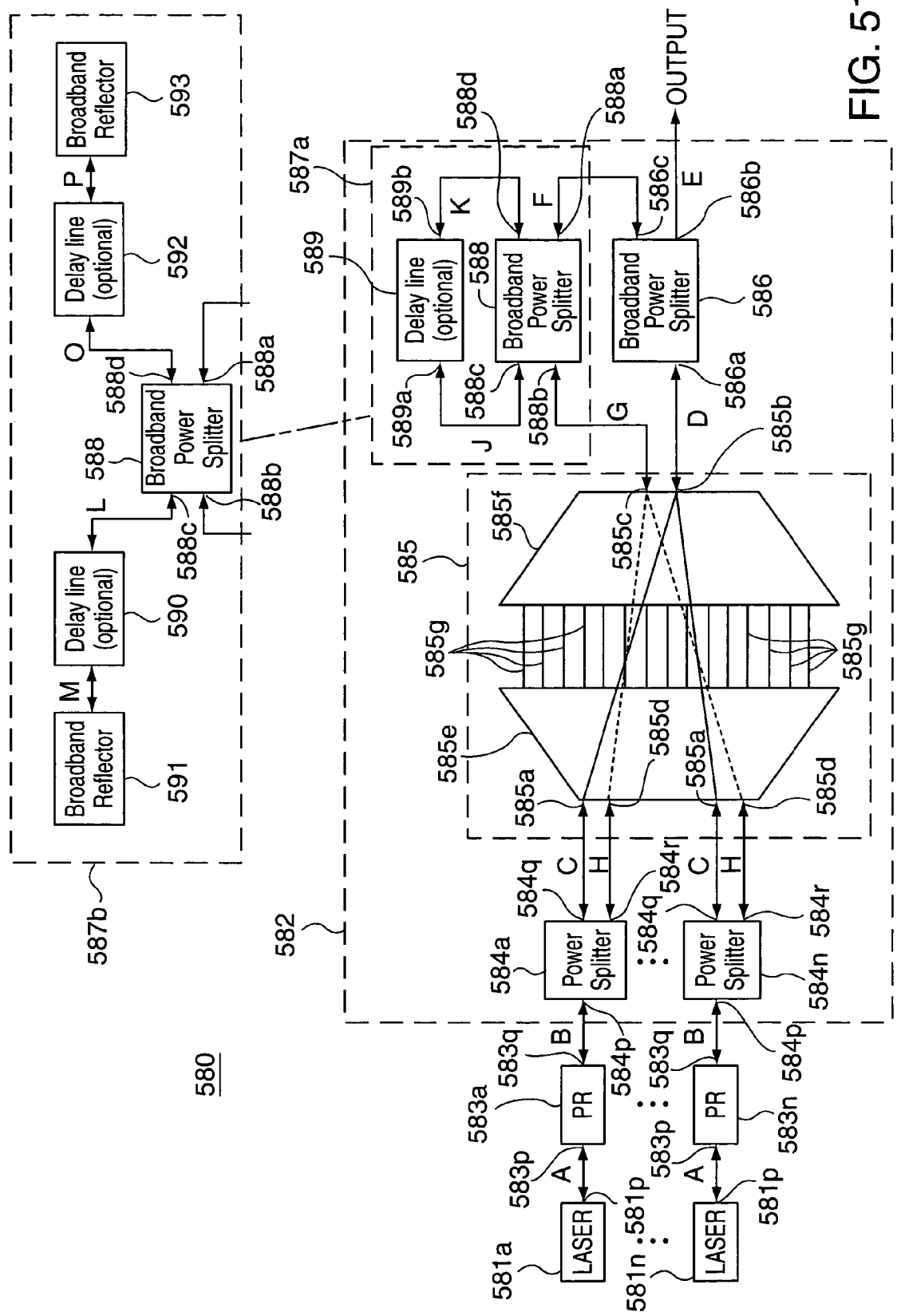

HIGH EFFICIENCY SINGLE AND MULTIPLE WAVELENGTH STABILIZED SYSTEMS

CROSS-REFERENCE TO RELATED APPLICATIONS

This application is related to U.S. Ser. No. 10/776,810, which is entitled "Single And Multiple Wavelength Reflector And Transmission Filter Arrangements" (Optovia 7), and U.S. Ser. No. 10/776,809, which is entitled "Stable High Efficiency Multiple Wavelength Laser Sources" (Optovia 8), both having a common assignee and some common inventors with the present application, and being filed concurrently with the present application.

FIELD OF THE INVENTION

The present invention relates to a method and apparatus intended primarily, although not so limited, for providing a high efficiency stabilized wavelength laser system for irradiating (pumping) particular portions of an optical fiber used as part of an optical fiber transmission line to form such portions into optical amplifiers. These amplifiers serve to overcome transmission losses occurring in other portions of the optical fiber. Such apparatus generally is described as a pump laser.

BACKGROUND OF THE INVENTION

Pump lasers are generally found in the form of Fabry Perot (FP) cavity lasers whose multimode spectrums are broadband and extremely sensitive to temperature and laser drive current. Such lasers, therefore, require wavelength stabilization for most applications, such as, for example, with optical amplifiers. Different methods have been proposed in the past to stabilize such pump lasers.

In a first prior art laser stabilization method, a laser source is coupled at its output to a reflection filter that selectively reflects back a part of the output of the laser sources toward the laser to stabilize the laser source's spectrum and power. The reflection filter sets both the wavelength and the amount of reflection used to feed back a signal to the laser source as found in, for example, Fiber Bragg Gratings (FBG) stabilized lasers. In such FBG system, the pump laser is connected to the FBG via a Polarization Maintaining (PM) optical fiber. The FBG provides the required reflection for stabilization of the FP laser chip. This method has been extensively used to stabilize a single laser source. Some multiple wavelength applications have also used this method to stabilize multiple laser sources using individual FBG for each laser source followed by a wavelength Division Multiplexer (WDM) to combine stabilized laser source signals.

Referring now to FIG. 1, there is shown a stabilized laser system 10 illustrating a second prior art laser stabilization method. The system 10 comprises a laser source 11 whose output/input facet 12 is coupled to an input/output port 13 of a laser stabilization system 14 (shown within a dashed line rectangle) comprising a transmission filter 15 and a reflector 16. The transmission filter 15 is coupled at an output/input port 17 thereof to an input/output port 18 of the reflector 16. An output port 19 of the reflector 16 provides an output signal from the stabilized laser system 10. The transmission filter 15 sets the wavelength (hereinafter also designated "w"), and the reflector 16 sets the amount of signal reflection provided back through the transmission filter 15 to the laser source 11.

For the system 10 of FIG. 1, an overall Forward filter spectral response for the transmission filter 15 is defined as $F_o(w)$ as the transmission filter spectral response between the output/input facet 12 of the laser source 11 and the output port 19 from the reflector 16. A Feedback filter spectral response for the transmission filter 15 is defined as $F_f(w)$ as the overall transmission filter spectral response between the forward and backward (feedback) signals found at the output/input facet 12 of the laser source 11. In operation, an output signal of the laser source 11 at its output/input facet 12 is filtered by the transmission filter 15, F(w), to provide a signal $f_o(w)$ in the path between output/input port 17 and input/output port 18, and is partially reflected back by the reflector 16. A main portion of the signal received by the reflector at its input/output port 18 is transmitted through the reflector 16 to the output port 19 of the system 10. Therefore, the output signal, $F_o(w)$, at output port 19 of the laser stabilization system 10 is defined as:

$$F_o(w) = f_o(w)/f_i(w) = F(w) \qquad (1)$$

The reflected or feedback signal, $f_f(w)$, from the reflector 16 is filtered by the transmission filter 15 for a second time to generate a signal $f_f(w)$ that is fed back into the output/input facet 12 of the laser source 11. Therefore, the Feedback filter spectral response is defined as $F_f(w)$ that is further defined as:

$$F_f(w) = f_f(w)/f_i(w) = F(w) \cdot F(w) \qquad (2)$$

Referring now to FIG. 2, there is shown a graph of wavelength on the X-axis versus amplitude on the Y-axis for a curve 20 showing an exemplary forward filter spectral response and a curve 22 (shown as a dashed line) for a feedback filter spectral response obtainable in the laser stabilization system 10 shown in FIG. 1 for the transmission filter 15. If the stabilized laser system 10 uses a transmission filter 15 followed by a broadband reflector 16 in the manner shown in FIG. 1 for a single laser system 10, a red shift (a shift to a longer wavelength) in the signal center wavelength 24 from the laser 12 (shown by curve 22) can cause significant excess loss (filtering loss) depending upon the filter transmission bandwidth and the wavelength shift. As a laser drive current increases, the signal center wavelength shifts from a peak wavelength of the transmission filter F(w) 20 to a longer wavelength and suffers a higher insertion loss as shown by exemplary point 26 on the curve 20.

In operation, the output signal (not shown in FIG. 2) generated by laser source 11 is filtered by the transmission filter 15 having a spectral response curve as is shown by curve 20 to provide a desired output signal from the system 10 where the power peaks at a center wavelength corresponding to the peak of curve 20. When a portion of this filtered signal is reflected by reflector 16, it is again filtered by the transmission filter 15 resulting in the narrower dashed line curve 22 and returned to the input of the laser sources 11. It is found that the laser source, in response to a feedback signal, produces a wavelength shift relative to the center wavelength of feedback signal and now generates an output signal that now has a center wavelength shown by line 24 which is separated by an amount δw from the peak of curve 20 as is shown in FIG. 2. This results in an excess loss of power in the output signal of the system 10 from the desired output signal that has a center wavelength at the peak of curve 20. The above description indicates that the laser source 11 produces a red shift in response to a reflected feedback signal. The occurrence of a red directional shift (in a first direction) shown in FIG. 2 is mostly true for semiconductor diodes lasers. However, there are other types of lasers that actually produce a blue shift (to a shorter wavelength) in response to the reception of a feedback signal that also causes a similar excess loss.

This second laser source stabilization method shown in FIG. 1 is not really effective for a single laser source system, but it can be used effectively in stabilizing a multiple wavelength laser source system (not shown). In such multiple wavelength laser source system, multiple laser signals from a multiple laser source are multiplexed using a transmission filter/multiplexer coupled at an output thereof to a broadband reflector. The spectral response of the combination of the broadband reflector and the transmission filter/multiplexer for the demultiplexed laser signals returning to corresponding lasers of the multiple laser source of the system, stabilizes each laser at a predetermined center wavelength.

In an FBG stabilized laser system, the FBG is a reflection filter and, therefore, the signal outside of the reflection spectral band is not subjected to any additional loss (excess loss or filtering loss). As a result, this red shift does not impose significant limitations on the operation of the FBG stabilized laser if the particular application can tolerate a wavelength shift of up to 1 nanometer depending on both the FBG reflection bandwidth and the laser drive current and power.

It is desirable to provide a more efficient single or multiple laser source system that reduces loss for a single or multiple laser source stabilization system based on the use of a transmission filter of various technologies.

SUMMARY OF THE INVENTION

The present invention relates to method and apparatus for providing high efficiency stabilized single or multiple wavelength laser source systems by reducing losses using one or more red or blue shifted (shift towards a longer or shorter wavelength, respectively) feedback signals in systems that are based on a transmission filter of various technologies.

From a first apparatus aspect, the present invention relates to a stabilized laser system comprising at least one laser, a main transmission filter and a feedback transmission filter, and a feedback arrangement. Each of the transmission filter comprises first and second ports with the first ports of both transmission filters being coupled to the at least one laser. Still further, each of the transmission filters comprises a different spectral wavelength response as a function of wavelength. The second port of the main transmission filter is coupled to an output of the stabilized laser system. The feedback arrangement comprises one of a group consisting of a reflector coupled to the second port of the feedback transmission filter, and a loop coupled between the second ports of the main and feedback transmission filters.

From a second apparatus aspect, the present invention relates to a stabilized laser system for generating a signal at an output thereof having a desired central wavelength comprising at least one laser, and means coupled to the at least one laser for generating, from a portion of a signal generated thereby, a feedback signal having a wavelength that is different from the desired wavelength and feeding the feedback signal back to the laser for stabilizing the laser system at the desired central wavelength.

From a third apparatus aspect, the present invention relates to a stabilized laser system for generating a signal at an output thereof having a desired center wavelength comprising at least one laser, and feedback signal generating means. The at least one laser, which, while emitting light and having a preselected portion thereof fed back thereto, causes the output signal of the at least one laser source to be shifted in wavelength in a first direction which is spaced apart from the center wavelength of the fed back signal. The feedback signal generating means is coupled to the at least one laser for generating a feedback signal having a spectral response peaking at a wavelength shifted in an opposite direction to the first direction generated by at least one laser in response to the feedback signal so as to provide an output signal at the output of the stabilized laser system having a spectral response that peaks essentially at the desired wavelength.

From a fourth apparatus aspect, the present invention relates to a stabilized laser system for generating a signal at an output thereof having a desired central wavelength comprising at least one laser, and a first and a second transmission filter. Each laser of the at least one laser, which, while emitting light at the desired central wavelength and having a preselected portion thereof fed back thereto, causes the output signal of the at least one laser source to be shifted in wavelength in a first direction which is spaced apart from the center wavelength of the fed back signal. Each of the first and second transmission filters comprises a different wavelength spectral response and a first and second port. The output signal from the laser is coupled to the input of the first transmission filter such that at least a first portion of any signal emitted by the laser is transmitted to the first port of the first transmission filter. The second port of the first transmission filter is coupled to an output of the stabilized laser system. The output of the laser is coupled to the first port of the second transmission filter such that at least a second portion of any signal emitted by the laser is transmitted to the first port of the second transmission filter. The second port of the second transmission filter is coupled to the output of the laser such that any signal generated at the second port of the second transmission filter, whose spectral response peaks at a wavelength shifted in an opposite direction to that generated by the at least one laser in response to a feedback signal, is fed back to the laser so as to provide at the output of the stabilized laser system an output signal having a spectral response that peaks at the desired central wavelength.

From a fifth apparatus aspect, the present invention relates to a stabilized laser system for generating a signal at an output thereof having a desired central wavelength comprising a plurality of n lasers, and a multiplexer/filter arrangement. Each of the plurality of n lasers, which, while emitting light at the desired central wavelength and having a preselected portion thereof fed back thereto, causes the output signal of the laser source to be shifted in wavelength in a first direction which is spaced apart from the central wavelength of the fed back signal. The multiplexer/filter arrangement comprises a forward multiplexer/filter section and a feedback multiplexer/filter section. Each of the forward and feedback multiplexer/filter sections comprises a different wavelength spectral response as a function of wavelength, a plurality of n first ports, and a second port. The output signal from each of the lasers is coupled to a corresponding one of the plurality of n first ports of the forward multiplexer/filter section such that at least a first portion of the output signal emitted by each of the lasers is transmitted to a corresponding one of the first ports of the forward multiplexer/filter section. Still further, the second port of the forward multiplexer/filter section is coupled to an output of the stabilized laser system. The output signal from the second port of the forward multiplexer/filter section is further coupled to the second port of the feedback multiplexer/filter section wherein the received signal is demultiplexed and delivered to the plurality of n first ports of the feedback multiplexer/ filter section. Still further, each of the plurality of n first ports of the feedback multiplexer/filter section is coupled to one of a group consisting of (a) a corresponding one of a plurality of n reflectors for returning a received signal back through the forward and feedback multiplexer/filter sections to the corresponding one of the plurality of n lasers, and (b) a second feedback multiplexer/filter subsection comprising a plurality of n first ports, and a second port, where each one of the plurality of n first ports thereof is coupled to a corresponding one of the plurality of n first ports of the first feedback multiplexer/filter subsection. The second port of the second feedback multiplexer/filter subsection is coupled to one of a group consisting of a reflector, and a loop for returning the feedback signal through the forward multiplexer/filter to the output of the plurality of n lasers such that any signal generated at the second port of the second multiplexer/filter subsection has a spectral response that peaks at a wavelength shifted in an opposite direction to that generated by each of the plurality of n lasers in response to a feedback signal so as to provide at the output of the stabilized laser system an output signal comprising a spectral response that peaks at the desired central wavelength.

From a first method aspect, the present invention relates to a method of stabilizing a laser system to generate an output signal comprising a desired wavelength. In the method, a laser is biased so as to generate a light signal at a desired central wavelength at an input/output thereof. The laser, which, while emitting light and having a preselected portion thereof fed back thereto, the output signal of laser source is shifted in wavelength in a first direction which is spaced apart from the center wavelength of fed back signal. The signal from the laser is divided into first and a second portions where the first portion is coupled to an output of the laser system. The second portion of the signal is processed such that the wavelength is shifted in an opposite direction to the first direction. The processed second portion of the signal is fed back to the input/output of the laser such that the output signal of the laser system is at essentially the desired wavelength.

From a second method aspect, the present invention relates to a method of stabilizing a laser system to generate an output signal comprising a desired wavelength. Each of a plurality of n laser sources is biased so as to generate a light signal at a desired central wavelength at an input/output thereof. Each laser source, which, while emitting light and having a preselected portion thereof fed back thereto, the output signal of laser source is shifted in wavelength in a first direction which is spaced apart from the center wavelength of fed back signal. In the method, the signal from the plurality of n laser sources is divided into a first and a second portions thereof, the first portion being multiplexed before being coupled to an output of the laser system. Each of the second portions of the output signals from the plurality of n laser sources is processed such that the wavelength thereof is shifted in an opposite direction to the first direction. Each of the processed second portions of the signals is fed back to the input/output of a corresponding one of the plurality of n laser sources such that the output signal of the laser system is at essentially the desired wavelength.

The invention will be better understood from the following more detailed description taken with the accompanying drawings and claims.

BRIEF DESCRIPTION OF THE DRAWING

FIG. 41 shows a schematic of a system that modifies the system of FIG. 39 for blue shift feedback stabilizing multiple radiation sources in accordance with fifth embodiment of the present invention;

FIG. 42 shows a schematic of a system for blue shift feedback stabilizing a single radiation source in accordance with fifth embodiment of the present invention;

FIG. 51 shows a schematic of a system for blue shift feedback stabilizing multiple radiation sources in accordance with the fifth embodiment of the present invention;

The drawings are not necessarily to scale.

DETAILED DESCRIPTION OF THE INVENTION

As was described for the prior art second apparatus aspect, in a stabilized laser system one or multiple laser sources each generate a separate predetermined output signal at an output port thereof that is centered at a desired wavelength. Each of the one or multiple laser sources is caused to be shifted in response to a feedback signal in a first predetermined direction, depending on the laser source used, to a non-desired center wavelength, and thereby produces an excess loss in power of the output signal from the system. In accordance with the present invention, a feedback signal is generated from a portion of the output signal from each of the one or multiple laser sources having a center wavelength that is shifted in an opposite second direction from an expected output signal shift in the first direction normally produced by each of the one or more laser sources in response to receiving a feedback signal. This shifted feedback signal is transmitted back to the output port of each of the one or multiple laser sources such that the laser source output signal, when shifted in the first direction by a feedback signal, peaks, and is stabilized, at the desired center wavelength to substantially avoid the excess power loss found in the prior art.

Figure 3:
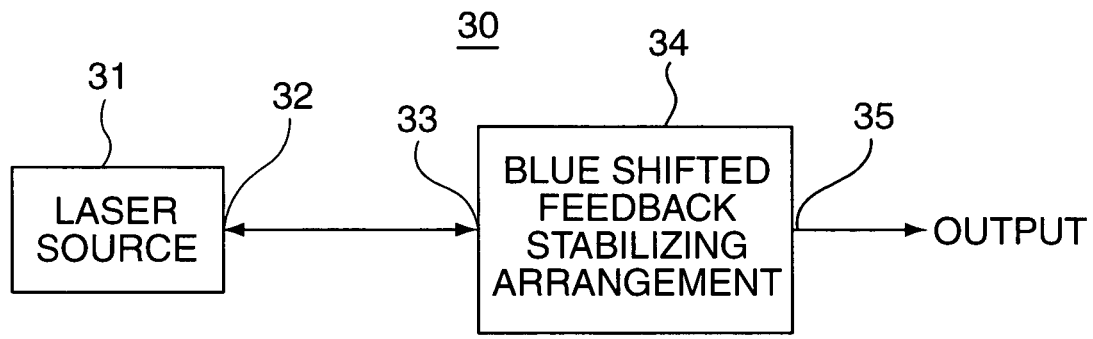
FIG. 3 shows a schematic diagram of a stabilized laser system illustrating the basic concept for the blue shift stabilizing of a single radiation source in accordance with the present invention.

Referring now to FIG. 3, there is shown a schematic diagram of a stabilized laser system 30 illustrating the basic concept of blue-shift stabilizing a single radiation source (LASER SOURCE) 31 in accordance with the present invention. The system 30 comprises the single radiation source 31, and a blue shift feedback stabilizing arrangement 34. The laser source 31 comprises a front facet 32 (output/input port) that is coupled to an input/output port 33 of the arrangement 34. The arrangement 34 also comprises an output port 35 that provides an output signal from the feedback stabilization system 30. The arrangement 34 can comprise one or multiple components (not shown, but as will described hereinafter in accordance with various embodiments of the present invention) to perform the desired blue shift stabilizing of the laser source 31 in different technology arrangements such as planar waveguide technology [e.g., planar waveguide circuits on different material platforms such as Silica on Silicon, Indium Phosphide (InP), Silicon, glass, etc.), free space optics, guided optics (e.g., optical fibers), etc].

In a stabilized external cavity feedback laser (e.g., laser source 31), the laser is basically operating as an amplifier whose output is used to provide a feedback signal from an external reflecting means back into a front facet of the laser. The output signal from the laser is the amplified signal obtained by the round trip travel through the laser gain medium between the laser front and back facets. The laser front facet (designated 32) is normally coated with an anti-reflection (AR) coating (not shown), and the laser back facet is normally coated with a high reflection (HR) coating (not shown). Laser diodes, in general, demonstrate significantly different gain profiles for orthogonal Transverse Electric (TE) and Transverse Magnetic (TM) polarizations. These laser diodes generally emit signals in the horizontal (TE) polarization due to higher TE gain. Therefore, for a stable operation of a stabilized external cavity feedback laser, the entire optical path in which the feedback signal is propagating must preserve the polarization state due to signal and environmental conditions.

Assuming that $f_i(w)$ is the input signal from the laser source 31 received by the feedback stabilizing arrangement 34 at input/output port 33 as a function of wavelength, $f_o(w)$ is the output signal from the feedback stabilizing arrangement 34 appearing at output port 35 as a function of wavelength (w), and $f_f(w)$ is the reflected feedback signal propagating back toward the laser source 31 from the input/output port 33 of the feedback stabilizing arrangement 34 as a function of wavelength. The forward filter and feedback filter spectral responses in the feedback stabilization system 30 are then defined as $F_o(w)=f_o(w)/f_i(w)$ and $F_f(w)=f_f(w)/f_i(w)$, respectively. The reflected signal, $f_f(w)$, comprises one or multiple components that arrive at the front facet 32 of the laser source 31 with different time delays and amplitudes. In terms of time delay, there are cases where (a) all components arrive with the same time delay, (b) some components arrive with the same time delay and the rest with different time delays, and (c) all components have different time delays. In terms of amplitude there are cases where (a) all components arrive with the same amplitude, (b) some components arrive with the same amplitude and the rest with different amplitudes, and (c) all components have different amplitudes.

Figure 1:
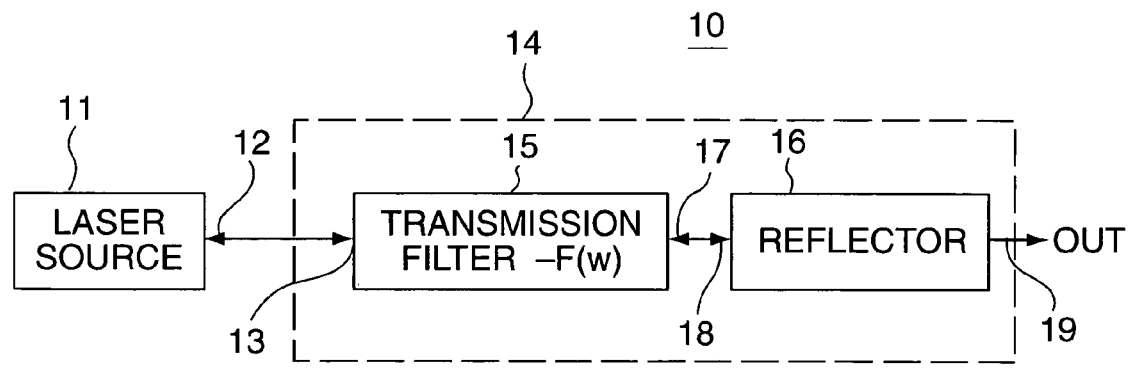
FIG. 1 shows a schematic diagram of a prior art stabilized laser system.
Figure 4:
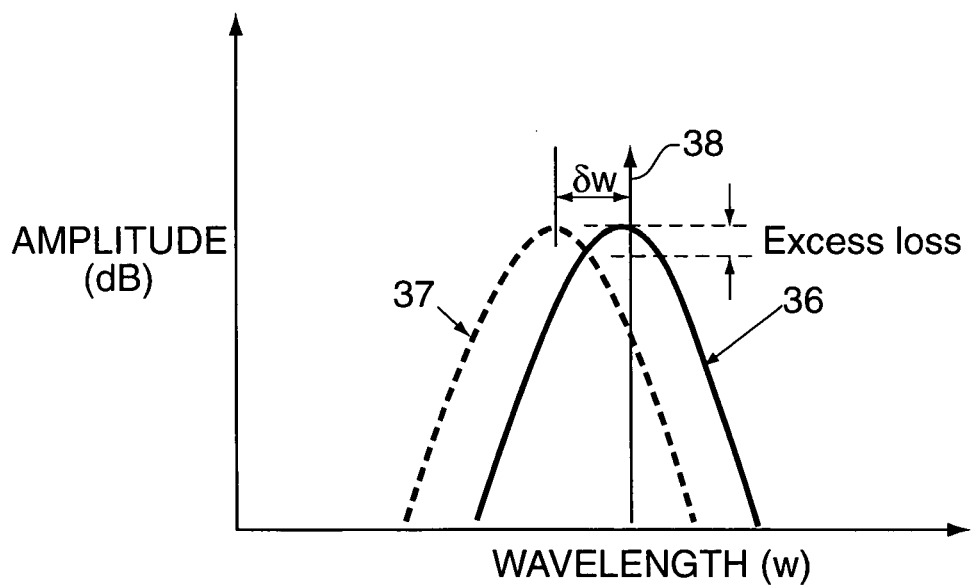
FIG. 4 shows a graph of wavelength on the X-axis versus amplitude (dB) on the Y-axis for illustrating exemplary forward and feedback spectral responses that might be found in the system of FIG. 3.

Referring now to FIG. 4, there is shown a graph of wavelength (w) on the X-axis versus amplitude (dB) on the Y-axis for illustrating an exemplary forward filter spectral response curve 36, $F_o(w)$, and a dashed line feedback filter spectral response curve 37, $F_f(w)$, as might be found in the stabilized laser system 30 of FIG. 3. In accordance with the present invention, the system 30 is designed such that the center wavelength of a feedback filter spectral response, $F_f(w)$, in the feedback stabilizing arrangement 34 is shifted toward a shorter wavelength (blue shift) by an amount δw to compensate for a red shift of the laser center wavelength. The blue shift design moves the center wavelength 38 of the stabilized laser source 31 closer to the center wavelength 38 of the forward filter spectral response 36, $F_o(w)$. The blue shift δw minimizes the excess loss shown in FIG. 2 that is associated with the conventional stabilized laser system 10 of FIG. 1 using a transmission filter 15.

Figure 5:
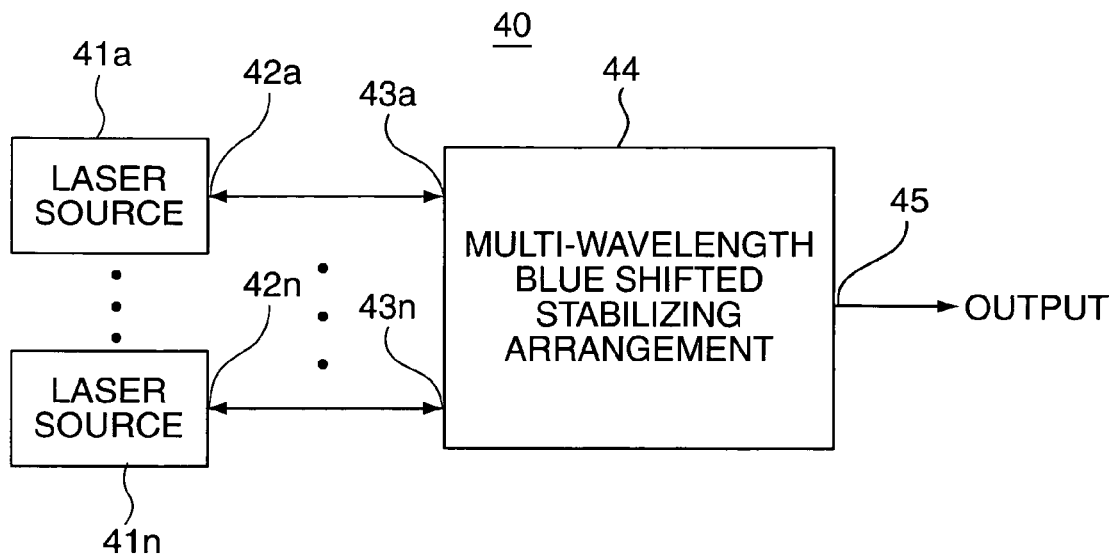
FIG. 5 shows a schematic diagram of a stabilized laser system illustrating the basic concept for the blue shift stabilizing of multiple radiation sources in accordance with the present invention.

Referring now to FIG. 5, there is shown a schematic diagram of a feedback stabilization system 40 illustrating the basic concept for a blue shift stabilizing of a plurality of n radiation sources (LASERS SOURCE) 41a–41n (only laser sources 41a and 41n are shown) in accordance with the present invention. The basic feedback stabilization system 40 comprises the plurality of n laser sources 41a–41n, and a multi-wavelength blue shifted feedback stabilizing arrangement 44. Each of the laser sources 41a–41n have a front facet 42a–42n (output/input port), respectively, that is coupled to a separate respective one of a plurality of n input/output ports 43a–43n of the blue shift feedback stabilizing arrangement 44. The blue shift feedback stabilizing arrangement 44 comprises an output port 45 that provides a multiplexed output signal from the feedback stabilization system 40 generated by the plurality of n laser sources 41a–41n. The blue shift feedback stabilizing arrangement 44 functions to multiplex all of the input signals, in the wavelength and polarization domain, received at the input/output port 43a–43n from the laser sources 41a–41n. The feedback stabilizing arrangement 44 can comprise one or multiple components (not shown, but as will be described hereinafter in accordance with various embodiments of the present invention) to perform the desired blue shift stabilizing of the plurality of n laser sources 41a–41n in different technology arrangements such as planar waveguide technology [e.g., planar waveguide circuits on different material platforms such as Silica on Silicon, Indium Phosphide (InP), Silicon, glass, etc.), free space optics, guided optics (e.g., optical fibers), etc]. The multiplexing in the wavelength and polarization domain of the input signals to the blue shift feedback stabilizing arrangement 44 can be accomplished using an Arrayed Waveguide grating (AWG), Eschelle grating, Mach-Zehnder interferometer, bulk grating, thin film filters, optical fiber filters, etc. Similar to that stated for the system 30 of FIG. 3, the entire optical paths in which feedback signals are propagating in the feedback stabilization system 40 must preserve the polarization state (polarization maintaining, PM).

Assuming that $f_i^j(w)$ is the jth input signal received by the feedback stabilizing arrangement 44 from a laser source 41j (not shown) at its input/output port 43j (not shown) as a function of wavelength, $f_o(w)$ is the multiplexed output signal from the feedback stabilizing arrangement 44 appearing at output port 45 as a function of wavelength, and $f_f^j(w)$ is the reflected feedback signal propagating toward the jth laser source 41j out of the input/output port 43j of the feedback stabilizing arrangement 44 as a function of wavelength (w). The forward and feedback filter spectral responses for the jth laser source 41j in the feedback stabilization system 40 are defined as $F_o^j(w)=f_o(w)/f_i^j(w)$ and $F_f(w)=f_f^j(w)/f_i^j(w)$, respectively. The reflected signal, $f_f^j(w)$, comprises one or multiple components that arrive at the front facet 42*j* of the laser source 41*j* with different time delays and amplitudes. In terms of time delay, there are cases where (a) all components arrive with the same time delay, (b) some components arrive with the same time delay and the rest with different time delays, and (c) all components have different time delays. In terms of amplitude there are cases where (a) all components arrive with the same amplitude, (b) some components arrive with the same amplitude and the rest with different amplitudes, and (c) all components have different amplitudes.

Figure 2:
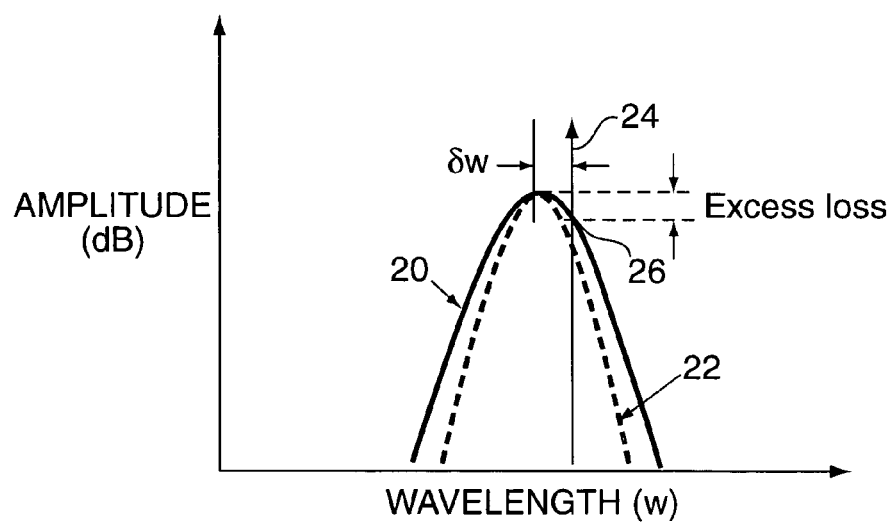
FIG. 2 shows a graph of a forward and feedback filter spectral response in the prior art laser system of FIG. 1.
Figure 6:
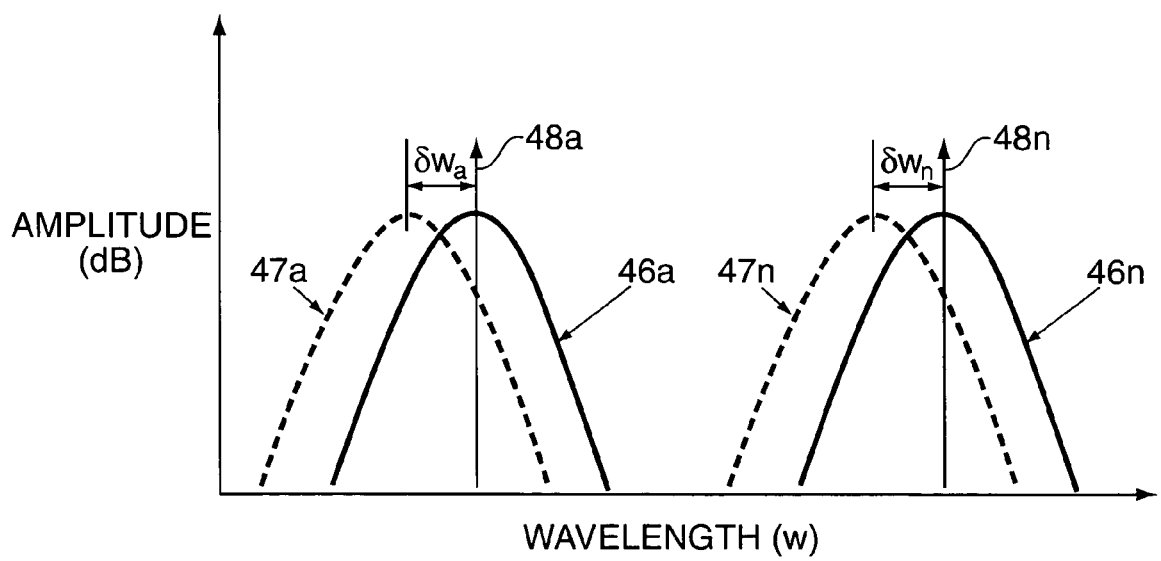
FIG. 6 shows a graph of wavelength on the X-axis versus amplitude (dB) on the Y-axis for illustrating exemplary forward and feedback spectral responses that might be found in the system of FIG. 5.

Referring now to FIG. 6, there is shown a graph of wavelength (w) on the X-axis versus amplitude (dB) on the Y-axis for illustrating exemplary forward filter spectral response curves 46*a*–46*n* (only curves 46*a* and 46*n* are shown), and dashed line feedback filter spectral response curves 47*a*–47*n* (only curves 47*a* and 47*n* are shown) as might be found in the multi-wavelength blue shift feedback stabilization system 40 of FIG. 5. In accordance with the present invention, the blue shifted feedback stabilization system 40 is designed such that, for the laser source 41*j* channel and wavelength, the center wavelength of a feedback filter spectral response, $F_f^j(w)$ in the feedback stabilizing arrangement 44 is shifted toward a shorter wavelength (blue shift) by an amount $\delta w^j$ to compensate for the red shift of the laser center wavelength of laser source 41*j*. The blue shift design moves the center wavelength 48*j* of the stabilized laser source 41*j* close to the center wavelength of the forward filter spectral response 46*j*, $F_o^j(w)$. The same operation occurs for each of the laser sources 41*a*–41*n* as shown for the laser sources 41*a* and 41*n* by the curves 46*a* and 47*a*, and 46*n* and 47*n*, respectively. The blue shift for the feedback signal for each of the laser sources 41*a*–41*n* minimizes the excess loss for each of the laser sources 41*a*–41*n* that is shown in FIG. 2 and associated with the conventional stabilized laser system 10 of FIG. 1 using a transmission filter 15.

Figure 7:
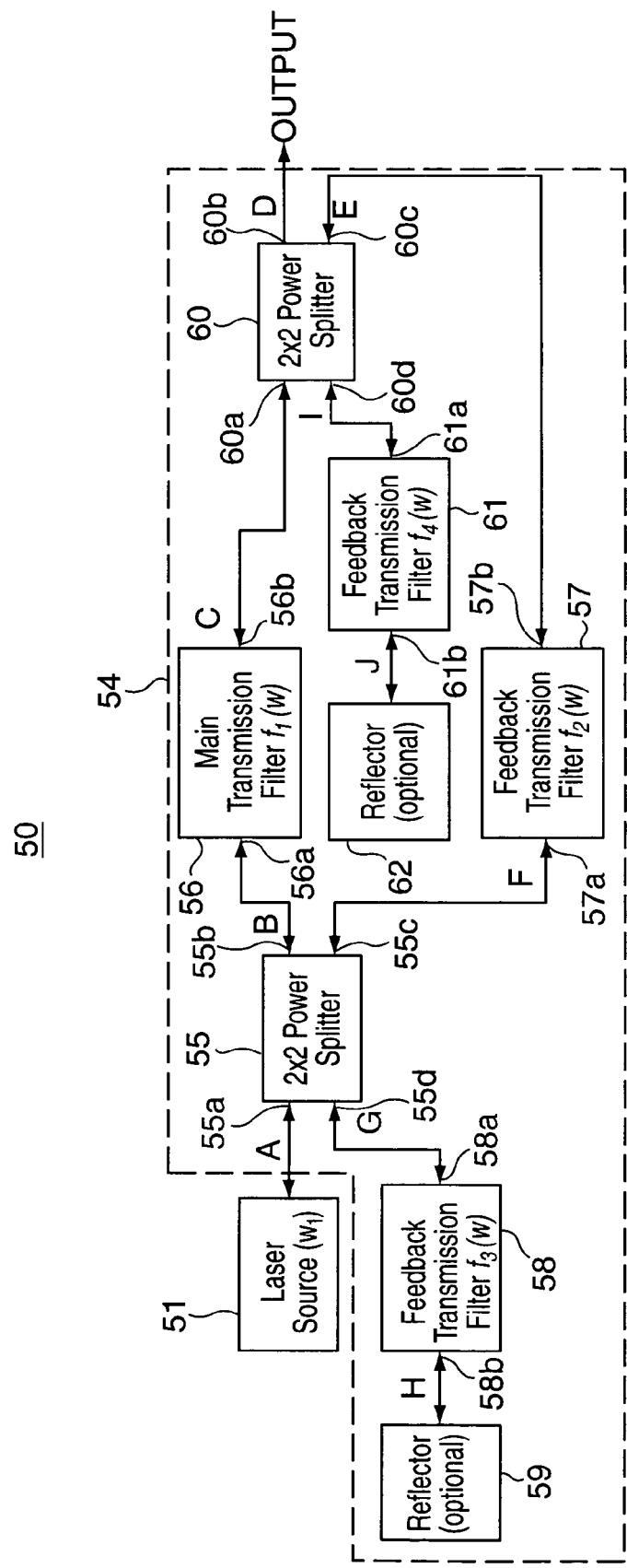
FIG. 7 shows a schematic diagram of an arrangement for a single radiation source in accordance with a first embodiment of the present invention.

Referring now to FIG. 7, there is shown a schematic diagram of a stabilized laser system 50 illustrating a blue shift stabilizing arrangement 54 (shown within a dashed line area) for a single radiation source (LASER SOURCE) 51 in accordance with a first embodiment of the present invention. The blue shift stabilizing arrangement 54 comprises a first 2×2 power splitter 55, a main transmission filter 56 ($f_1(w)$), a first feedback transmission filter ($f_2(w)$) 57, a second feedback transmission filter ($f_3(w)$) 58, a first optional reflector 59, a second 2×2 power splitter 60, a third feedback transmission filter ($f_4(w)$) 61, and a second optional reflector 62. The laser source 51 is coupled to a first input/output port 55*a* of the first 2×2 power splitter 55 via an optical path A, a second input/output port 55*b* of the first 2×2 power splitter 55 is coupled to an input/output port 56*a* of the main transmission filter 56 via an optical path B, a third input/output port 55*c* of the first 2×2 power splitter 55 is coupled to a first input/output port 57*a* of the first feedback transmission filter 57 via an optical path F, and a fourth input/output port 55*d* of the first 2×2 power splitter 55 is coupled to a first input/output port 58*a* of the second feedback transmission filter 58 via an optical path G. A second input/output port 58*b* of the second feedback transmission filter 58 is coupled to an input/output port of the first reflector 59 via an optical path H. A second input/output port 56*b* of the main transmission filter 56 is coupled to a first input/output port 60*a* of the second 2×2 power splitter 60 via an optical path C. A second output port 60*b* of the second 2×2 power splitter 60 provides an output signal from the system 50 to any predetermined downstream device via optical path D, a third input/output port 60*c* of the second 2×2 power splitter 60 is coupled to a second input/output port 57*b* of the first feedback transmission filter 57 via an optical path E, and a fourth input/output port 60*d* of the second 2×2 power splitter 60 is coupled to a first input/output port 61*a* of the third feedback transmission filter 61 via an optical path I. A second input/output port 61*b* of the third feedback transmission filter 61 is coupled to an input/output port of the second optional reflector 62 via an optical path J.

The main concept of the system 50 is to tap off a portion of the signal propagating through a main optical signal path comprising optical paths A→B→C→D via the first 2×2 power splitter 55, the first main transmission filter 56, $f_1(w)$, and the second 2×2 power splitter 60 in a forward direction. The signal tapped off by the second power splitter 60 at input/output port 60*c* is directed back to the laser source 51 via the first feedback transmission filter 57, $f_2(w)$, and the first 2×2 power splitter 55 via optical paths E→F→A.

In operation, the output power of the laser source 51 is tapped by the first 2×2 power splitter 55 at its third input/output port 55*c*, and the tapped laser output power is routed to the first feedback transmission filter 57, $f_2(w)$, via optical path F. The second input/output port 55*b* of the first 2×2 power splitter 55 directs most of the laser signal power to the first input/output port 56*a* of the main transmission filter 56, $f_1(w)$, via optical path B. The input signal received by the main transmission filter 56, $f_1(w)$, is filtered and routed to the first input/output port 60*a* of the second 2×2 power splitter 60 via optical path C. The function of the second 2×2 power splitter 60 is to tap a portion of the signal received from the optical path C, and to send the tapped signal via it third input/output port 60*c* to the first feedback transmission filter 57, $f_2(w)$, via optical path E, and direct a main portion of the received signal from optical path C to the second output port 60*b* as the output signal from the system 50 to a downstream device via optical path D. Therefore, the optical path for the main component of the output signal from the system 50 comprises the laser source 51, the 2×2 first power splitter 55, the main transmission filter, $f_1(w)$, 56, and the second 2×2 power splitter 60 including optical paths A→B→C→D.

The output signal from the system 50 has other components due to the presence of two cavities in the blue shift stabilizing arrangement 54. A first cavity is disposed between the second reflector 62 and the first reflector 59 via optical paths J→I→E→F→G→H. Each round trip of the signal in this first cavity adds two components to the output signal from the system 50 in optical path D. The second cavity comprises a loop from and back to the first optional reflector 59 using the optical path of H→G→B→C→E→F→G→H. Each round trip of the signal in this second cavity also adds one component to the output signal from the system 50 in optical path D.

The feedback signal has two main components. The optical path for the first main component is the laser source 51, the first 2×2 power splitter 55, the main transmission filter, $f_1(w)$, 56, the second 2×2 power splitter 60, the first feedback transmission filter, $f_2(w)$, 57, the first 2×2 power splitter 55, and back to a front facet of the laser source 51 via optical paths A→B→C→E→F→A. The optical path for the second main component is the laser source 51, the first 2×2 power splitter 55, the first feedback transmission filter, $f_2(w)$, 57, the second 2×2 power splitter 60, the main transmission filter, $f_1(w)$, 56, the first 2×2 power splitter 55, and back to the front facet of the laser source 51 via optical paths A→F→E→C→B→A. A signal round trip in the first cavity of optical paths A→B→C→E→F→A adds two components, and in the second cavity of optical paths A→F→E→C→B→A adds one component to the feedback signal to the laser source 51.

The desired spectral response properties for the forward, $F_o(w)$, and feedback, $F_f(w)$, filters are such as filter bandwidth and a center wavelength that can be achieved by the proper choice of the $f_1(w)$, $f_2(w)$, $f_3(w)$, $f_4(w)$, coupling ratios, and cavity length for the transmission filters 56, 57, 58, and 61, respectively. The spectral responses for the forward and feedback filters for the system 50 correspond to the curves 36 and 37 shown in FIG. 4 and described for the general feedback stabilization system 30 of FIG. 3. As described hereinbefore for the system 30 of FIG. 3, the entire optical path in which a feedback signal is propagating must preserve the polarization state (polarization maintaining, PM). This means that all components and interconnects, except at the second output port 60b of the second 2×2 power splitter 60 is maintaining the polarization state. The broadband power splitter functions of each of the first and second 2×2 power splitters 55 and 60 can be achieved by different methods in different technology platforms such as planar waveguide technology using a directional coupler (DC), multimode interference (MMI) coupler, asymmetric Y junctions, Mach-Zehnder interferometer, etc, and free space optics using thin film, etc.

Figure 8:
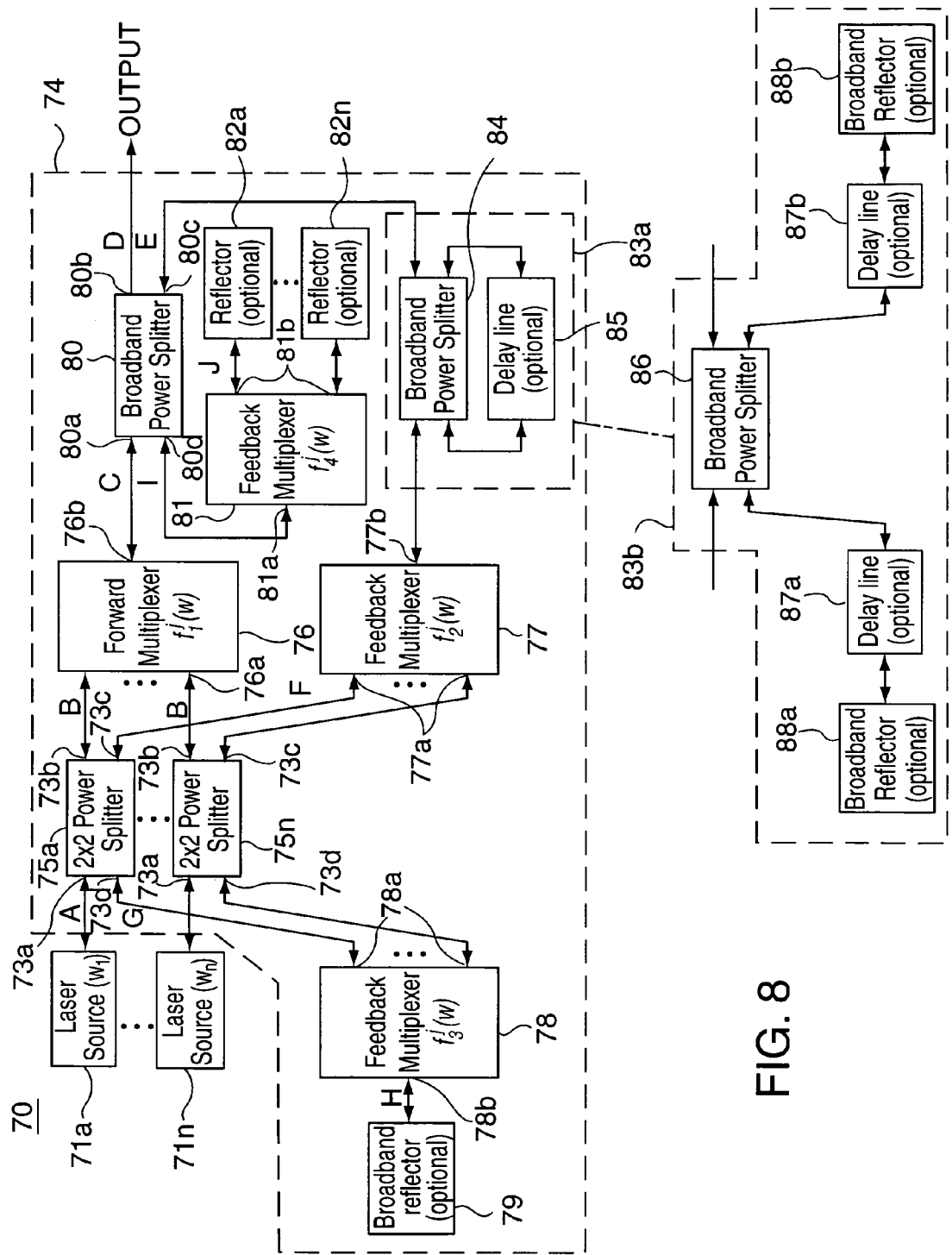
FIG. 8 shows a schematic diagram of a system for multiple radiation sources in accordance with the first embodiment of the present invention.

Referring now to FIG. 8, there is shown a schematic diagram of an alternative stabilized laser system 70 illustrating a blue shift stabilizing arrangement 74 (shown within a dashed line area) for a plurality of n radiation sources (LASER SOURCE) 71a–71n (of which only laser sources 71a and 71n are shown) in accordance with the first embodiment of the present invention. The blue shift stabilizing arrangement 74 comprises a plurality of n 2×2 power splitters 75a–75n (of which only power splitter 75a and 75n are shown), a forward multiplexer 76, $f_1^j(w)$, a first feedback multiplexer 77, $f_2^j(w)$, a second feedback multiplexer 78, $f_3^j(w)$, a first optional broadband reflector 79, a broadband power splitter 80, a third feedback multiplexer 81, $f_4^j(w)$, a plurality of n second optional reflectors 82a–82n (of which only reflectors 82a and 82n are shown), and an optional loop arrangement 83a (shown as a dashed line block) comprising a broadband power splitter 84 and an optional delay line 85. Each of the plurality of n laser sources 71a–71n is coupled to a first input/output port 73a of a separate respective one of the plurality of n 2×2 power splitters 75a–75n via a separate optical path A. A second input/output port 73b of each one of the plurality of n first 2×2 power splitters 75a–75n is coupled to a separate corresponding one of a plurality of n input/output ports 76a of the forward multiplexer 76 via an optical path B. A third input/output port 73c of each one of the plurality of n 2×2 power splitters 75a–75n is coupled to a corresponding one of a plurality of n first input/output ports 77a of the first feedback multiplexer 77 via an optical path F. A fourth input/output port 73d of each one of the plurality of n 2×2 power splitter 75a–75n is coupled to a separate corresponding one of a plurality of n first input/output ports 78a of the second feedback multiplexer 78 via an optical path G. A second input/output port 78b of the second feedback multiplexer 78 is coupled to an only input/output port of the first reflector 79 via an optical path H. A second input/output port 76b of the forward multiplexer 76 is coupled to a first input/output port 80a of the broadband power splitter 80 via an optical path C. A second output port 80b of the broadband power splitter 80 provides an output signal from the feedback stabilization system 70 to any predetermined downstream device via optical path D. A third input/output port 80c of the broadband power splitter 80 is coupled via first and second ports of the broadband power splitter 84 of the optional loop arrangement 83a to a second input/output port 77b of the first feedback multiplexer 77 via an optical path E, and a fourth input/output port 80d of the broadband power splitter 80 is coupled to a first input/output port 81a of the third feedback multiplexer 81 via an optical path I. Each one of a plurality of n second input/output ports 81b of the third feedback multiplexer 81 is coupled to an input/output port of a separate corresponding one of the plurality of n second optional reflectors 82a–82n via an optical path J.

The system 70 shows an implementation of the configuration of the system 50 of FIG. 7 for a plurality of n laser sources 71a–71n. For the system 70, the single channel main transmission filter 56 ($f_1(w)$), and the single channel feedback transmission filters 57 ($f_2(w)$), 58 ($f_3(w)$), and 61 ($f_4(w)$) of FIG. 7 are replaced with a multiple channel forward multiplexer 76 ($f_1^j(w)$), and multiple channel multiplexers 77 ($f_2^j(w)$), 78 ($f_3^j(w)$), and 81 ($f_4^j(w)$), respectively. The spectral response of the forward multiplexer 76 between the jth input/output port 76a (not shown) and the input/output port 76b is represented with $f_1^j(w)$, the spectral response of the first feedback multiplexer 77 between the jth input/output port 77a (not shown) and the input/output port 77b is represented with $f_2^j(w)$, the spectral response of the second feedback multiplexer 78 between the jth input/output port 78a (not shown) and the input/output port 78b is represented with $f_3^j(w)$, and the spectral response of the third feedback multiplexer 81 between the jth input/output port 81b (not shown) and the input/output port 81a is represented with $f_4^j(w)$. The forward filter $F_o(w)$ and feedback filter $F_f(w)$ spectral responses for the system 70 correspond to the curves 46a–46n and 47a–47n shown in FIG. 6 as was described for the general multiple laser source system 40 of FIG. 5.

Where an incoherent feedback signal is desired for the laser sources 71a–71n, a single optical delay line (not shown) can be positioned in, for example, the single optical path E to take care of all of laser sources 71a–71n. Although possible, it is not desirable to place delay lines, when required, in optical paths A, B, or C because the main signal to optical path D is propagating through this route. Alternatively, a separate optional delay line (not shown) can be placed in each one of, for example, the n optical paths F for the laser sources 71a–71n requiring an incoherent feedback signal, but such arrangement requires many more delay lines than just placing an optional single delay line in, for example, optical path E and/or H. Depending on the technology platform, the multiplexers 76, 77, 78, and 81 can be implemented using different devices such as an Array Waveguide grating (AWG), Eschelle grating, Mach-Zehnder interferometer, bulk grating, thin film filters, fiber filters, etc.

An alternative arrangement for the loop arrangement 83a is shown as a cavity arrangement 83b (shown within a dashed line area). The cavity arrangement 83b comprises a broadband power splitter 86 having four input/output ports (comparable to power splitter 84 in the loop arrangement 83a), a first optional delay line 87a and a first broadband reflector 88a coupled in series to the third input/output port of the broadband power splitter 86, and a second optional delay line 87b and a second broadband reflector 88b coupled in series to the fourth input/output port of the broadband power splitter 86. The presence of an additional loop arrangement 83a or 83b in the feedback signal path is to tap a portion of the signal traveling through the feedback signal path E and generate additional components for the feedback signal. The purpose of selectively adding multiple components into a feedback signal is to provide the conditions that cause each of the plurality of lasers 71a–71n to enter into coherence collapse mode of operation and the laser output signal to become very stable.

Figure 9:
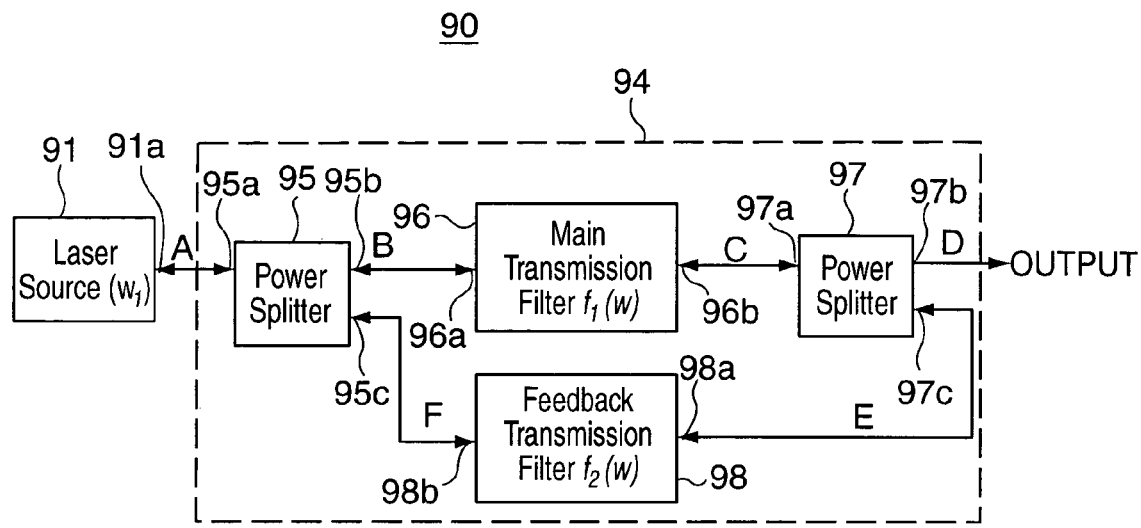
FIG. 9 shows a schematic diagram of a system for a single radiation source in accordance with a second embodiment of the present invention.

Referring now to FIG. 9, the there is shown a schematic diagram of a stabilized laser system 90 illustrating a blue shift stabilizing arrangement 94 (shown within a dashed line rectangle) for a single radiation source 91 in accordance with a second embodiment of the present invention. The system 90 shows a simplified implementation of the system 50 of FIG. 7 for a single laser source system. The blue shift stabilizing arrangement 94 comprises a first power splitter 95, a main transmission filter, $f_1(w)$, 96, a second power splitter 97, and a feedback transmission filter, $f_2(w)$, 98. The laser source 91 is coupled at a front facet (output port) 91a thereof to a first input/output port 95a of the first power splitter 95 via an optical path A. A second input/output port 95b of the first power splitter 95 is coupled to a first input/output port 96a of the main transmission filter 96 via an optical path B. A second input/output port 96b of the main transmission filter 96 is coupled to a first input/output port 97a of the second power splitter 97 via an optical path C. A second output port 97b of the second power splitter 97 provides an output signal from the system 90 via an optical path D to any remote downstream device (not shown) using the output signal, and a third input/output port 97c is coupled to a first input/output port 98a of the feedback transmission filter 98 via an optical path E. A second input/output port 98b of the feedback transmission filter 98 is coupled to a third input/output port 95c of the first power splitter 95.

A main output signal from the system 90 propagates through the first power splitter 95, the main transmission filter, $f_1(w)$, 96, and the second power splitter 97 via optical paths A→B→C→D. The feedback signal at the laser front facet 91a comprises two components. The optical path of one feedback signal component comprises the laser source 91, the first power splitter 95, the main transmission filter 96 [$f_1(w)$], the second power splitter 97, the feedback transmission filter 98 [$f_2(w)$], the first power splitter 95, and the front facet 91a of the laser source 91 via the paths A→B→C→E→F→A. The optical path for the other signal feedback component comprises the laser source 91, the first power splitter 95, the feedback transmission filter 98, the second power splitter 97, the main transmission filter 96, the first power splitter 95, and the front facet 91a of the laser source 91 via the paths A→F→E→C→B→A. Since the two optical feedback paths are exactly the same, the feedback components therefrom are in-phase with equal amplitude. The stabilized output signal at output terminal 97b of the second power splitter 97 is filtered only by the main transmission filter 96, $f_1(w)$, and, therefore, the forward filter spectral response is $F_o(w)=f_1(w)$. The feedback signal, however, is passed through both the feedback transmission filter 98 [$f_2(w)$] and the main transmission filter 96 [$f_1(w)$] and, therefore, the feedback spectral response is $F_f(w)=f_1(w) \cdot f_2(w)$.

Figure 10:
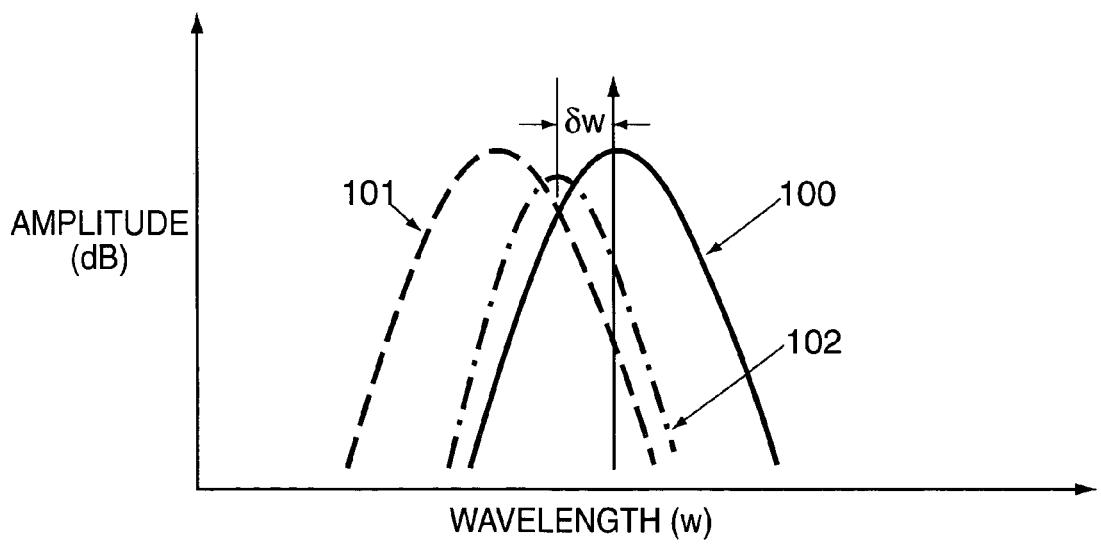
FIG. 10 is a graph of wavelength on the X-axis versus amplitude (dB) on the Y-axis for illustrating exemplary forward and feedback spectral responses that might be found in the system of FIG. 9.

Referring now to FIG. 10, there is shown a graph of wavelength (w) on the X-axis versus amplitude (dB) on the Y-axis for illustrating an exemplary forward filter spectral response $F_o(w)$ curve 100 where $F_o(w)=f_1(w)$, a feedback transmission filter spectral response curve 101 of $f_2(w)$ (shown as a dashed line curve) found in the feedback transmission filter 98, and a feedback filter spectral response $F_f(w)$ curve 102 (shown as a dashed and dotted line curve) where $F_f(w)=f_1(w) \cdot f_2(w)$, that might be found in the blue shift system 90 of FIG. 9. The main transmission filter 96 and feedback transmission filter 98 must be designed such that the forward and feedback filters spectral responses 100 and 102 of $f_1(w)$ and $f_2(w)$, respectively, provide the desired center wavelengths, bandwidths and the blue wavelength shift (δw) shown by curve 102 between the $F_o(w)$ and $F_f(w)$ curves 100 and 102.

As described hereinbefore for systems 30 and 50, for a stable operation of a stabilized external cavity feedback laser, the entire optical path in which the feedback signal is propagating must preserve the polarization state due to signal and environmental conditions. This means that all components and interconnects, except at the second output port 97b of the second 2×2 power splitter 97, maintain the polarization state. Still further, one or multiple optional delay lines (not shown) can be added between any two components in the feedback optical signal path of ABCEFA when an incoherent feedback signal is required for the laser source 91.

Figure 11:
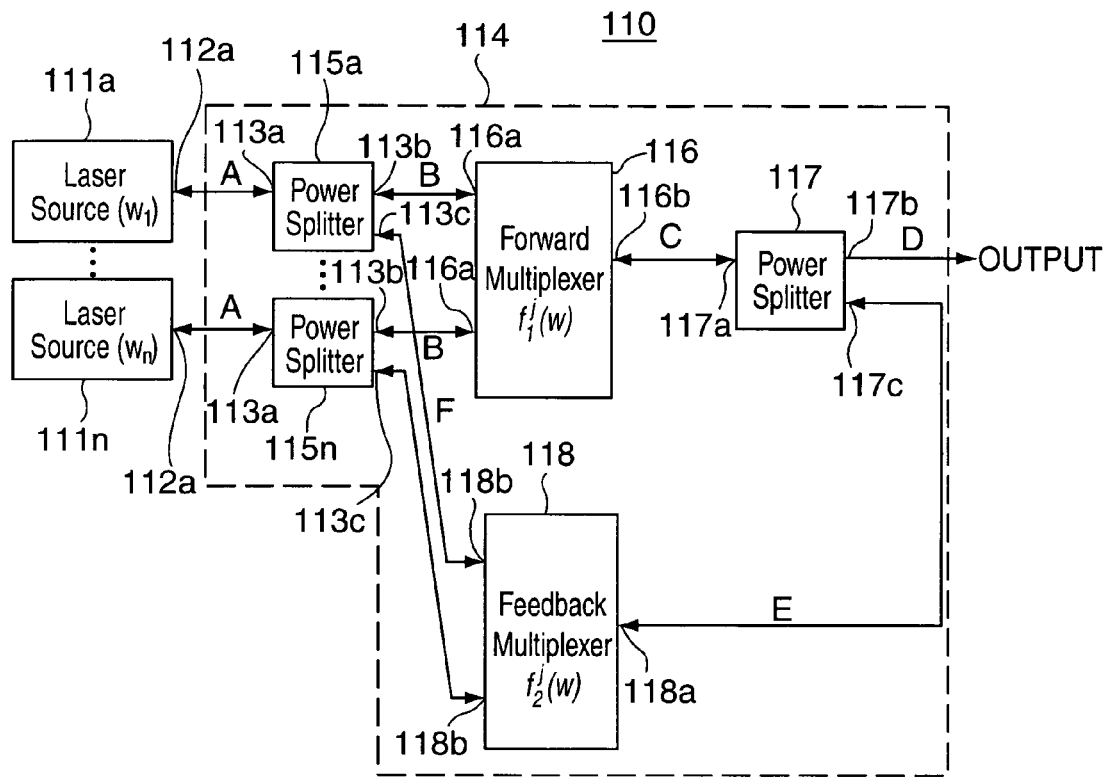
FIG. 11 shows schematic diagram of a system for multiple radiation sources in accordance with the second embodiment of the present invention.

Referring now to FIG. 11, there is shown a schematic diagram of a stabilized laser system 110 illustrating a blue shift stabilizing arrangement 114 (shown within a dashed line area) for a plurality of n radiation sources (LASER SOURCE) 111a–111n (of which only laser sources 111a and 111n are shown) in accordance with the second embodiment of the present invention. The system 110 shows a simplified implementation of the system 70 of FIG. 8 for a plurality of n laser source 111a–111n. The blue shift stabilizing arrangement 114 comprises a plurality of n first power splitters 115a–115n (of which only power splitters 115a and 115n are shown), a forward multiplexer, $f_1^j(w)$, 116, a second power splitter 117, and a feedback multiplexer, $f_2^j(w)$, 118. Each of the plurality of n laser sources 111a–111n is coupled at a front facet (output port) 112a–112n thereof to a first n input/output port 113a–113n of a separate corresponding one of the plurality of n first power splitters 115a–115n via an optical path A. A second input/output port 113b of each of the first power splitters 115a–115n is coupled to a separate corresponding one of a plurality of n first input/output ports 116a of the forward multiplexer 116 via an optical path B. A second input/output port 116b of the forward multiplexer 116 is coupled to a first input/output port 117a of the second power splitter 117 via an optical path C. A second output port 117b of the second power splitter 117 provides an output signal from the system 110 via an optical path D to any remote downstream device (not shown) using the output signal, and a third input/output port 117c is coupled to a first input/output port 118a of the feedback multiplexer 118 via an optical path E. A second input/output port 118b of the feedback multiplexer 118 is coupled to a third input/output port 113c of a separate corresponding one of the plurality of n first power splitter 115a–115n via an optical path F.

In the configuration of the system 110, the single channel main transmission filter, $f_1(w)$, 96 and the single channel feedback transmission filter, $f_2(w)$, 98 shown in FIG. 9 are replaced with the forward multiplexer 116 and feedback multiplexer 118, respectively. The spectral response between the jth input port 116j (not shown) and output port 116b of the forward multiplexer 116 is represented by $f_1^j(w)$, and the spectral response between the jth input port 118j (not shown) and the output port 118a of the feedback multiplexer 118 is represented by $f_2^j(w)$. Depending on the technology platform used, the multiplexers 116 and 118 can be implemented using different techniques such as Arrayed Waveguide Gratings (AWG), Eschelle gratings, Mach-Zehnder interferometers, bulk gratings, thin film filters, optical fiber filters, etc.

A main output signal [e.g., wavelength 1 ($w_1$)] from, for example, the laser source 111a is propagating a single trip from laser source 111a to the output optical path D through the first and second power splitter 115a and 117 and the forward multiplexer 116, $f_1^j(w)$, via optical paths A→B→C→D. Concurrently, this signal ($w_1$) is being multiplexed with the other input signals (e.g., $w_2$–$w_n$) from the lasers 111b–111n in the forward multiplexer 116. The feedback signal at the front facets 112a of the laser sources 111a–111n comprises two components. The optical path providing one of the feedback signal components comprises the laser sources 111a–111n, the first power splitters 115a–115n, the forward multiplexer 116, $f_1^j(w)$, the second power splitter 117, the feedback multiplexer 118, $f_2^j(w)$, the first power splitters 115a–115n, and the front facets 112a of the lasers sources 111a–111n including the optical paths A→B→C→E→F→A. The optical path providing the other one of the feedback signal components comprises the laser sources 111a–111n, the feedback multiplexer 118, $f_2^j(w)$, the second power splitter 117, the forward multiplexer 116, $f_1^j(w)$, the first power splitters 115a–115n, and the front facets 112a of the lasers sources 111a–111n including the optical paths A→F→E→C→B→A. Since the two optical paths are exactly the same, feedback components are in-phase with equal amplitudes. As indicated hereinbefore, the stabilized output signal appearing at the output port 117b of the second power splitter 117 is filtered only by the forward multiplexer 116, $f_1^j(w)$, and, therefore, the forward filter spectral response for the jth port is $F_o^j(w)=f_1^j(w)$. The feedback signal for the jth port, however, is passed through both the feedback multiplexer 118, $f_2^j(w)$, and the forward multiplexer 116, $f_1^j(w)$, resulting in a feedback spectral response for the jth port of $F_f^j(w)=f_1^j(w)\cdot f_2^j(w)$.

Figure 12:
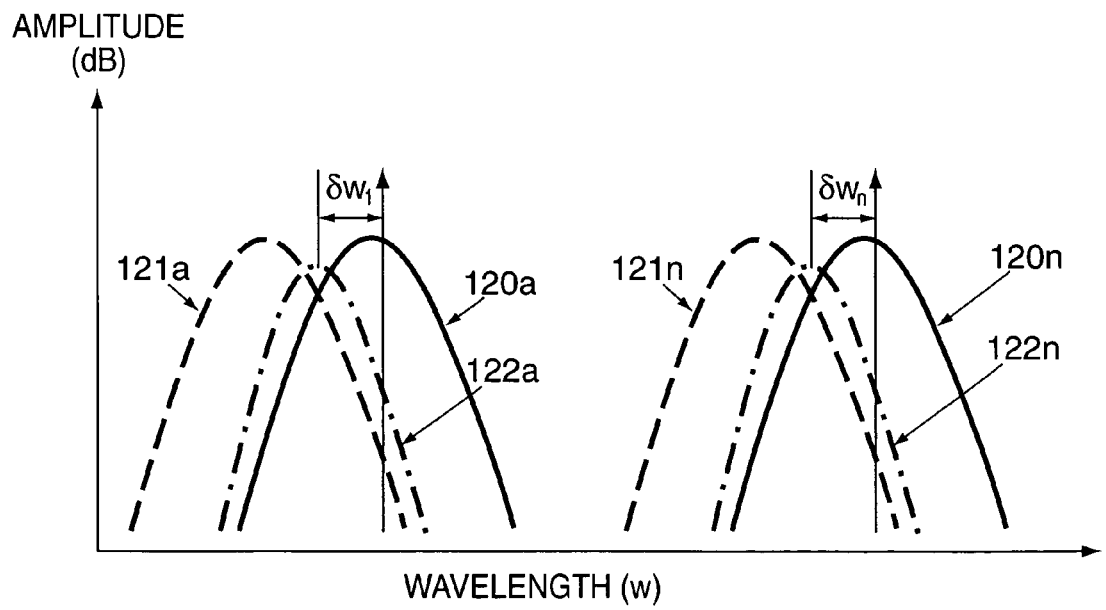
FIG. 12 shows a graph of wavelength on the X-axis versus amplitude (dB) on the Y-axis for illustrating exemplary forward and feedback spectral responses that might be found in the system of FIG. 11.

Referring now to FIG. 12, there is shown a graph of wavelength (w) on the X-axis versus amplitude (dB) on the Y-axis for illustrating exemplary forward multiplexer spectral response curves 120a–120n (each being shown by a solid curve), feedback multiplexer spectral response curves 121a–121n (shown by dashed line curves of which only curves 120a, 120n, 121a, and 121n are shown), and feedback filter spectral response curves 122a–122n (shown as dashed and dotted curves of which only curves 122a and 122n are shown) that might be found in the blue shift system of FIG. 11. The forward and feedback multiplexers 116 and 118 must be designed such that the forward and feedback spectral responses, $F_o^j(w)$ and $F_f^j(w)$, for port 112a of the laser source 111j (not shown) provide the desired center wavelengths, bandwidths, and wavelength shift (δw) between the responses $F_o^j(w)$ and $F_f^j(w)$. As described hereinbefore for systems 30 and 50, for a stable operation of a stabilized external cavity feedback laser, the entire optical path in which the feedback signal is propagating must preserve the polarization state due to signal and environmental conditions. This means that the components and interconnects except the output port 112b is maintaining the polarization state from the laser sources 111a–111n. Still further, one or multiple optional delay lines (not shown) can be added between any two components in the feedback optical signal path of A→B→C→E→F→A when an incoherent feedback signal is required for the laser sources 111a–111n.

Figure 13:
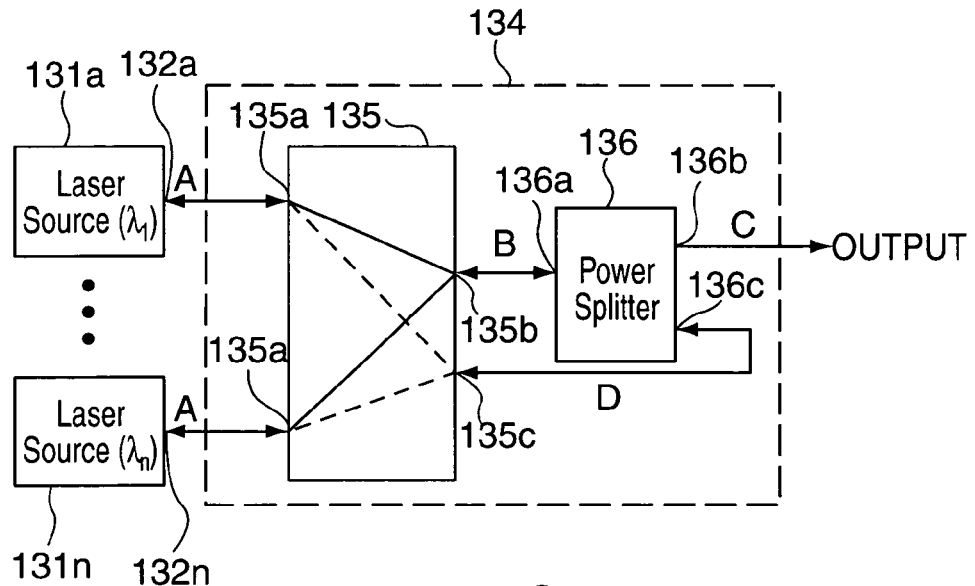
FIG. 13 shows a schematic diagram of a system for multiple laser sources similar to the system shown in FIG. 11 in accordance with the second embodiment of the present invention.

Referring now to FIG. 13, there is shown a schematic diagram of a stabilized laser system 130 (shown within a dashed line rectangle) for a plurality of n laser sources 131a–131n (of which only lasers sources 131a and 131n are shown) which is modified from the system 110 of FIG. 11. The system 130 comprises the laser sources 131a–131n, a blue shift feedback stabilizing arrangement 134 (shown within a dashed line rectangle) comprising a forward and feedback multiplexer 135 and a power splitter 136. Front facets 132a–132n of the plurality of n laser sources 131a–131n, respectively, are coupled to a respective separate one of first input/output ports 135a of the forward and feedback multiplexer 135 via optical paths A. A second input/output port 135b of the forward and feedback multiplexer 135 is coupled to a first input/output port 136a of the power splitter 136 via an optical path B, while a third input/output port 135c of the forward and feedback multiplexer 135 is coupled to a third input/output port 136c of the power splitter 136 via an optical path D. A second output port 136b of the power splitter 136 provides an output signal from the system 130 via an optical path C to any desired downstream device or system (not shown). Depending on the technology platform, the forward and feedback multiplexer 135 can be implemented using different devices such as an Array Waveguide Grating (AWG), Eschelle grating, Mach-Zehnder interferometer, bulk grating, thin film filters, fiber filters, etc.

In the system 130, the main output signal (e.g., for wavelength 1–n ($w_1$–$w_n$)) propagates for a single trip from the laser sources 131a–131n through the forward and feedback multiplexer 135 and the power splitter 136 to its output port 136b via optical paths A→B→C. In a forward direction, the forward multiplexer 135, having a spectral response of $f_1^j(w)$, receives the output signals from the laser sources 131a–131n at the associated input/output ports 135a, and multiplexes these laser source input signals to generate a multiplexed output signal at input/output port 135b onto optical path B for transmission to input/output port 136a of the power splitter 136. In the power splitter 136, a portion of the multiplexed output signal from the forward and feedback multiplexer 135 is tapped at input/output port 136c and sent to input/output port 135c of the forward and feedback multiplexer 135 via optical path D. This tapped signal is demultiplexed and filtered by the feedback multiplexer 135, having a spectral response $f_2^j(w)$, and the demultiplexed and filtered output signal from input/output ports 135a provide the associated separate feedback signals to the associated front facets 132a–132n of the respective laser sources 131a–131n, respectively, via optical paths A.

If the multiplexer 135 is designed such that it provides both functions of forward multiplexing and feedback demultiplexing for all input ports 135a, 135b, and 135c, then forward and feedback multiplexers 116 and 118 of FIG. 11 can be merged into one component as shown in FIG. 13. The multiplexer 135 has two output ports 135b and 135c, the output port 135b being for transmitting the main forward signal via input port 136a of the power splitter 136 to optical path D which is similar to output port 116b of FIG. 11. The second output port 135c of the multiplexer 135 delivers a feedback signal that is blue shifted with respect to the output port 135b of the multiplexer 135 and is similar to port 118a in FIG. 11.

The feedback signal at the front facets 132a–132n of the laser sources 131a–131n, respectively, comprise two components. The optical path of one feedback signal component for a jth laser source comprises the laser source 131j (not shown), the forward section, $f_1^j(w)$, of the multiplexer 135, power splitter 136, the feedback section, $f_2^j(w)$, of the multiplexer 135, and the laser front facet 132j using the optical paths A→B→D→A. The optical path of the second feedback signal component for a jth laser source comprises the laser source 131j, the feedback section, $f_2^j(w)$, of the multiplexer 135, power splitter 136, the forward section, $f_1^j(w)$, of the multiplexer 135, and the laser front facet 132j using the optical paths A→D→B→A. Since the two optical paths are exactly the same, feedback components are in-phase with equal amplitude. The stabilized output signal from the laser sources 131a–131n found at output port 136 of the power splitter 136 is filtered only by the forward section of the multiplexer 135, $f_1^j(w)$, and, therefore, the forward filter spectral response ($F_o^j$) for the jth port is $F_o^j = f_1^j(w)$. The feedback signal for the jth port, however, is passed through both the feedback section of the multiplexer 135, $f_2^j(w)$, and the forward section of the multiplexer 135, $f_1 j(w)$. Therefore, the feedback filter spectral response for the jth port is $F_f j(w) = f_1 j(w) \cdot f_2 j(w)$. The forward and feedback multiplexer sections must be designed such that the forward, $F_o j(w)$, and feedback, $F_f j(w)$, filter spectral responses for the port j provide desired wavelengths, bandwidths, and wavelength shift ($\delta w$) between the spectral responses $F_o^j(w)$ and $F_f^j(w)$. The spectral response curves 120a–120n (Forward filter, $F_o^j(w)$), 121a–121n (feedback multiplexer, $f_2^j(w)$), and 122a–122n (Feedback filter, $F_f^j(w)$) shown in FIG. 12 correspond to spectral response curves obtainable in the system 130, where, for a jth port 135a (not shown) of the multiplexer 135, the curves 120a–120n show the forward filter spectral response of $F_o^j(w) = f_o^j(w)$, curves 121a–121n show the feedback multiplexer spectral response $f_2^j(w)$, and curves 122a–122n show the feedback filter spectral response $F_f^j(w) = f_1^j(w) \cdot f_2^j(w)$.

As indicated hereinbefore for other systems (e.g., system 30), the entire optical path in which the feedback signal is propagating must preserve the polarization state (polarization maintaining, PM). This means that all components and interconnects except the output port 136b of the power splitter 136 is maintaining the polarization state. Still further, where incoherent feedback signals are desired for the laser sources 131a–131n, optional delay lines can be added between any two components in the optical paths A→B→D→A of feedback signal.

Figure 14:
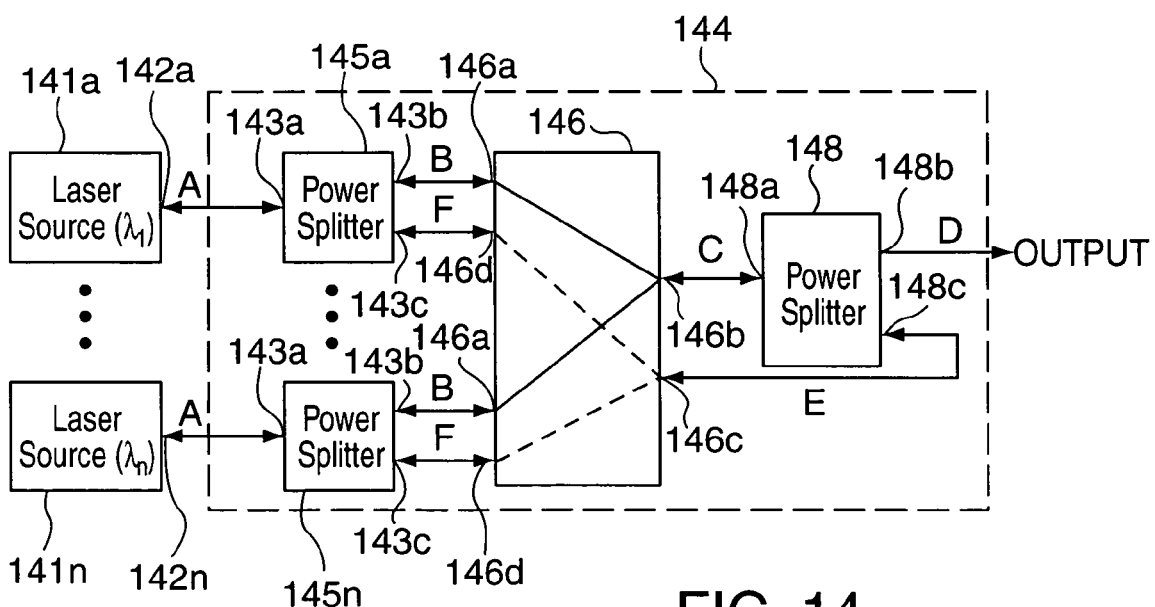
FIG. 14 shows a schematic diagram of a system for multiple laser sources similar to the system shown in FIG. 11 in accordance with the second embodiment of the present invention.

Referring now to FIG. 14, there is shown a schematic diagram of an alternative stabilized laser system 140 for a plurality of n laser sources 141a–141n using a combination of components shown in the systems 110 and 130 shown in FIGS. 11 and 13, respectively, in accordance with the second embodiment of the present invention. The feed back stabilization system 140 comprises a plurality of n laser sources 141a–141n, and a blue shift feedback stabilizing arrangement 144 (shown within a dashed line rectangle) comprising a plurality of n first power splitters 145a–145n, a forward and feedback multiplexer 146, and a second power splitter 148. The plurality of N laser sources 141a–141n are each coupled at the respective one of forward facets 142a–142n thereof, respectively, via optical paths A to a first input/output port 143a of a separate corresponding one the plurality on n first power splitters 145a–145n. A second input/output port 143b of each of the first power splitter 145a–145n is coupled via an optical path B to a separate corresponding one of a plurality of n first input/output ports 146a of the forward and feedback multiplexer 146. A second input/output port 146b of the forward and feedback multiplexer 146 is coupled via an optical path C to a first input/output port 148a of the second power splitter 148. A second output port 148b of the second power splitter 148 is coupled to an optical path D to provide an output signal from the system 140, and a third input/output port 148c of the second power splitter 148 is coupled via optical path E to a third input/output port 146c of the forward and feedback multiplexer 146. Each of a plurality of n fourth input/output ports 146d of the forward and feedback multiplexer 146 is coupled via an optical path F to a third input/output port 143c of a separate corresponding one of the plurality of n first power splitters 145a–145n for providing a predetermined blue shifted wavelength feedback signal to its associated one of the laser sources 141a–141n.

The plurality of n laser sources 141a–141n, the plurality of n first power splitters 145a–145n, and forward and feedback multiplexer 146 correspond to, and are connected and function as described hereinbefore for, the n laser sources 111a–111n and the first power splitters 115a–115n, and forward multiplexer 116 and feedback multiplexer 118, respectively, of FIG. 11. Therefore, a description of the operation of the laser sources 141a–141n, the first power splitters 145a–145n, the forward and feedback multiplexer 146, and the second power splitter 148 is essentially the same as described for the corresponding components in FIG. 11 and will not be repeated here. As was described for the systems 110 and 130, the entire optical path in the system 140 in which the feedback signal is traveling must preserve the polarization state (polarization maintaining, PM). This means that all components and interconnects except the output port 148b of the second power splitter 148 is maintaining the polarization state. Still further, where incoherent feedback signals are desired for the laser sources 141a–141n, optional delay lines can be added between any two components in the optical paths A→B→C→E→F→A of the feedback signals. The spectral response curves 120a–120n (Forward filter, $F_o^j(w)$), 121a–121n (feedback multiplexer, $f_2^j(w)$) and 122a–122n (Feedback filter, $F_f^j(w)$) shown in FIG. 12 correspond to spectral response curves obtainable in the system 140, where, for a jth channel, the curves 120a–120n show the forward filter spectral response of $F_o^j(w) = f_1^j(w)$, curves 121a–121n show the feedback section multiplexer spectral response $f_2^j(w)$, and curves 122a–122n show the feedback filter spectral response $F_f^j(w) = f_1^j(w) \cdot f_2^j(w)$.

Figure 15:
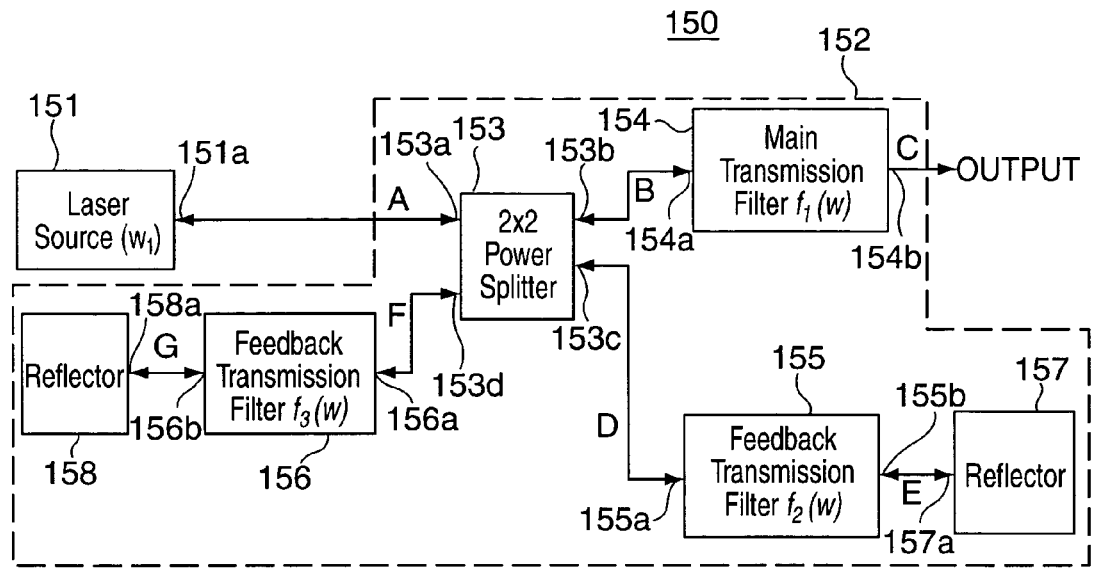
FIG. 15 shows a schematic diagram of a system for a single radiation source in accordance with a third embodiment of the present invention.

Referring now to FIG. 15, there is shown a schematic diagram of a system 150 illustrating a blue shift feedback stabilizing arrangement 152 (shown within a dashed line area) for a single radiation source 151 in accordance with a third embodiment of the present invention. The stabilizing arrangement 152 comprises a 2×2 power splitter 153, a main transmission filter ($f_1(w)$) 154, a first feedback transmission filter ($f_2(w)$) 155, a second feedback transmission filter ($f_3(w)$) 156, a first reflector 157, and a second reflector 158. The laser source 151 is coupled at a front facet 151a thereof to a first input/output port 153a of the power splitter 153 via an optical path A. A second input/output port 153b of the power splitter 153 is coupled to a first input/output port 154a of the main transmission filter 154 via an optical path B, a third input/output port 153c is coupled to a first input/output port 155a of the first feedback transmission filter 155 via an optical path D, and a fourth input/output port 153d is coupled to a first input/output port 156a of the second feedback transmission filter 156 via an optical path F. A second output port 154b of the main transmission filter 154 is coupled via an optical path C to provide an output signal from the system 150 to any downstream device (not shown). A second input/output port 155b of the first feedback transmission filter 155 is coupled to an input/output port 157a of the first reflector 157 via an optical path E. A second input/output port 156b of the second feedback transmission filter 156 is coupled to an input/output port 158a of the second reflector 158 via an optical path G. In any third embodiment in accordance with the present invention, a blue shift feedback stabilizing arrangement (e.g., arrangement 152), the output signal from the system (e.g., system 150) is obtained directly from a component (e.g., main transmission filter 154) that only provides such output signal, and not from a component that is providing both the output signal and a tapped off portion of the output signal to be used as a feedback signal for at least one laser source.

In the system 150, a portion of the signal propagating through the main signal path (optical paths A→B→C) is tapped off in the forward direction at input/output port 153c of the 2×2 power splitter 153 between the laser source 151 and the main transmission filter, $f_1(w)$, 154. This tapped off signal is filtered using the first feedback transmission filter, $f_2(w)$, 155, and is reflected by the first reflector 157 back into the laser source 151. The remainder of the signal in the forward direction is filtered by the main transmission filter, $f_1(w)$, 154, and routed to output port 154b and onto optical path C as the output signal from the system 150. The output signal has other components due to the presence of a cavity created between the first and second reflectors 157 and 158, respectively, via optical paths E→D→F→G. Each signal round trip in the cavity (in optical paths E→D→F→G→F→D→E) contributes a delayed component to the output signal whose properties are set by the cavity length, the first feedback transmission filter, $f_2(w)$, 155, the second feedback transmission filter, $f_3(w)$, 156, the power splitter 153, and the first and second reflectors 157 and 158. A first component of the feedback signal propagates from the laser source 151 through the power splitter 153, the first feedback transmission filter 155, $f_2(w)$, reflector 157 and back again through the same reverse path (optical path A→D→E→D→A). The feedback signal has other components due to the presence of the cavity between the first and second reflectors 157 and 158. Each signal round trip via optical paths F→G→F→D→E→D→F in the cavity contributes a delayed component whose properties are set by the cavity length, the first feedback transmission filter, $f_2(w)$, 155, the second feedback transmission filter, $f_3(w)$, 156, the power splitter 153, and the first and second reflectors 157 and 158.

The spectral responses that are obtainable in the system 150 for each of the forward filter spectral response, $F_o(w)$, and the feedback filter spectral response, $F_f(w)$, correspond to the curves 36 and 37, respectively, shown in FIG. 4. The spectral responses for the forward and feedback filters whose properties such as filter bandwidth, and wavelength shift ($\delta w$) between the forward and feedback spectral responses can be achieved by a proper choice of $f_1(w)$, $f_2(w)$, and $f_3(w)$, the coupling ratio, and the cavity length. As described for each of the prior systems of the present invention, the entire optical path in which the feedback signal is propagating must preserve the polarization state (polarization maintaining, PM). This means that all components and interconnects, except the main transmission filter, $f_1(w)$, 154 and its input/output ports 154a and 154b are maintaining the polarization state of the laser source 151. Depending on the technology platform, the 2×2 power splitter 153 can be achieved by different methods such as planar waveguide technology using a directional coupler (DC), multimode interference (MMI) coupler, asymmetric Y junctions, Mach-Zehnder interferometer, etc, and free space optics using thin film, etc. Still further, one or multiple optional delay lines (not shown) can be added between any two components in the feedback optical signal path of A→D→E when an incoherent feedback signal is required for the laser source 151.

Figure 16:
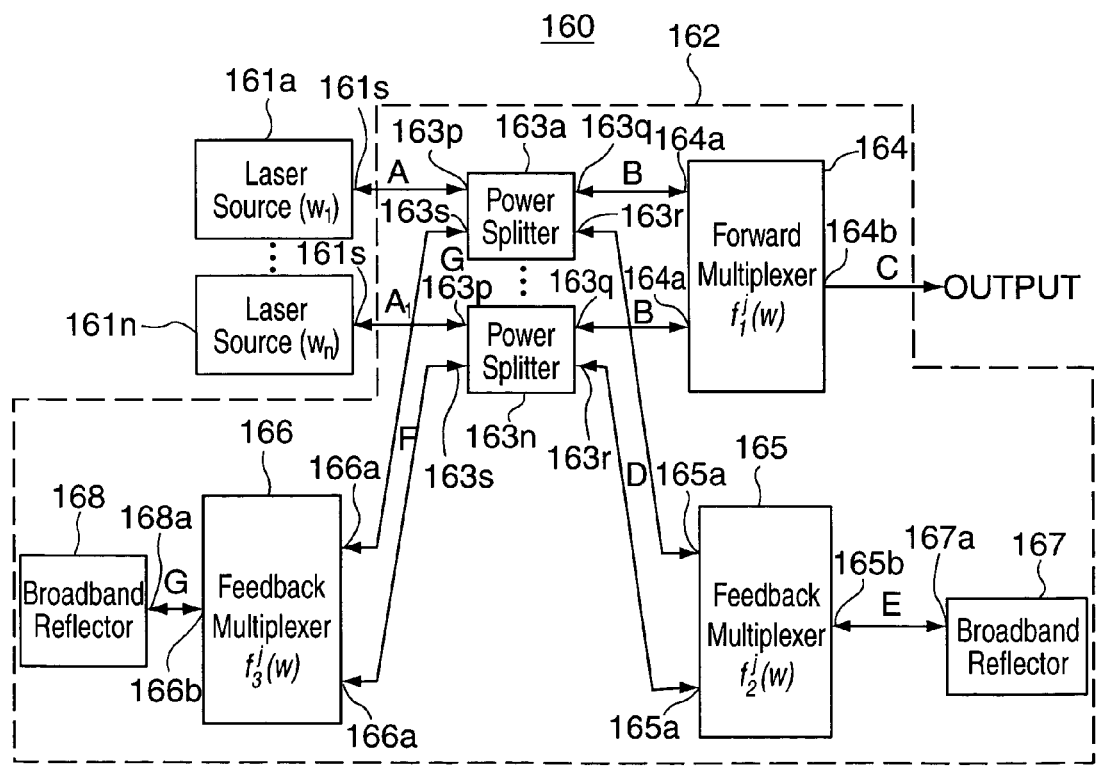
FIG. 16 shows a schematic diagram of a system for multiple laser sources similar to the feedback stabilization system of FIG. 15 in accordance with the third embodiment of the present invention.

Referring now to FIG. 16, there is shown a schematic diagram of a stabilized laser system 160 similar to the system 150 of FIG. 15 illustrating a blue shift stabilizing arrangement 162 (shown within a dashed line area) for a plurality of radiation sources 161a–161n (of which only laser sources 161a and 161n are shown) in accordance with the third embodiment of the present invention. The system 160 comprises the plurality of n laser sources 161a–161n, and a blue shift feedback stabilizing arrangement 162 (shown within a dashed line area). The blue shift feedback stabilizing arrangement 162 comprises a plurality of n 2×2 power splitters 163a–163n (of which only power splitters 163a and 163n are shown), a forward multiplexer, $f_1^j(w)$, 164, a first feedback multiplexer, $f_2^j(w)$, 165, a second multiplexer, $f_3^j(w)$, 166, a first broadband reflector 167, and a second broadband reflector 168. Each of the laser sources 161a–161n is coupled from a front facet 161a thereof to first input/output port 163p of a separate corresponding one of the plurality of n power splitters 163a–163n via an optical path A. A second input/output port 163q of each of the first power splitters 163a–163n is coupled to a separate corresponding one of a plurality of n first input/output ports 164a of the forward multiplexer 164 via an optical path B. A second output port 164b of the forward multiplexer 164 provides an output signal from the system 160 via an optical path C to any remote downstream device (not shown). A third input/output port 163r of each of the plurality of n power splitters 163a–163n is coupled to a separate corresponding one of a plurality of first input/output port 165a–165n of the first feedback multiplexer 165 via a separate optical path D, while a fourth input/output port 160s of each of the plurality of n power splitters 163a–163n is coupled to a separate corresponding one of a plurality of first input/output port 166a of the second feedback multiplexer 166 via a separate optical path F. A second input/output port 165b of the first feedback multiplexer 165 is coupled to an input/output port 167a of the first broadband reflector 167 via an optical path E, and a second input/output port 166b of the second feedback multiplexer 166 is coupled to an input/output port 168a of the second broadband reflector 168 via an optical path G. In the system 160, the single power splitter 153, the single channel main transmission filter, $f_1(w)$, 154, and the first and second feedback transmission filters, $f_2(w)$ and $f_3(w)$, 155 and 156 in the system 150 of FIG. 15 are replaced by a plurality of n power splitter 163a–163n, a multiple channel forward multiplexer, $f_1^j(w)$, 164, and multiple channel first and second feedback multiplexers, $f_2^j(w)$ and $f_3^j(w)$, 165 and 166, respectively.

The spectral response between the jth first input/output port 164j (not shown) and the second output port 164b of the forward multiplexer 164 is represented by $f_1^j(w)$, the spectral response between the jth first input/output port 165a (not shown) and the second input/output port 165b of the first feedback multiplexer 165 is represented by $f_2^j(w)$, and the spectral response between the jth first input/output port 166a (not shown) and the second input/output port 166b of the second feedback multiplexer 166 is represented by $f_3^j(w)$. The description of the operation for the single laser source 151 and the blue shift feedback stabilizing arrangement 152 of FIG. 15 is applicable to the operation of each of the multiple laser sources 161a–161n and the blue shift stabilization feedback arrangement 162 of FIG. 16 except that each of the forward multiplexer 164 and the first and second feedback multiplexers 165 and 166 perform multiplexing and demultiplexing functions for the concurrent multiple signal received.

Depending on the technology platform, the multiplexers 164, 165, and 166 can be implemented using different devices such as an Array Waveguide grating (AWG), Eschelle grating, Mach-Zehnder interferometer, bulk grating, thin film filters, fiber filters, etc. Still further, one or multiple optional delay lines (not shown) can be added between any two components in any one of the optical feedback signal paths of A, D, E, F, or G when incoherent feedback signals are required for the laser sources 161a–161n. The spectral responses that are obtainable in the system 160 for each of the forward filter spectral response, $F_o(w)$, and the feedback filter spectral response, $F_f(w)$, correspond to the curves 46a–46n and 47a–47n, respectively, shown in FIG. 6. As described for each of the prior systems (e.g., systems 30, 110, 130) of the present invention, the entire optical path in which the feedback signal is propagating must preserve the polarization state (polarization maintaining, PM). This means that all components and interconnects, except the forward multiplexer, $f_1(w)$, 164 and its input/output ports 164a and 164b are maintaining the polarization state of the laser sources 161a–161n.

Figure 17:
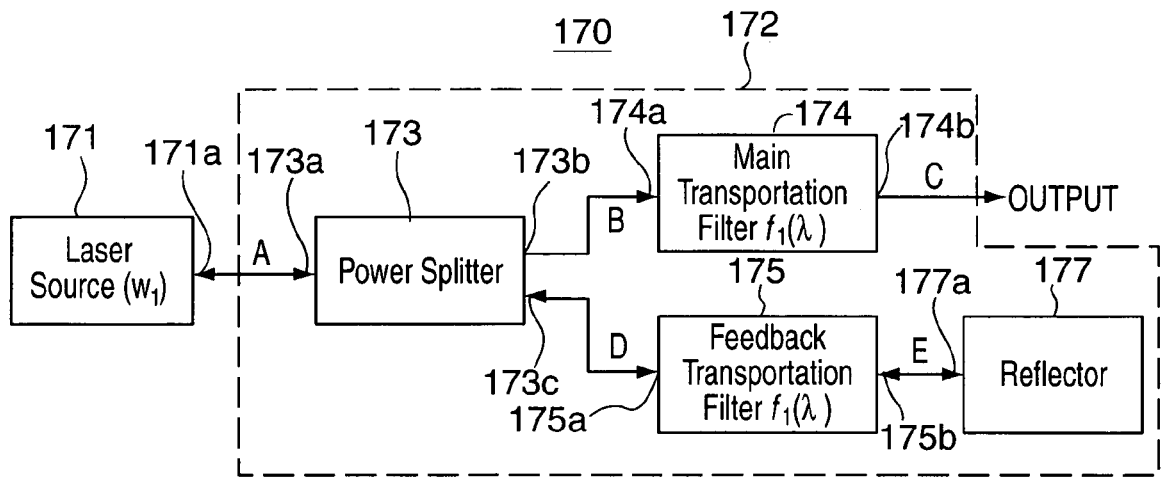
FIG. 17 shows a schematic diagram of a system, which is less complex than the feedback stabilization system of FIG. 15, for a single radiation source in accordance with the third embodiment of the present invention.

Referring now to FIG. 17, there is shown a schematic diagram of a stabilized laser system 170 illustrating a blue shift stabilizing arrangement 172 (shown within a dashed line area) for a single radiation source (Laser Source, ($w_1$), 171 in accordance with the third embodiment of the present invention. The arrangement 172 is a reduced version of the arrangement 152 of FIG. 15 in that the arrangement 172 eliminates the use of the second feedback transmission filter 156 and the second reflector 158 shown in the arrangement 152. The arrangement 172 comprises a power splitter 173, a main transmission filter ($f_1(w)$) 174, a feedback transmission filter ($f_2(w)$) 175, and a reflector 177. The laser source 171 is coupled at a front facet 171a thereof to a first input/output port 173a of the power splitter 173 via an optical path A. A second input/output port 173b of the power splitter 173 is coupled to a first input/output port 174a of the main transmission filter 174 via an optical path B, and a third input/output port 173c is coupled to a first input/output port 175a of the feedback transmission filter 175 via an optical path D. A second output port 174b of the main transmission filter 174 is coupled to an optical path C that provides an output signal from the system 170 to any downstream device (not shown) using such output signal. A second input/output port 175b of the feedback transmission filter 175 is coupled to an input/output port 177a of the reflector 177 via an optical path E. As described hereinbefore for, for example, the system 30 of FIG. 3, the entire optical path in which a feedback signal is propagating must preserve the polarization state (polarization maintaining, PM). This means that all components and interconnects, except the first and second output ports 174a and 174b of the main transmission filter 174 is maintaining the polarization state. Still further, one or multiple optional delay lines (not shown) can be added between any two components in the feedback optical signal path of A→D→E→D→A when an incoherent feedback signal is required for the laser source 171.

The main output signal propagates for a single trip from the laser source 171 through the power splitter 173, the main transmission filter, $f_2(w)$, 174, to its output port 174b and the optical path C. The signal on the main optical paths A→B→C is tapped off by the power splitter 173 at its third input/output port 173c before reaching the main transmission filter, $f_1(w)$, to be processed as the feedback signal. The feedback signal at the front facet 171a of the laser source 171 comprises one component. The optical path for the feedback signal comprises the laser source 171, the power splitter 173, the feedback filter, $f_2(w)$, 175, the reflector 177, and back through the same optical paths for a complete feedback optical path of A→D→E→D→A. Therefore, the forward filter spectral response is $F_o(w)=f_1(w)$ since the main output signal only passes through the main transmission filter, $f_1(w)$, 174. The feedback is filtered twice in going through and back in the feedback transmission filter, $f_2(w)$, 175, and, therefore, the feedback filter spectral response is $F_f(w)=f_2(w) \cdot f_2(w)$. In the implementation of the system 170, the two filter spectral responses $F_o(w)$ and $F_f(w)$ are independent of each other.

Figure 18:
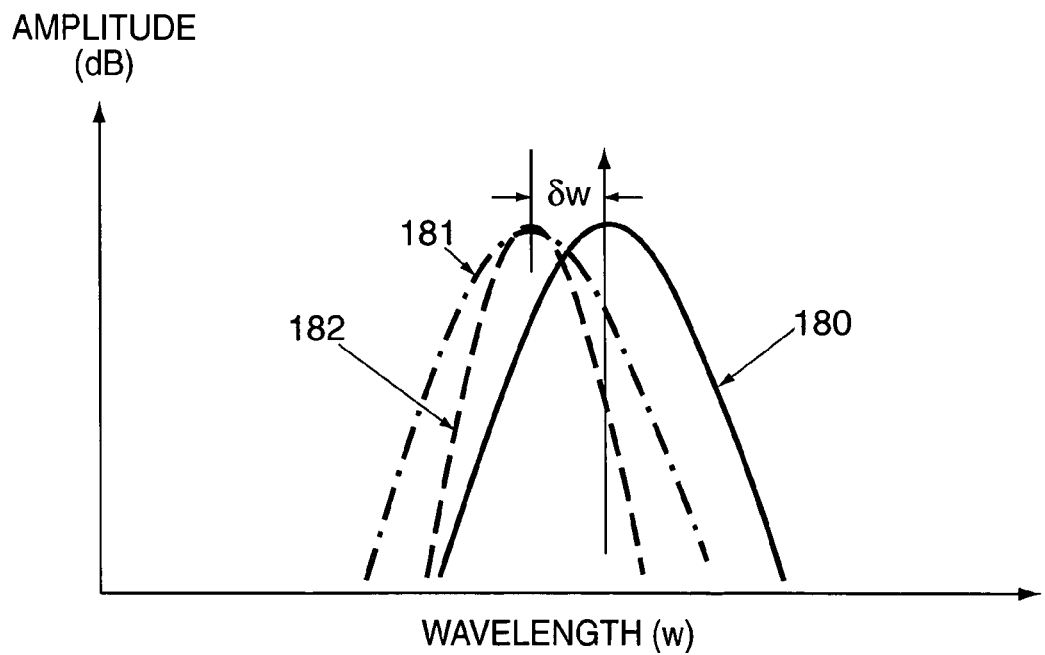
FIG. 18 shows a graph of wavelength on the X-axis versus amplitude (dB) on the Y-axis for illustrating exemplary forward and feedback spectral responses that might be found in the system of FIG. 17.

Referring now to FIG. 18, there is shown a graph of wavelength (w) on the X-axis versus amplitude (dB) on the Y-axis for illustrating exemplary forward and feedback spectral responses that might be found in the system 170 of FIG. 17. The main transmission filter, $f_1(w)$, 174 and the feedback transmission filter, $f_2(w)$, 175 must be designed such that the forward and feedback filter spectral responses, $F_o(w)$ and $F_f(w)$, provide desired center wavelengths, bandwidths of the forward and feedback spectral responses, and wavelength shift ($\delta w$) between the spectral responses $F_o(w)$ and $F_f(w)$. The curve 180 shows an exemplary forward filter spectral response $F_o(w)=f_1(w)$, the curve 181 shows an exemplary feedback transmission filter spectral response $f_2(w)$, and curve 182 shows an exemplary feedback filter spectral response $F_f(w)=f_2(w) \cdot f_2(w)$ for the system 170.

Figure 19:
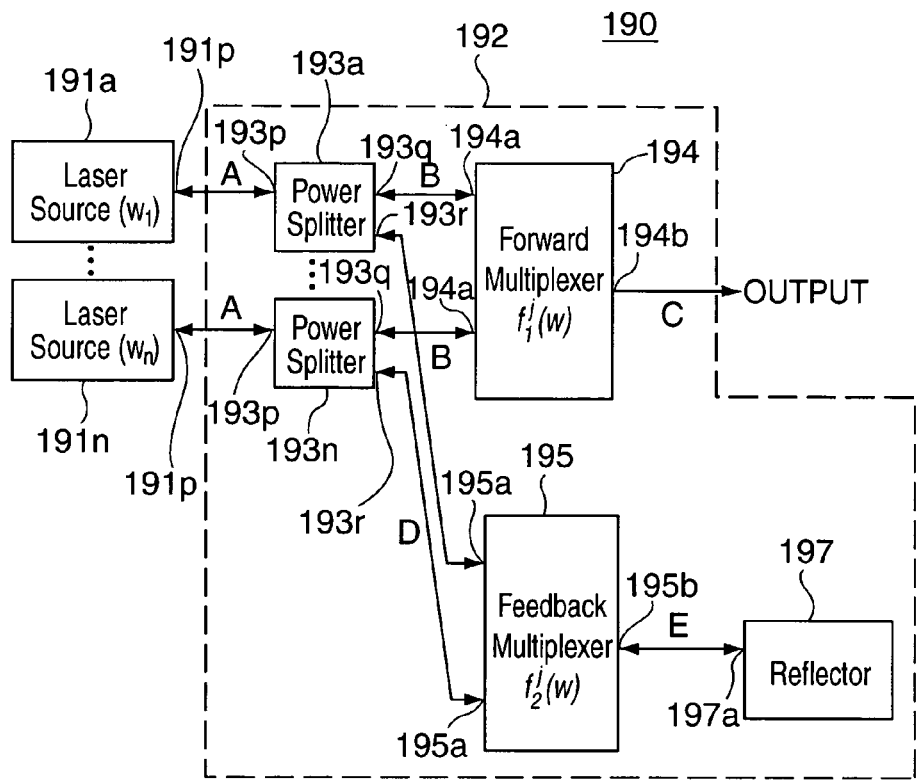
FIG. 19 shows a schematic diagram of a system, which is less complex than the feedback stabilization system of FIG. 16, that illustrates a blue shift stabilizing arrangement for multiple radiation sources in accordance with the third embodiment of the present invention.

Referring now to FIG. 19, there is shown a schematic diagram of a stabilized laser system 190 that is a reduced version of the system 160 of FIG. 16 and illustrates a blue shift stabilizing arrangement 192 (shown within a dashed line area) for a plurality of n radiation sources (Laser Source) 191a–191n (of which only laser sources 191a and 191n are shown) in accordance with the third embodiment of the present invention. The arrangement 192 comprises a plurality of n power splitters 193a–193n (of which only power splitters 193a and 193n are shown), a forward multiplexer 194, a feedback multiplexer 195, and a reflector 197. Each of the laser sources 191a–191n is coupled from a front facet (output port) 191p thereof to first input/output port 193p of a separate corresponding one of the plurality of n power splitters 193a–193n via an optical path A. A second input/output port 193q of each of the first power splitters 193a–193n is coupled to a separate corresponding one of a plurality of n first input/output ports 194a of the forward multiplexer 194 via an optical path B. A second output port 194b of the forward multiplexer 194 provides an output signal from the system 190 via an optical path C to any remote downstream device (not shown). A third input/output port 193r of each of the plurality of n power splitters 193a–193n is coupled to a separate corresponding one of a plurality of n first input/output ports 195a of the feedback multiplexer 195 via a separate optical path D. A second input/output port 195b of the feedback multiplexer 195 is coupled to an input/output port 197a of the reflector 197 via an optical path E. In this configuration, the single channel main transmission filter, $f_1(w)$, 174 and the single channel feedback transmission filter, $f_2(w)$, 175 in the blue shift stabilizing arrangement 172 of FIG. 17 are replaced by a multiple channel forward multiplexer 194 and a multiple channel feedback multiplexer 195 in the blue shift stabilizing arrangement 192. The spectral response between a jth input port 194a and the input/output port 194b of the forward multiplexer 194 is represented by $f_1^j(w)$, and the spectral response between a jth input port 195a and the input/output port 195b of the feedback multiplexer 195 is represented by $f_2^j(w)$. Depending on the technology platform, the multiplexers 194 and 195 can be implemented using different devices such as an Array Waveguide grating (AWG), Eschelle grating, Mach-Zehnder interferometer, bulk grating, thin film filters, fiber filters, etc.

In operation, the main output signal (e.g., for $w_1$ for laser source 191a) is propagating a single trip from the laser source 191a through the power splitter 193a and the forward multiplexer 194, $f_1^j(w)$, to the output port 194b of the forward multiplexer 194. This signal is being multiplexed in the forward multiplexer 194 with the other input signals provided to the forward multiplexer 194 from the other laser sources 191b–191n via the associated power splitters 193b–193n, respectively. A feedback signal at the front facet 191p of each of the laser sources 191a–191n comprises one component. The optical path of the feedback signal component for each of the laser sources 191a–191n comprises the laser source (e.g., 191a) itself, the associated one of the power splitters 193a–193n, the feedback multiplexer 195, $f_2^j(w)$, the reflector 177, and back again via the same optical path to the front facet 191p of each of the laser sources 191a–191n. Therefore, the overall feedback optical path includes the serial optical paths of A→D→E→D→A. As was described for each of the prior systems (e.g., systems 30, 110, 130) of the present invention, the entire optical path in which the feedback signal is propagating must preserve the polarization state (polarization maintaining, PM). This means that all components and interconnects, except the forward multiplexer, $f_1^j(w)$, 194 and its input/output ports 194a and 194b are maintaining the polarization state of the laser sources 191a–191n. Still further, one or multiple optional delay lines (not shown) can be added between any two components in any one of the optical feedback signal paths of A, D, or E, when incoherent feedback signals are required for the laser sources 191a–191n.

Figure 20:
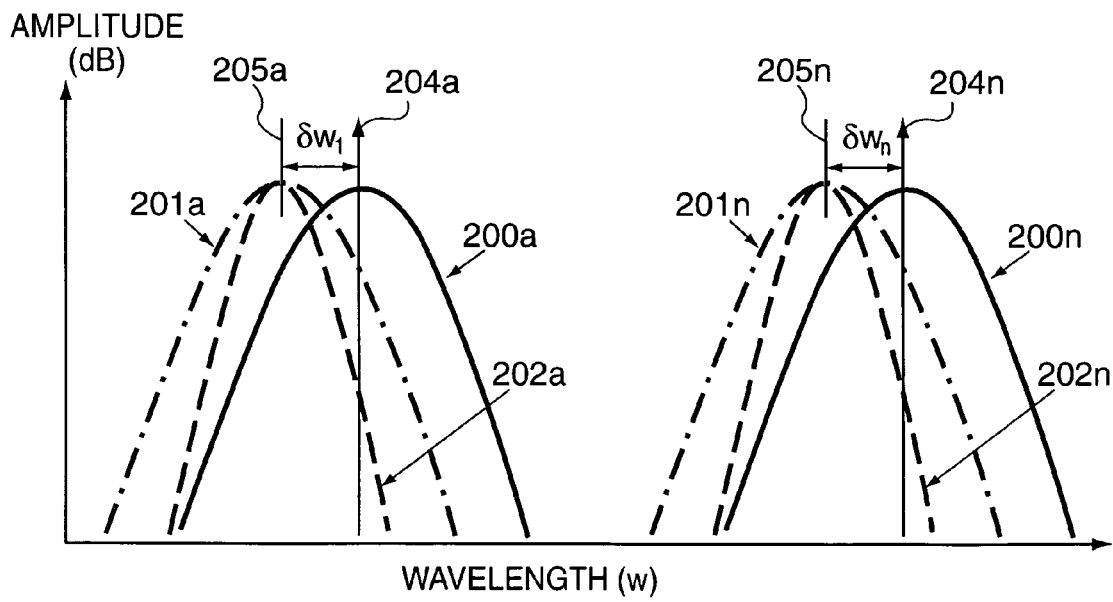
FIG. 20 shows a graph of wavelength on the X-axis versus amplitude (dB) on the Y-axis for illustrating exemplary forward and feedback spectral responses that might be found in the system of FIG. 19.

Referring now to FIG. 20, there is shown a graph of wavelength (w) on the X-axis versus amplitude (dB) on the Y-axis for illustrating exemplary forward and feedback spectral responses 200a–200n and 202a–202n (of which only spectral response curves 200a and 200n, and 202a and 202n are shown) that might be found in the system of FIG. 19. In the system 190, a stabilized output signal at output port 194b of the forward multiplexer, $f_1^j(w)$, 194 is filtered only by the forward multiplexer 194, and, therefore, the forward filter spectral response for the jth port (not shown) 194a is $F_o^j(w) = f_1^j(w)$ as shown by the solid curves 200a–200n. The spectral response of the feedback multiplexer, $f_2^j(w)$, 195 is shown by the dashed and dotted line curves 201a–201n. The feedback signal, however, is passed twice through the feedback multiplexer, $f_2^j(w)$, and, therefore the feedback filter spectral response for the jth port is $F_f^j(w) = f_2^j(w) \cdot f_2^j(w)$ and is shown by the dashed line curves 202a–202n. The forward multiplexer 194 and the feedback multiplexer 195 must be designed such that the forward and feedback filter spectral responses for port j, $F_o^j(w)$ and $F_f^j(w)$, provide desired center wavelengths 204j and 205j, bandwidths, and wavelength shift ($\delta w^j$) between $F_o^j(w)$ and $F_f^j(w)$.

Figure 21:
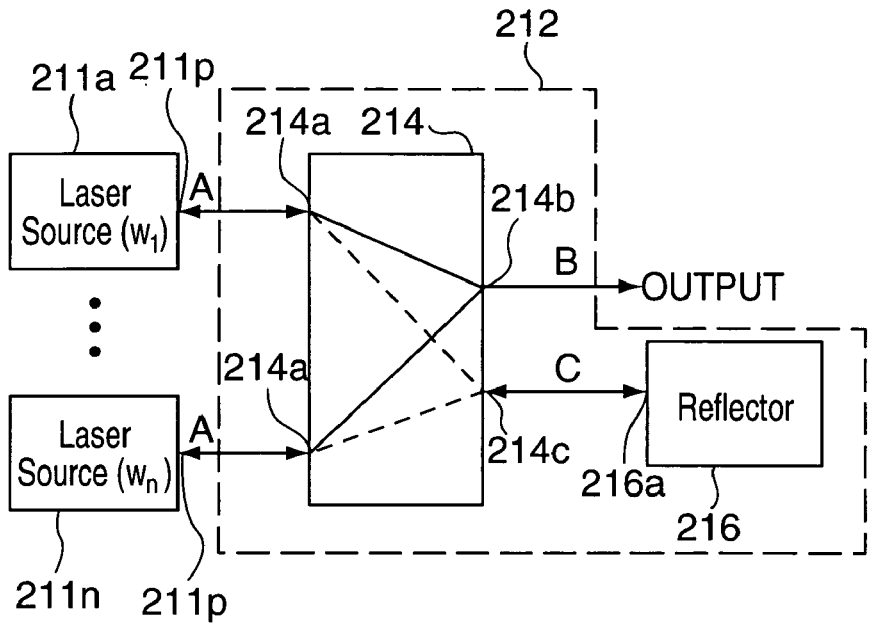
FIG. 21 shows a schematic diagram of a system, which is an alternative to the system of FIG. 19 and illustrates a blue shift stabilizing arrangement for multiple radiation sources in accordance with the third embodiment of the present invention.

Referring now to FIG. 21, there is shown a schematic diagram of a stabilized laser system 210 that is less complex than the system 190 of FIG. 19 and illustrates a blue shift stabilizing arrangement 212 (shown within a dashed line area) for a plurality of n radiation sources (Laser Source) 211a–211n in accordance with the third embodiment of the present invention. The blue shift stabilizing arrangement 212 comprises a forward and feedback multiplexer 214, and a reflector 216. Each of the plurality of n laser sources 211a–211n is coupled at a front facet 211p thereof to a separate one of a plurality of n first input/output ports 214a of the forward and feedback multiplexer 214 via a separate optical path A. A second output port 214b of the forward and feedback multiplexer 214 provides an output signal from the system 210 via an optical path B to any predetermined downstream device (not shown). A third input/output port 214c of the forward and feedback multiplexer 214 is coupled to an input/output port 216a of the reflector 216 via an optical path C. In the blue shift stabilizing arrangement 212, the second output port 214b of the multiplexer 214 is the main output port of the system 210 (similar to port 194b in FIG. 19), and the third input/output port 214c of the multiplexer 214 taps off a portion of the total multiplexed signal generated by the multiplexer 214 that is blue shifted with relation to the multiplexed output signal obtained at the main second output port 214b. The spectral responses shown in FIG. 20 of the Forward Filter spectral response $F_o^j(w)$ (shown by curves 200a–200n), the feedback multiplexer spectral response $f_2^j(w)$ (shown by curves 201a–201n), and the feedback filter spectral response $F_f^j(w) = f_2^j(2) \cdot f_2^j(w)$ (shown by curves 202a–202n) also apply to corresponding spectral responses obtained in the system 210.

In operation, the main output signal for, for example, the jth laser source 211j (not shown) is propagating a single trip from the laser source 211j through the forward and feedback multiplexer 214 where it is multiplexed with the other output signals from the laser sources 211a–211n and provided to the main output port 214b of the forward and feedback multiplexer 214 via optical paths A→B. Concurrently, the output signal from laser source 211j is routed through the forward and feedback multiplexer 214 where it is multiplexed with the other output signals from the laser sources 211a–211n and provided to the third input/output port 214c and transmitted to reflector 216 and then fed back to the laser source 211j via optical paths A→C→A. The feedback signal at the front facet 211p of the each of the laser sources 211a–211n comprises one component. The components in the optical path of the feedback signal for, for example, the jth laser source 211j comprise the laser source 211j, the forward and feedback multiplexer 214, $f_2^j(w)$, via its ports 214a and 214c, the reflector 216, the forward and feedback multiplexer 214, $f_2^j(w)$, via its ports 214c and 214a, and back to the front facet 211p of the laser source 211j. The stabilized output signal found in optical path B is filtered only once by the forward and feedback multiplexer 214 and, therefore, the forward filter spectral response for the jth port 214a (not shown) is $F_o^j(w) = f_1^j(w)$. The feedback signal, however, is passed twice through the forward and feedback multiplexer 214 and, therefore, the feedback spectral response for the jth port 214a (not shown) is $F_f^j(w) = f_2^j(w) \cdot f_2^j(w)$. The forward and feedback multiplexer 214 must be designed such that the forward filter spectral response $F_o^j(w)$ and the feedback spectral response $F_f^j(w)$ provide the desired center wavelengths, bandwidths, and wavelength shift ($\delta w$) between the forward and the feedback spectral responses. The forward and feedback multiplexer 214 is also designed such that it provides both functions of forward and feedback multiplexing for all input ports 214a. This implementation merges the separate functions of power splitter 193, the individual forward multiplexer 194, and the feedback multiplexer 195 in the blue shift stabilizing arrangement 192 of FIG. 19 into one component 214.

As described for each of the prior systems of the present invention, the entire optical path in which the feedback signal is propagating must preserve the polarization state (polarization maintaining, PM). This means that all components and interconnects, except the forward multiplexing portion of the forward and feedback multiplexer, $f_1^j(w)$, 214 and its input/output ports 214a and 214b are maintaining the polarization state of the laser sources 211a–211n. Still further, one or multiple optional delay lines (not shown) can be added between any two components in the feedback optical signal path of A→C→A when an incoherent feedback signal is required for the laser sources 211a–211n.

Figure 22:
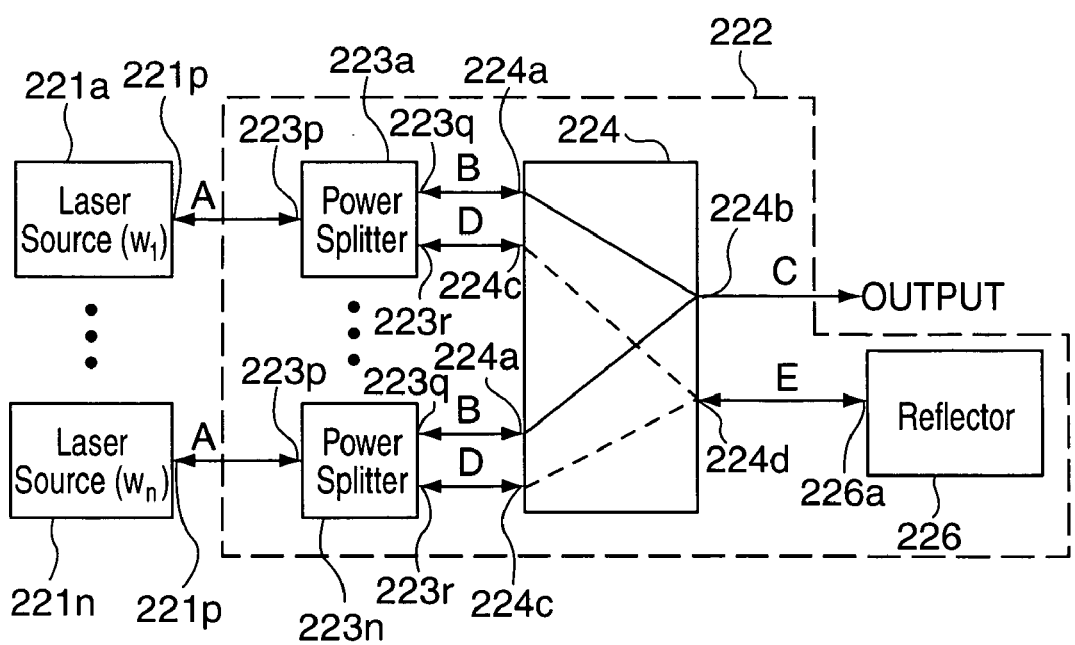
FIG. 22 shows a schematic diagram of a system, which is similar to the system of FIG. 19, and illustrates a blue shift stabilizing arrangement for multiple radiation sources in accordance with the third embodiment of the present invention.

Referring now to FIG. 22, there is shown a schematic diagram of a stabilized laser system 220 that is similar to the system 190 of FIG. 19 illustrating a blue shift feedback stabilizing arrangement 222 (shown within a dashed line area) for a plurality of n radiation sources (Laser Source) 221a–221n in accordance with the third embodiment of the present invention. The blue shift stabilizing arrangement 222 comprises a plurality of n power splitters 223a–223n, a forward and feedback multiplexer 224, and a reflector 226. Each of the plurality of n laser sources 221a–221n is coupled at a front facet 221p thereof to a first input/output port 223p of a separate corresponding one of the plurality of n power splitters 223a–223n via an optical path A. A second input/output port 223q of each of the power splitters 223a–223n is coupled via an optical path B to a separate corresponding one of a plurality of n first input/output ports 224a of the forward and feedback multiplexer 224. A third input/output port 223r of each of the power splitters 223a–223n is coupled via an optical path D to a separate corresponding one of a plurality of n third input/output ports 224c of the forward and feedback multiplexer 224. A second output port 224b of the forward and feedback multiplexer 224 provides an output signal from the system 220 via an optical path C to any predetermined downstream device (not shown). A fourth input/output port 224d of the forward and feedback multiplexer 224 is coupled to an input/output port 226a of the reflector 226 via an optical path E. In the blue shift stabilizing arrangement 222, the second output port 224b of the multiplexer 214 is the main output port of the system 220 (similar to output port 194b in FIG. 20), and the third input/output ports 224c of the multiplexer 224 receive a tapped off portion of laser signals concurrently appearing at the input/output ports 223r of the power splitters 223a–223n to generate a multiplexed signal by the multiplexer 224 that is blue shifted with relation to the multiplexed output signal at the main second output port 224b. The spectral responses shown in FIG. 20 of the Forward Filter spectral response $F_o^j(w)$ (shown by curves 200a–200n), the feedback multiplexer spectral response $f_2^j(w)$ (shown by curves 201a–201n), and the feedback filter spectral response $F_f^j(w) = f_2^j(2) \cdot f_2^j(w)$ (shown by curves 202a–202n) also apply to corresponding spectral responses obtained in the system 220.

In operation, the main output signal for, for example, the jth laser source 211j (not shown) is propagating a single trip from the laser source 221j through the power splitter 223j (not shown), and the forward and feedback multiplexer 224 where it is multiplexed with the other output signals from the laser sources 221a–221n, and a multiplexed output signal is provided to the main output port 224b of the forward and feedback multiplexer 224 via optical paths A→B→C. Concurrently, the output signal from laser source 211j is routed through the jth power splitter 223j to the third input/output port 224c of forward and feedback multiplexer 214 where it is multiplexed with the other output signals from the laser sources 221a–221n and power splitters 223a–223n and provided to the fourth input/output port 224d of the forward and feedback multiplexer 224 and transmitted to reflector 226 and fed back to the laser source 221j via optical paths A→D→E→D→A.

The feedback signal at the front facet 221p of the each of the laser sources 221a–221n comprises one component. The components in the optical path of the feedback signal for, for example, the jth laser source 221j comprise the laser source 221j, the power splitter 223j, the forward and feedback multiplexer 224, $f_2^j(w)$, via its ports 224c and 224d, the reflector 226, the forward and feedback multiplexer 224, $f_2^j(w)$, via its ports 224d and 224c, the power splitter 224j, and back to the front facet 221p of the laser source 221j. The stabilized output signal found in optical path C is filtered only once by the forward and feedback multiplexer 224 and, therefore, the forward filter spectral response for the jth port 224a (not shown) is $F_o^j(w)=f_1^j(w)$. The feedback signal, however, is passed twice through the forward and feedback multiplexer 224 and, therefore, the feedback spectral response for the jth port 224c (not shown) is $F_f^j(w)=f_2^j(w) \cdot f_2^j(w)$. The forward and feedback multiplexer 224 must be designed such that the forward filter spectral response $F_o^j(w)$ and the feedback spectral response $F_f^j(w)$ provide the desired center wavelengths 204a and 205a shown in FIG. 20, bandwidths of the forward and feedback spectral responses, and wavelength shift (δw) between the forward and the feedback spectral responses. The forward and feedback multiplexer 224 is also designed such that it provides both functions of forward and feedback multiplexing for all input ports 224a and 224c. This implementation merges the separate functions the individual forward multiplexer 194, and the feedback multiplexer 195 in the blue shift stabilizing arrangement 192 of FIG. 19 into one component 224 but provide separate paths through the forward and feedback multiplexer 224 for each function.

As described for each of the prior systems of the present invention, the entire optical path in which the feedback signal is propagating must preserve the polarization state (polarization maintaining, PM). This means that all components and interconnects, except the forward multiplexing portion of the forward and feedback multiplexer, $f_1^j(w)$, 224 and its input/output ports 224a and 224b are maintaining the polarization state of the laser sources 221a–221n. Still further, one or multiple optional delay lines (not shown) can be added between any two components in the feedback optical signal path of A→D→E→D→A when an incoherent feedback signal is required for the laser sources 221a–221n.

Figure 23:
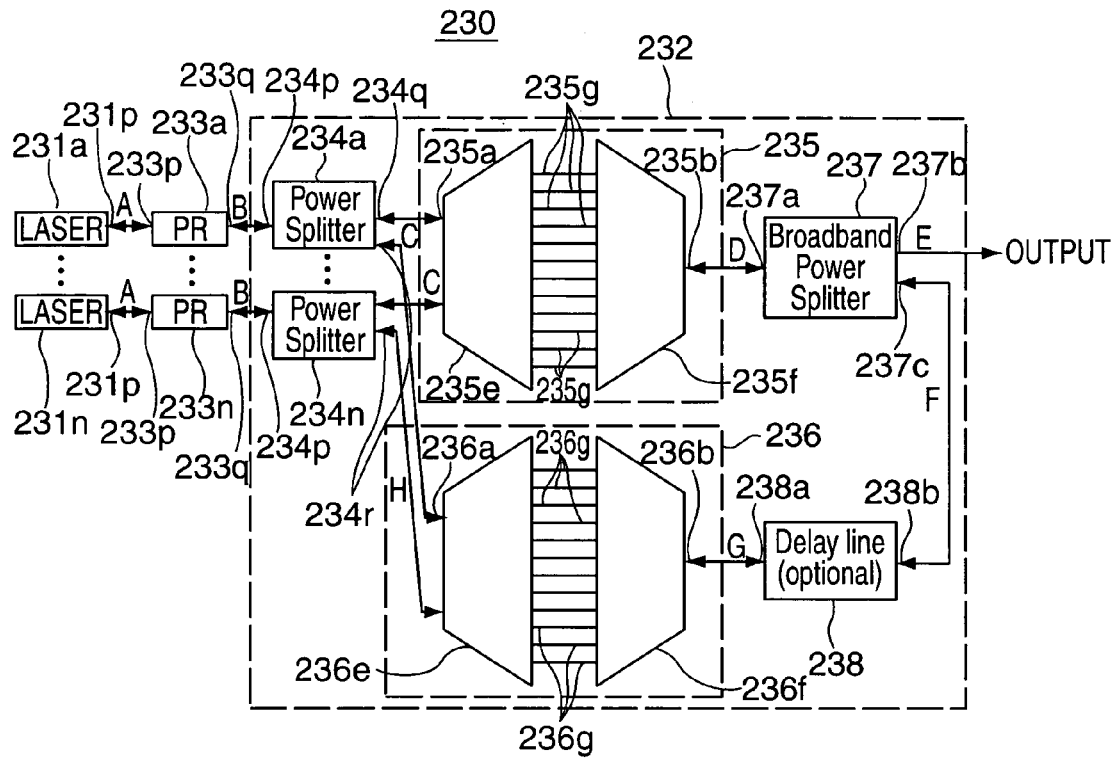
FIG. 23 shows a schematic diagram of a system illustrating a blue shift stabilizing arrangement similar to that shown in FIG. 11 for multiple radiation sources in accordance with a fourth embodiment of the present invention.

Referring now to FIG. 23, there is shown a schematic diagram of a high-efficiency multi-wavelength pump source stabilized laser system 230 illustrating a blue shift feedback stabilizing arrangement 232 (shown within a dashed line rectangle) similar to that shown in FIG. 11 for a plurality of n radiation sources (LASER) 231a–231n with a plurality of n optional polarization rotators (PR) 233a–233n in accordance with a fourth embodiment of the present invention. The blue shift feedback stabilizing arrangement 232 comprises a plurality of n power splitters 234a–234n (of which only power splitters 234a and 234n are shown), a first Arrayed Waveguide Grating (AWG) multiplexer 235, a second AWG multiplexer 236, a broadband power splitter 237, and an optional delay line 238. Each of the laser sources 231a–231n is coupled from a front facet (output port) 231p thereof via an optical path A to a first input/output port 233p of a separate corresponding one of the plurality of n optional polarization rotators 233a–233n. A second input/output port 233q of each of the polarization rotators 233a–233n is coupled to a first input/output port 234p of a separate corresponding one of the plurality of n power splitters 234a–234n via an optical path B. A second input/output port 234q of each of the power splitters 234a–234n is coupled to a separate corresponding one of a plurality of n first input/output ports 235a of the first AWG multiplexer 235 via an optical path C. A second input/output port 235b of the first AWG multiplexer 235 is coupled to a first input/output port 237a of the broadband power splitter 237 via an optical path D. A second output port of the broadband power splitter 237 provides an output signal from the system 230 via an optical path E to any remote downstream device (not shown). A third input/output port 234r of each of the plurality of n power splitters 234a–234n is coupled to a separate corresponding one of a plurality of n first input/output ports 236a of the second AWG multiplexer 236 via a separate optical path H. A second input/output port 236b of the second AWG multiplexer 236 is coupled to a first input/output port 238a of the optional delay line 238 via an optical path G. A second input/output port 238b of the optional delay line 238 is coupled to a third input/output port 237c of the broadband power splitter 237 via an optical path F.

The optional polarization rotators 233a–233n are included between the laser sources 231a–231n, respectively, and the respective input/outputs 235a and 236a of the first and second AWG multiplexers 235 and 236, respectively, (via power splitters 234a–234n) in case the laser output state of polarization (TE to TM, or vice versa) is to be rotated. Depending on the application and the number of polarization rotators used, the input signals to the first and second AWG multiplexers 235 and 236 may have the same polarization state (all TE or all TM) or different states of polarizations. For some applications such as Raman amplification, the polarization states of the adjacent input/output ports 235a and 236a (in the wavelength domain) of the first and second AWG multiplexers 235 and 236, respectively, must be orthogonal (TE and TM polarizations) to reduce the degree of polarization (DoP) and, therefore, reduce or eliminate the Raman amplification polarization dependent gain (PDG). For such implementation, there are an even number of lasers sources 231a–231n that are grouped in pairs. The system 230 can be designed such that the resulting stabilization wavelengths of each pair of the laser sources 231a–231n with orthogonal polarizations are exactly the same, or there is a slight shift between the two wavelengths.

The Arrayed Waveguide Gratings (AWGs) 235 and 236 can function in one of three modes. In a first mode, the AWGs 235 and 236 can each function as a wavelength multiplexer where all inputs at the associated input/output ports 235a and 236a have the same polarization (TE or TM), and the AWGs 235 and 236 are designed such that all signals are multiplexed in the wavelength domain to the main output port 235b and 236b, respectively. In a second mode, the AWGs 235 and 236 can each function as a multi-wavelength polarization multiplexer where the AWG 235 and 236 combine multiple pairs of laser source signals with orthogonal polarizations, and each pair of laser signals with the orthogonal polarizations is stabilized at the same wavelength. In a third mode, the AWGs 235 and 236 can each function as a polarization and wavelength multiplexer where each of the AWG 235 and 236 multiplexes signals with different wavelength and polarizations and routes the multiplexed signal to the main output port 235b and 236b, and each signal pair with orthogonal polarizations may have different wavelengths. The first AWG 235 comprises a first Free Propagating Region (FPR) 235e, a second FPR 235f, and a plurality of waveguides 235g interconnecting the first and second FPRs 235e and 235f as is well know in the art. The second AWG 236 similarly comprises a first Free Propagating Region (FPR) 236e, a second FPR 236f, and a plurality of waveguides 236g interconnecting the first and second FPRs 236e and 236f as is well know in the art. Although AWG multiplexers 235 and 236 are shown and described for use in the feedback stabilizing arrangement 232, an Eschelle grating can replace each of the AWG multiplexers 235 and 236 and provide the same function.

In operation, the optical signal from, for example, the laser source 231j (not shown) goes through an optional polarization rotator 233j (not shown) to rotate the received signal state of polarization. In the power splitter 234j (not shown), a major first portion of the received optical signal from the polarization rotator 233j is tapped and transmitted from its input/output port 234q to its associated input/output port 235a of the first AWG multiplexer 235, while a remaining second portion of the received optical signal is concurrently transmitted via its input/output port 234r to its associated input/output port 236a of the second AWG multiplexer 236. In the AWG multiplexer 235, the input signals concurrently received at each of the plurality of n input/output ports 235a are filtered and multiplexed and a resultant multiplexed output signal is provided at input/output port 235b and is sent via optical path D to the input/output port 237a of the broadband power splitter 237. In the broadband power splitter 237, a first major portion of the received multiplexed signal is tapped off and routed to its input/output port 237b to provide an output signal of the system 230, and the second remaining portion is routed to its input/output port 237c and to the second input/output port 238b of the optional delay line 238. When the delay is used, the received multiplexed signal portion is delayed by a predetermined amount and routed via optical path G to the input/output port 236b of the second AWG multiplexer 236. In the AWG multiplexer 236, the received delayed multiplexed signal is filtered, demultiplexed, and routed by input/output ports 236a and via optical paths H to their corresponding input/output ports 234r of the plurality of n power splitter 234a–234n. Each filtered and demultiplexed signal is routed by the associated one of the power splitter 234a–234n to its input/output port 234p and back through the associated one of the optional polarization rotators 233a–233n to the associated one of the laser sources 231a–231n.

The filter spectral response between the input/output ports 235a and 235b of the first multiplexer 235 is $F_o^1 = f_1^j(w)$, and the first AWG multiplexer 235 is designed such that the spectral response $f_1^j(w)$ provides the desired center wavelength and bandwidth for a jth input/output port 235a (not shown). The filter spectral response of the second AWG multiplexer 236 between the input/output ports 236a and 236b for the jth port of the AWG multiplexer 236 is $f_2^j(w)$, and corresponds to each of the dashed line spectral response curves 121a–121n shown in FIG. 12 for the n input/output ports 236a of the second AWG multiplexer 236. The first and second AWG multiplexers 235 and 236 are designed such that a center wavelength of the feedback transmission filter, $f_2^j(w)$, for the jth port is slightly shifted towards a shorter wavelength in relation to a center wavelength of the forward transmission filter, $f_1^j(w)$, of the first AWG multiplexer 235 for input/output port j. The wavelength shift (blue shift) between the filters $f_1^j(w)$ and $f_2^j(w)$, and their respective bandwidth, can be controlled by the design of the AWG multiplexers 235 and 236. Since the feedback signal is filtered by both filters $f_1^j(w)$ and $f_2^j(w)$, the result is a total feedback spectral response of $F_f^j(w) = f_1^j(w) \cdot f_2^j(w)$ for the jth port and is shown by the dashed and dotted spectral response curves 122a–122n in FIG. 12. The forward filter spectral response for a jth port 235a is $F_o^j(w) = f_1^j(w)$ since the main output signal from the laser source 231j to the output port 237b of the broadband power splitter 237 only passes once through the first AWG multiplexer 235, $f_1^j(w)$, and corresponds to the solid spectral response curves 120a–120n shown in FIG. 12.

The feedback signal at the front facet 231p of each of the lasers 231a–231n comprises two in-phase components with equal amplitudes. One component travels through the associated one of the polarization rotators 233a–233n, the power splitters 234a–234n, the first AWG multiplexer 235, the broadband power splitter 237, the optional delay line 238, the second AWG multiplexer 236, and the associated one of the power splitter 234a–234n and the polarization rotators 233a–233n via the optical path A→B→C→D→F→G→H→B→A. The other component travels through the associated one of the polarization rotators 233a–233n and power splitters 234a–234n, the second AWG multiplexer 236, the optional delay 238, the broadband power splitter 237, the first AWG multiplexer 235, and the associated one of the power splitters 234a–234n and polarization rotators 233a–233n via optical path A→B→H→G→F→D→C→B→A. One or more optional delay lines (not shown), other than the optional delay line 237, can be added between any two components on the feedback optical path of A→B→C→D→F→G→H→B→A.

Figure 24:
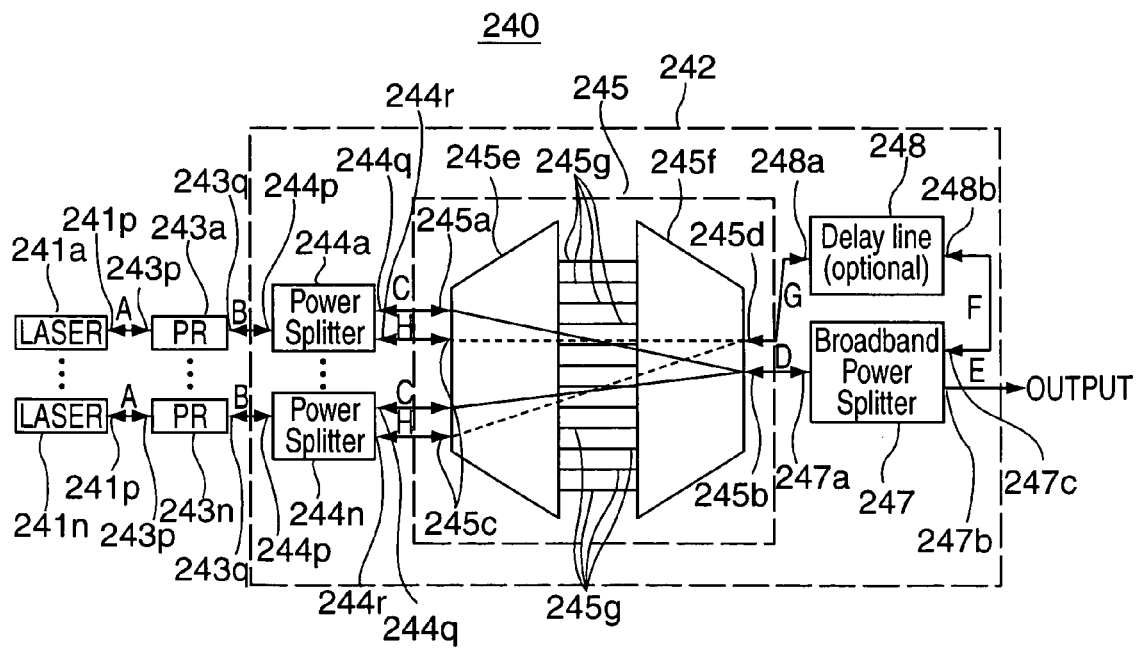
FIG. 24 shows a schematic diagram of a system similar to the system shown in FIG. 14 for multiple laser sources in accordance with the fourth embodiment of the present invention.

Referring now to FIG. 24, there is shown a schematic diagram of a stabilized laser system 240 illustrating a blue shift feedback stabilizing arrangement 242 (shown within a dashed line rectangle) comparable to the blue shift feedback stabilizing arrangement 232 shown in FIG. 23 for a plurality of n laser sources (LASER) 241a–241n with a plurality of n optional polarization rotators (PR) 243a–243n in accordance with the fourth embodiment of the present invention. The blue shift feedback stabilizing arrangement 242 comprises a plurality of n power splitters 244a–244n (of which only power splitters 244a and 244n are shown), an Arrayed Waveguide Grating (AWG) multiplexer 245 (shown within a dashed line rectangle), a broadband power splitter 247, and an optional delay line 248. Each of the laser sources 241a–241n is coupled from a front facet (output port) 241p thereof via an optical path A to a first input/output port 243p of a separate corresponding one of the plurality of n optional polarization rotators 243a–243n. A second input/output port 243q of each of the polarization rotators 243a–243n is coupled to a first input/output port 244p of a separate corresponding one of the plurality of n power splitters 244a–244n via an optical path B. A second input/output port 244q of each of the power splitters 244a–244n is coupled to a separate corresponding one of a plurality of n first input/output ports 245a of the AWG multiplexer 245 via an optical path C. A second input/output port 245b of the AWG multiplexer 245 is coupled to a first input/output port 247a of the broadband power splitter 247 via an optical path D. A second output port 247b of the broadband power splitter 247 provides an output signal from the system 240 via an optical path E to any remote downstream device (not shown). A third input/output port 244r of each of the plurality of n power splitters 244a–244n is coupled to a separate corresponding one of a plurality of n third input/output ports 245c of the AWG multiplexer 245 via a separate optical path H. A third input/output port 247c of the broadband power splitter 247 is coupled to a second input/output port 248b of the optional delay line 248, and a first input/output port 248a of the delay line 248 is coupled to a fourth input/output port 245d of the AWG multiplexer 245 via an optical path G. The AWG 245 multiplexer comprises a first Free Propagating Region (FPR) 245e, a second FPR 245f, and a plurality of waveguides 245g interconnecting the first and second FPRs 245e and 245f as is well know in the art.

The optional polarization rotators 243a–243n are included between the laser sources 241a–241n, respectively, and the respective input/outputs 245a of the AWG multiplexer 245 (via power splitters 244a–244n) in case the laser output state of polarization (TE to TM or vice versa) is to be rotated as was described hereinbefore for the polarization rotators 233a–233n of FIG. 23. The main difference between the blue shift feedback stabilizing arrangement 232 of FIG. 23 and the present blue shift feedback stabilizing arrangement 242 is that the first and second AWG multiplexers 235 and 236 of FIG. 23 have been implemented using a single AWG multiplexer 245. All spectral responses and definitions remain the same as described for the components of FIG. 23 and will not be repeated here.

In operation, the optical signal on optical path A from, for example, the laser source 241j (not shown) goes through an optional polarization rotator 243j (not shown) to rotate the received signal state of polarization which optical signal then is coupled into a first input/output port 234p of the associated power splitter 244j via an optical path B. In the power splitter 244j (not shown), a major first portion of the received optical signal from the polarization rotator 243j is tapped and transmitted from its input/output port 243q via an optical path C to its associated input/output port 245a of the AWG multiplexer 245, while a remaining second portion of the received optical signal is concurrently transmitted via its input/output port 244r to its associated input/output port 245c of the AWG multiplexer 245. In the AWG multiplexer 245, the input signals concurrently received at each of the plurality of n input/output ports 235a are filtered and multiplexed, and a routed entirely to its second input/output port 245b. The filter spectral response for the jth port between the input/output ports 245a and 245b is $F_o^j = f_1^j(w)$ which is correspond to what is shown by the curves 120a–120n shown in FIG. 12. The AWG multiplexer 245 is designed such that $f_1^j(w)$ provides the desired wavelength and bandwidth for the jth input/output port 245a. The multiplexed and filtered signal generated at input/output port 245b is sent via optical path D to the input/output port 247a of the broadband power splitter 247. In the broadband power splitter 247, a first major portion of the received multiplexed signal is tapped off and routed to its second output port 247b to provide an output signal of the system 240, and the second remaining portion is routed to its input/output port 247c and to the second input/output port 248b of the optional delay line 248 via optical path F. When the delay line 248 is used, the received multiplexed signal portion is delayed by a predetermined amount and routed via optical path G to the input/output port 245d of the AWG multiplexer 245. In the AWG multiplexer 245, the received delayed multiplexed signal is filtered, demultiplexed, and routed via optical paths H to their corresponding input/output ports 244r of the plurality of n power splitters 244a–244n. Each filtered and demultiplexed signal is routed by the associated one of the power splitter 244a–244n to its input/output port 244p and back through the associated one of the optional polarization rotators 243a–243n to the associated one of the laser sources 241a–241n.

As indicated hereinabove, the filter spectral response between the input/output ports 245a and 245b of the AWG multiplexer 245 is $F_o^1 = f_1^1(w)$. The filter spectral response of the AWG multiplexer 245 for the feedback transmission filter between the input/output ports 245d and 245c for the jth port of the AWG multiplexer 245 is $f_2^j(w)$ corresponds to each of the dashed line spectral response curves 121a–121n shown in FIG. 12 for the n input/output ports 245c of the AWG multiplexer 245. The AWG multiplexers 245 is designed such that a center wavelength of the feedback transmission filter, $f_2^j(w)$, for the jth port is slightly shifted towards the shorter wavelength in relation to the center wavelength of the forward transmission filter, $f_1^j(w)$, for input/output port j. The wavelength shift (blue shift) between the filters $f_1^j(w)$ and $f_2^j(w)$ and their respective bandwidth can be controlled by the design of the AWG 245. Since the feedback signal is filtered by both filters $f_1^j(w)$ and $f_2^j(w)$, the result is a total feedback spectral response of $F_f^j(w)=f_1^j(w) \cdot f_2^j(w)$ for the jth port and is shown by the dashed and dotted spectral response curves 122a–122n in FIG. 12. The forward filter spectral response, as indicated hereinbefore, is $F_o^j(w)=f_1^j(w)$ for the port j since the main output signal from the laser source 241j to the output port 247b of the broadband power splitter 247 only passes through the AWG multiplexer 245, $f_1^j(w)$, once, and corresponds to the solid spectral response curves 120a–120n shown in FIG. 12.

The feedback signal at the front facet 241p of each of the lasers 241a–241n comprises two in-phase components with equal amplitudes. One component travels through the associated one of the polarization rotators 243a–243n and the power splitters 244a–244n, the AWG multiplexer 245, the broadband power splitter 247, the optional delay line 248, the AWG multiplexer 245, and the associated one of the power splitters 244a–244n and the polarization rotators 243a–243n via the optical path A→B→C→D→F→G→H→B→A. The other component travels through the associated one of the polarization rotators 243a–243n and power splitters, 244a–244n, the AWG multiplexer 245, the optional delay 248, the broadband power splitter 247, the AWG multiplexer 245, and the associated one of the power splitters 244a–244n and polarization rotators 243a–243n via optical path A→B→H→G→F→D→C→B→A. One or more optional delay lines (not shown), other than the optional delay line 247, can be added between any two components on the feedback optical path A→B→C→D→F→G→H→B→A. As described for each of the prior systems of the present invention, the entire optical path in which the feedback signal is propagating must preserve the polarization state (polarization maintaining, PM). This means that only the output port 247b after the broadband power splitter 247 may not be polarization maintaining.

Figure 25:
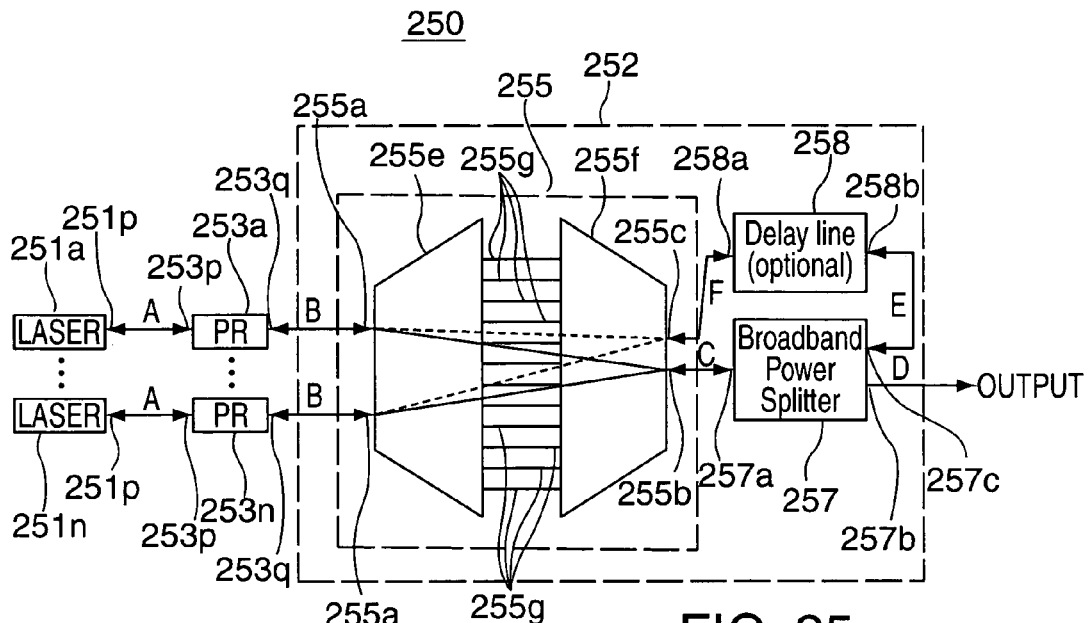
FIG. 25 shows a schematic diagram of a system for multiple laser sources similar to the system shown in FIG. 13 in accordance with the fourth embodiment of the present invention.

Referring now to FIG. 25, there is shown a schematic diagram of a stabilized laser system 250 for a plurality of n laser sources (LASER) 251a–251n (of which only laser sources 251a and 251n are shown) similar to the system 130 shown in FIG. 13 in accordance with the fourth embodiment of the present invention. The system 250 comprises the laser sources 251a–251n, a plurality of n polarization rotators (PR) 253a–253n (of which only PR 253a and 253n are shown), and a blue shift feedback stabilizing arrangement 252 (shown within a dashed line rectangle). The blue shift feedback stabilizing arrangement 252 comprises an Arrayed Waveguide Grating (AWG) multiplexer 255 (shown within a dashed line rectangle), a broadband power splitter 257, and an optional delay line 258. Each of the laser sources 251a–251n is coupled from a front facet (output port) 251p thereof via an optical path A to an input/output port 253p of a separate corresponding one of the plurality of n optional polarization rotators 253a–253n. A second input/output port 253q of each of the polarization rotators 253a–253n is coupled to a separate corresponding one of a plurality of n first input/output ports 255a of the AWG multiplexer 255 via an optical path B. A second input/output port 255b of the AWG multiplexer 255 is coupled to a first input/output port 257a of the broadband power splitter 257 via an optical path C, while a second output port 257b of the broadband power splitter 257 provides an output signal from the system 250 via an optical path D to any remote downstream device (not shown). A third input/output port 257c of the broadband power splitter 257 is coupled to a second input/output port 258b of the optional delay line 258, and a first input/output port 258a of the delay line 258 is coupled to a third input/output port 255c of the AWG multiplexer 255. The AWG 255 multiplexer comprises a first Free Propagating Region (FPR) 255e, a second FPR 255f, and a plurality of waveguides 255g interconnecting the first and second FPRs 255e and 255f as is well know in the art.

The main difference between the blue shift feedback stabilizing arrangement 242 shown in FIG. 24 and the present blue shift feedback stabilizing arrangement 252 is that the plurality of n power splitters 244a–244n in FIG. 24 are not used in the present blue shift feedback stabilizing arrangement 252. Therefore, the AWG multiplexer 255 is designed to provide both of the power splitting and multiplexing functions, and the feedback paths through each of the AWG multiplexer 245 of FIG. 24 and the present AWG multiplexer 255 are different because of the elimination of the power splitters 244a–244n. In the AWG multiplexer 255, a first optical path is directed between the input/output ports 255a and 255b, and a second optical path is directed between the input/output ports 255c and 255a. Therefore, the functioning of the laser sources 251a–251n, the polarization rotators 253a–253n, the AWG multiplexer 255, the broadband power splitter 257, and the optional delay line 258 are essentially the same as that described for the laser sources 241a–241n, the polarization rotators 243a–243n, the AWG multiplexer 245, the broadband power splitter 247, and the optional delay line 248 shown in FIG. 24 except for the revised feedback path between the input/output ports 255c and 255a in the AWG multiplexer 255. This revised feedback path between the input/output ports 255c and 255a in the AWG multiplexer 255 and that shown for the AWG multiplexer 245 of FIG. 24 is achieved by a slight design change in the AWG multiplexer 255. Still further, the spectral responses found in the blue shift feedback stabilizing arrangement 252 are the same as those obtained in the blue shift feedback stabilizing arrangement 242 of FIG. 24 and are shown by the curves 120a–120n, 121a–121n, and 122a–122n in FIG. 12. Additionally, the entire optical path A→B→C→E→F→B→A in which the feedback signal is propagating must preserve the polarization state (polarization maintaining, PM). This means that only the output port 257b after the broadband power splitter 257 may not be polarization maintaining.

Figure 26:
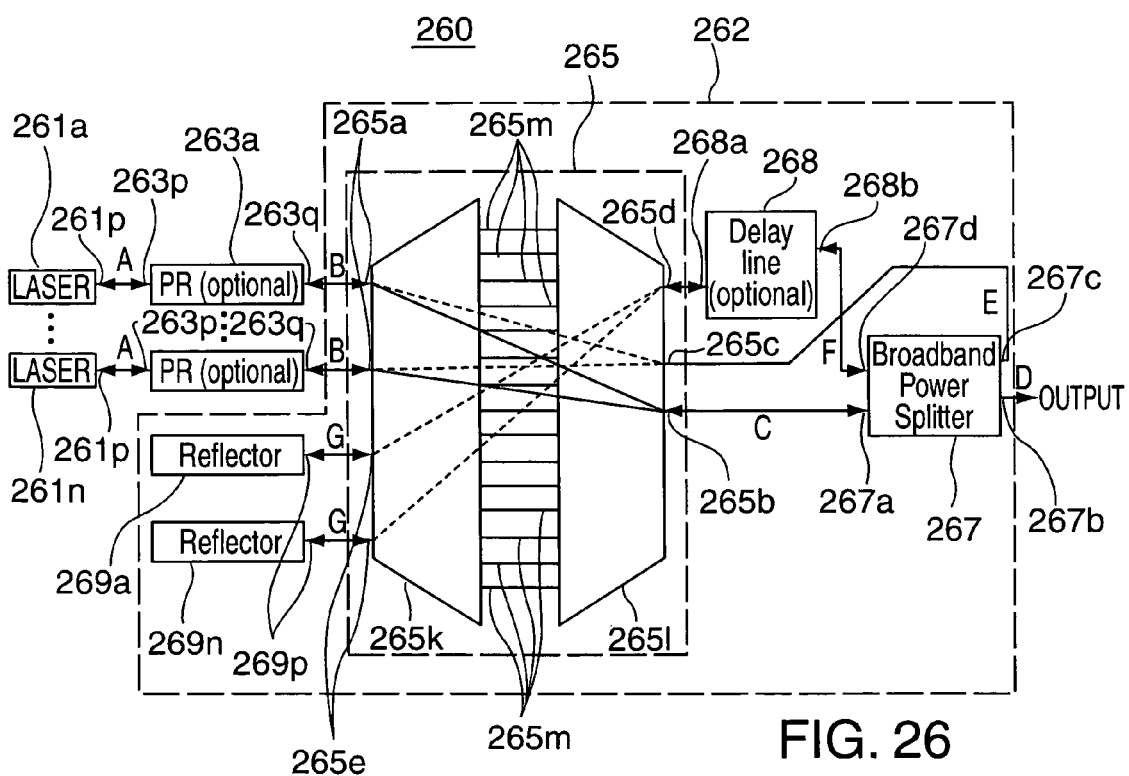
FIG. 26 shows a schematic diagram of a system for multiple laser sources similar to the system shown in FIG. 13 in accordance with the fourth embodiment of the present invention.

Referring now to FIG. 26, there is shown a schematic diagram of a stabilized laser system 260 for a plurality of laser sources (LASER) 261a–261n (of which only laser sources 261a and 261n are shown) in accordance with the fourth embodiment of the present invention. The system 260 comprises the laser sources 261a–261n, of which only 261a and 261n are shown, a plurality of n polarization rotators (PR) 263a–263n of which only PRs 263a and 263n are shown), and a blue shift feedback stabilizing arrangement 262 (shown within a dashed line area). The blue shift feedback stabilizing arrangement 262 comprises an Arrayed Waveguide Grating (AWG) multiplexer 265, a broadband power splitter 267, an optional delay line 268, and a plurality of n reflectors 269a–269n of which only 269a and 269n are shown. Each of the laser sources 261a–261n is coupled from a front facet (output port) 261p thereof via optical path A to an input/output port 263p of a separate corresponding one of the plurality of n optional polarization rotators 263a–263n. A second input/output port 263q of each of the polarization rotators 263a–263n is coupled to a separate corresponding one of a plurality of n first input/output ports 265a of the AWG multiplexer 265 via an optical path B. A second input/output port 265b of the AWG multiplexer 265 is coupled to a first input/output port 267a of the broadband power splitter 267 via an optical path C. A second output port 267b of the broadband power splitter 267 provides an output signal from the system 260 via an optical path D to any remote downstream device (not shown). A third input/output port 267c of the broadband power splitter 267 is coupled to a third input/output port 265c of the AWG multiplexer 265. A fourth input/output port 267d of the broadband power splitter 267 is coupled to a second input/output port 268b of the optional delay line 268, and a first input/output port 268a of the delay line 268 is coupled to a fourth input/output port 265d of the AWG multiplexer 265. Each of a plurality of n fifth input/output ports 265e of the AWG multiplexer 265 is coupled to an input/output ports 269p of a separate corresponding one of the plurality of n reflectors 269a–269n via an optical path G. The AWG 265 multiplexer comprises a first Free Propagating Region (FPR) 265k, a second FPR 265f, and a plurality of waveguides 265m interconnecting the first and second FPRs 265k and 265i as is well know in the art.

The main difference between the blue shift feedback stabilizing arrangement 262 and the blue shift feedback stabilizing arrangement 252 of FIG. 25 is that the optional delay line 268 has been removed from the optical path E and has been place in a new separate feedback path F coupling a fourth input/output port 267d of the broadband power splitter 267 and a fourth input/output port 265d of the AWG multiplexer 265, and a plurality of n reflectors 269a–269n have been added which are coupled to a new plurality of fifth input/output ports 265e of the AWG multiplexer 265.

In operation, the output signals from the laser sources 261a–261n, after optional polarization rotation in polarization rotators 263a–263n, are received via optical paths A and B at the plurality of n input/output ports 265a of the AWG multiplexer 265 wherein the received signals are filtered and multiplexed and provided at both the input/output port 265b for transmission to the first input/output port 267a of the broadband power splitter 267 via optical path C, and at a second input/output port 265c for transmission to the third input/output port 267c of the broadband power splitter 267 via optical path E. A main portion of the multiplexed signal is routed via the output port 267b onto optical path D for downstream transmission as the output signal from the system 260. A smaller portion of the received multiplexed signal is routed via input/output port 267c of the broadband power splitter 267 to the input/output port 265c of the AWG multiplexer 265 via optical path E, where the received signal is filtered and demultiplexed in the AWG multiplexer 265 and transmitted back to the laser sources 261a–261n via the polarization rotators 263a–263n and optical paths B and A.

The AWG multiplexer 265 is designed such that the Forward spectral response between the jth input/output ports 265a (not shown) and 265b, $f_1^j(w)$, and provides a desired center wavelength and bandwidth as is shown in the solid curves 46a–46n in FIG. 6. The filter spectral response between input/output ports 265c and 265a is represented by $f_2^j(w)$, and the AWG multiplexer 265 is designed such that the center wavelength of $f_2^j(w)$ is slightly shifted toward a shorter wavelength with relationship to the center wavelength of $f_1^j(w)$. The multiplexed output signal at input/output tap 265c is routed to the input/output port 267c of the broadband power splitter 267 whose function is to divide and route the received multiplexed signal to its two input/output ports 267a and 267d. The signal at input/output port 267a is routed via optical path C to the input/output ports 265b of the AWG multiplexer 265 and is one of the two feedback signal components in the manner described hereinbefore for the other component for the feedback stabilizing arrangement 252 of FIG. 25. The signal appearing at input/output port 267d of the power splitter 267 is delayed by the optional delay line 268 and routed via optical path F to the input/output port 265d of the AWG multiplexer 265 to be filtered and demultiplexed at routed via input output ports 265e to the plurality of n reflectors 269a–269n via optical path G. The spectral response between input/output ports 265d and ports 265e of the AWG multiplexer 265 is represented by $f_4^1(w)$. The AWG multiplexer is designed such that it can function as a demultiplexer for input/output port 265d such that the demultiplexed signals are routed to different input/output ports 265e than used for the input/output ports 265a for the laser sources 261a–261n. Each of the demultiplexed signal is reflected by the associated one of the reflectors 269a–269n and travels the same optical path G→F→E→B→A in an opposite direction back to the laser sources 261a–262n.

While propagating back through the power splitter 267, a portion of the signal at input/output port 267d is routed to the output port 267b adding an additional component to the output signal on optical path D. Therefore, the optical path for the additional component of the feedback signal is the output from the laser sources 261a–261n, the polarization rotators 263a–263n, the AWG multiplexer 265 to input/output port 265c, $f_2^1(w)$, the broadband power splitter 267, the optional delay line 268, the AWG multiplexer 265 input/output port 265e as a demultiplexer, $f_4^1(w)$, the reflectors 269a–269n, back through the AWG multiplexer 265, $f_4^1(w)$, the delay line 268, the power splitter 267, the polarization rotators 263a–263n, and back to the lasers 261a–261n via optical path A→B→E→F→G→F→E→B→A. The additional component of the output signal at output port 267b of the power splitter 267 goes through a filter with a spectral response $f_2^1(w) \cdot f_4^1(w) \cdot f_4^1(w)$. The additional component of the feedback signal to the laser sources 261a–261n goes through a filter with a spectral response $f_2^1(w) \cdot f_2^1(w) \cdot f_4^1(w) \cdot f_4^1(w)$. As described for each of the prior systems of the present invention, the entire optical path in which the feedback signal is propagating must preserve the polarization state (polarization maintaining, PM). This means that only the output port 267b of the broadband power splitter 267 may not be made to be polarization maintaining.

Figure 27:
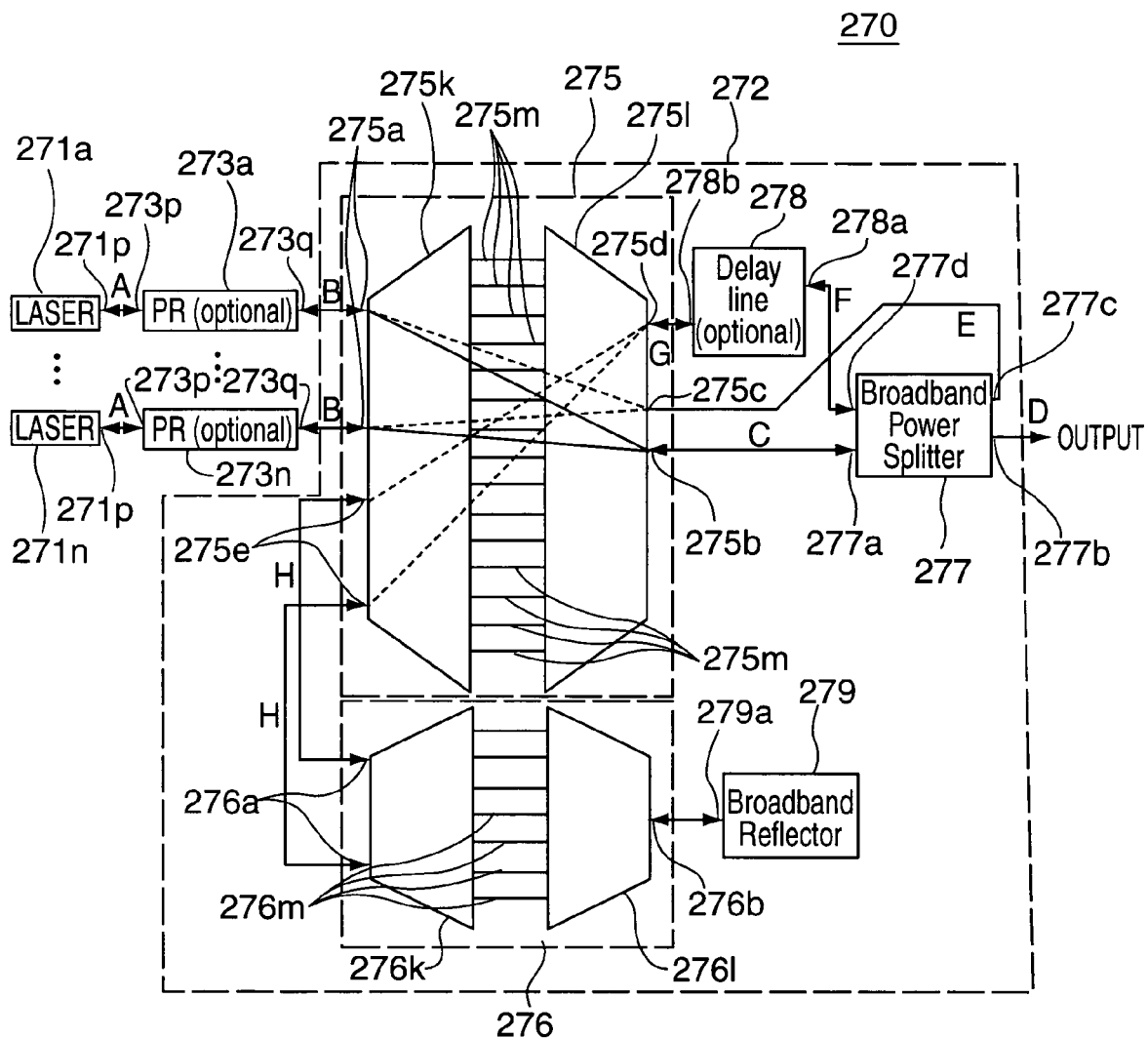
FIG. 27 shows a schematic diagram of a system for multiple laser sources in accordance with the fourth embodiment of the present invention.

Referring now to FIG. 27, there is shown a schematic diagram of a stabilized laser system 270 for a plurality of n laser sources (LASER) 271a–271n (of which only laser sources 271a and 271n are shown) in accordance with the fourth embodiment of the present invention. The system 270 comprises the plurality of n laser sources 271a–271n, a plurality of n optional polarization rotators 273a–273n (of which only polarization rotators 273a and 273n are shown), and a blue shift feedback stabilizing arrangement 272 (shown within a dashed line area). The blue shift stabilizing arrangement 270 comprises a first AWG multiplexer 275 (shown within a dashed line rectangle), a second AWG multiplexer 276 (shown within a dashed line rectangle), a broadband power splitter 277, an optional delay line 278, and a broadband reflector 279. Each of the plurality of n laser sources 271a–271n are coupled at a front facet 271p thereof to a first input/output port 273p of a separate corresponding one of the polarization rotators 273a–273n via an optical path A. A second input/output port 273q of each of the polarization rotators 273a–273n is coupled to an separate corresponding one of an input/output port 273a of the first AWG multiplexer 275 via an optical path B. A second input/output port 275b of the first AWG multiplexer 275 is coupled to a first input/output port 277a of the broadband power splitter 277 via an optical path C, while a second output port 277b of the broadband power splitter 277 provides an output signal from the system 270 via an optical path D to any remote downstream device (not shown). A third input/output port 277c of the broadband power splitter 277 is coupled to a third input/output port 275c of the first AWG multiplexer 275. A fourth input/output port 277d of the broadband power splitter 277 is coupled to a first input/output port 278a of the optional delay line 278, and a second input/output port 278b of the delay line 278 is coupled to a fourth input/output port 275d of the first AWG multiplexer 275. Each of a plurality of n fifth input/output ports 275e of the first AWG multiplexer 275 is coupled to a corresponding one of a plurality of n input/output ports 276a of the second AWG multiplexer 276 via optical paths H. A second input/output port 276b of the second AWG multiplexer 276 is coupled to an input/output of the broadband reflector 279. The first and second AWG multiplexer 275 and 276 comprises a first Free Propagating Region (FPR) 275k and 276k, respectively, a second respective FPR 275l and 276l, and a plurality of waveguides 275m and 276m, respectively, interconnecting the respective first and second FPRs 275k and 275l, and 276k and 276l, as is well know in the art.

The implementation of the system 270 performs the same function as the system 260 of FIG. 26 except that the plurality of n reflectors 269a–269n of FIG. 26 have been replaced by a single broadband reflector 279, and the demultiplexed signals obtained at input/output ports 265e of the AWG multiplexer 265 of FIG. 26 that are transmitted to the plurality of n reflectors 269a–269n in FIG. 26 are now multiplexed in the second AWG multiplexer 276 for transmission to the single broadband reflector 279. The system 270 operates in a same manner as was described for the system 260 of FIG. 26. More particularly, the first AWG multiplexer 275 is designed such that the spectral response between input/output ports 275a and 275b is $f_1^1(w)$, and that for the jth 265a port (not shown) the spectral response is equal to $f_1^j(w)$ and provides a desired center wavelength and bandwidth. The filter spectral response between input/output ports 275c and 275a is represented by $f_2^j(w)$, and the AWG multiplexer 275 is designed such that the center wavelength of $f_2^j(w)$ is slightly shifted toward a shorter wavelength with relation to the center wavelength of $f_1^j(w)$. Still further, the spectral response between input/output ports 275d and ports 275e of the AWG multiplexer 275 is represented by $f_4^1(w)$. As was shown in for the feedback stabilizing arrangement 265 of FIG. 26, the additional component of the output signal at output port 277b of the power splitter 277 goes through a filter with a spectral response of $f_2^1(w) \cdot f_4^1(w) \cdot f_4^1(w)$. The additional component of the feedback signal to the laser sources 271a–271n goes through a filter with spectral response of $f_2^1(w) \cdot f_2^1(w) \cdot f_4^1(w) \cdot f_4^1(w)$. As was described for each of the prior systems of the present invention, the entire optical path in which the feedback signal is propagating must preserve the polarization state (polarization maintaining, PM). This means that only the output port 277b of the broadband power splitter 277 may not be polarization maintaining.

Figure 28:
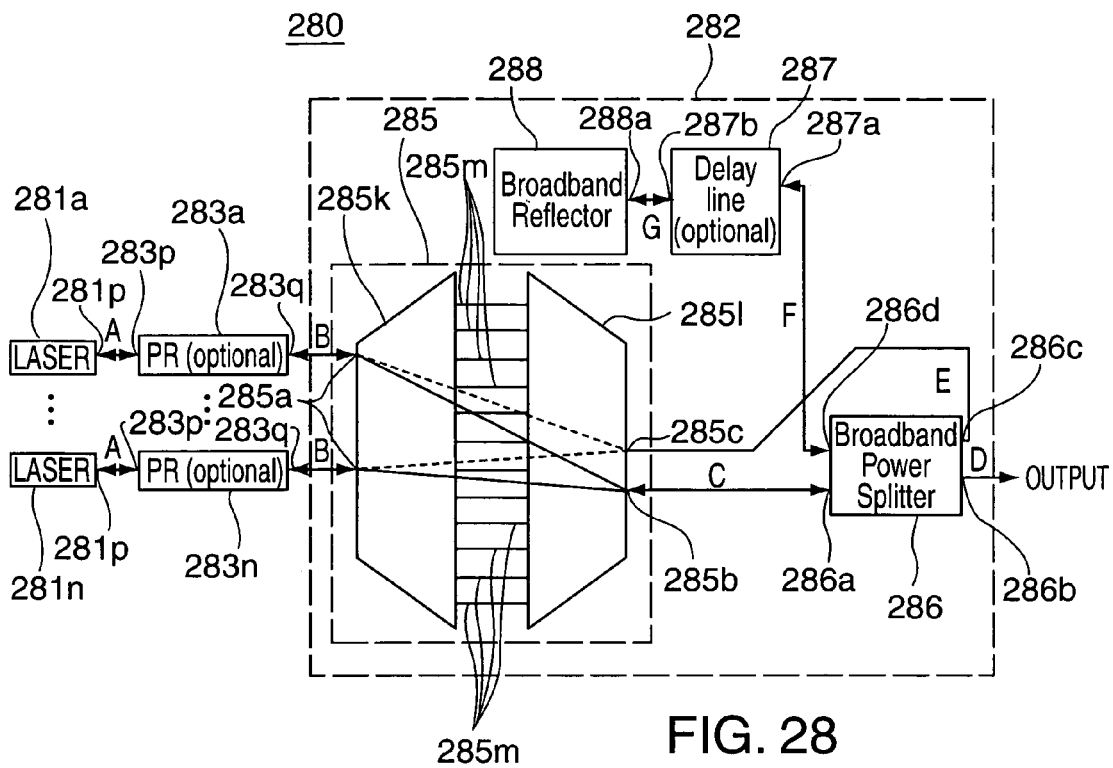
FIG. 28 shows a schematic diagram of a system for multiple laser sources in accordance with the fourth embodiment of the present invention.

Referring now to FIG. 28, there is shown a schematic diagram of a stabilized laser system 280 for a plurality of n laser sources (LASER) 281a–281n (of which only laser sources 281a and 281n are shown) in accordance with the fourth embodiment of the present invention. The system 280 comprises the plurality of n laser sources 281a–281n, a plurality of n optional polarization rotators (PR) 283a–283n (of which only PR 283a and 283n are shown), and a blue shift feedback stabilizing arrangement 282 (shown within a dashed line rectangle). The feedback stabilizing arrangement 282 comprises an AWG multiplexer 285, a broadband power splitter 286, an optional delay line 287, and a broadband reflector 288. Each of the plurality of n laser sources 281a–281n is coupled at a front facet 281p thereof to a first input/output port 283p of a separate corresponding one of the plurality of n polarization rotators 283a–283n via an optical path A. A second input/output port 283q of each of the plurality of n polarization rotators 283a–283n is coupled via and optical path B to a separate corresponding one of a plurality of n input/output ports 285a of the AWG multiplexer 285. A second input/output port 285b of the AWG multiplexer 285 is coupled to a first input/output port 286a of the broadband power splitter 286 via an optical path C. A second output port 286b of the broadband power splitter 286 provides an output signal from the system 280 via an optical path D to any remote downstream device (not shown). A third input/output port 286c of the broadband power splitter 286 is coupled to a third input/output port 285c of the AWG multiplexer 285 via an optical path E. A fourth input/output port 286d of the broadband power splitter 286 is coupled to a first input/output port 287a of the optional delay line 287, and a second input/output port 287b of the delay line 287 is coupled to an input/output port 288a of the broadband reflector 288 via an optical path F. Basically the system 280 is a simplified configuration of the system 260 and 270 shown in FIGS. 26 and 27, respectively, due to the removal of the feedback multiplexing path G in the AWG multiplexer 265 of FIG. 26, and the second multiplexer 276 and the feedback path H to G in the first AWG multiplexer 275 in FIG. 27.

Effectively, the system 280 provides the same functioning as that found in the systems 260 and 270 of FIGS. 26 and 27, respectively. For example, since the signal being fed back to the laser sources 281a–281n from the broadband reflector 288 only pass once through the AWG multiplexer 285 $f_2^j(w)$ via optical paths A→B→E→F→G→F before adding a component to the output signal at output port 286b of the broadband power splitter 286, the additional component of the output signal goes through a filter with a spectral response of $f_2(w)$. The component of the feedback signal goes through a filter with a spectral response of $f_2^j(w) \cdot f_2^j(w)$ since the feedback signal passes twice through the AWG multiplexer 285. The forward filter spectral response, $F_o^j(w)$, and the feedback filter spectral response, $F_f^j(w)$, obtained in the system 280 is the same as those shown by the curves 46a–46n and 47a–47n, respectively, in FIG. 6.

Figure 29:
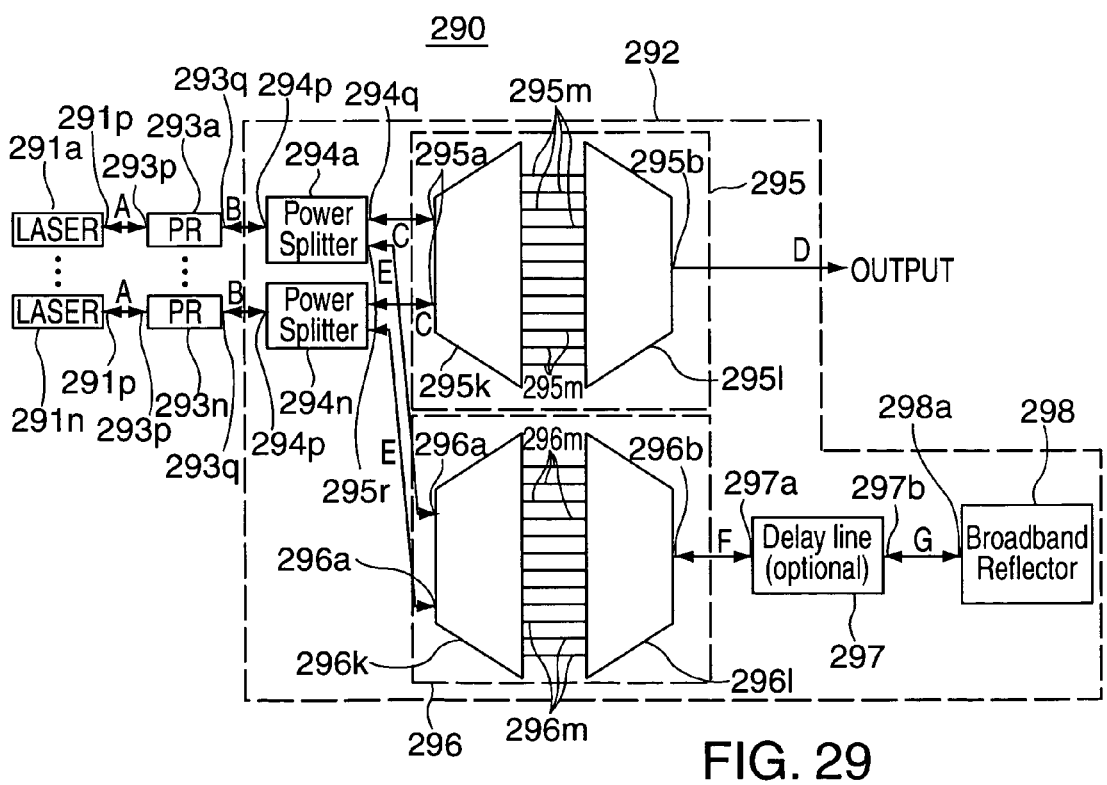
FIG. 29 shows a schematic diagram of a system for multiple laser sources in accordance with the fourth embodiment of the present invention.

Referring now to FIG. 29, there is shown a schematic diagram of a stabilized laser system 290 for a plurality of n laser sources (LASER) 291a–291n (of which only laser sources 291a and 291n are shown) in accordance with the fourth embodiment of the present invention. The system 290 comprises the plurality of n laser sources 291a–291n, a plurality of n optional polarization rotators (PR) 283a–283n (of which only PR 291a and 291n are shown), and a blue shift feedback stabilizing arrangement 292 (shown within a dashed line area). The blue shift feedback stabilizing arrangement 292 comprises a plurality of n power splitters 294a–294n (of which only power splitters 294a and 294n are shown), a first Arrayed Waveguide Grating (AWG) multiplexer 295 (shown within a dashed line rectangle), a second AWG multiplexer 296 (shown within a dashed line rectangle), an optional delay line 297, and a broadband reflector 298. The configuration of the system 290 is similar to the configuration of the system 190 shown in FIG. 19 except that polarization rotators 293a–293n and the optional delay line 297 have been added, and the first and second AWG multiplexers 295 and 296 replace the forward multiplexer 194 and feedback multiplexer 195, respectively. A front facet 291p of each of the plurality of n laser sources 291a–291n is coupled to a first input/output port 293p of a separate corresponding one of the polarization rotators 293a–293n via an optical path A. A second input/output port 293q of each of the polarization rotators 293a–293n is coupled to an first input/output port 294p of a separate corresponding one of the power splitters 294a–294n via an optical path B. A second input/output port 294q of each of the power splitters 294a–294n is coupled to a separate corresponding first input port 295a of the first AWG multiplexer 295 via an optical path C, while a third input/output port 294r of each of the power splitters 294a–294n is coupled to a separate corresponding one of a plurality of n first input ports 296a of the second AWG multiplexer 296 via an optical path E. A second output of the first AWG multiplexer 295 provides an output signal from the system 290 via an optical path D to any remote downstream device (not shown). A second input/output port 296b of the second AWG multiplexer 296 is coupled to a first input/output port 297a of the optional delay line 297 via an optical path F. A second input/output port 297b of the optional delay line 297 is coupled to an input/output port 298a of the broadband reflector 298 via an optical path G.

The functioning of the polarization rotators 293a–293n corresponds to that described hereinbefore for, for example, the polarization rotators 243a–243n of FIG. 24. Still further, the functioning of the system 290 is the same as that described for the feedback stabilization system 190 of FIG. 19 where the first and second AWG multiplexers 295 and 296 provide the functions of the optical paths between ports 194a to 194b, and ports 195a and 195b, respectively, in the forward and feedback multiplexer 194 and 195 of FIG. 19. The spectral response curves obtained in the system 290 are the same as those obtained for the system 220 of FIG. 22. As described for each of the prior systems of the present invention, the entire optical path A→B→E→F→G in which the feedback signal is propagating must preserve the polarization state (polarization maintaining, PM). This means that all components and interconnects, except the forward multiplexing portion provided by the first AWG multiplexer, $f_i^j(w)$, 295 and its input/output ports 295a and 295b are maintaining the polarization state of the laser sources 291a–291n. Still further, one or multiple optional delay lines (not shown) can be added between any two components in the feedback optical signal path of A, B, E, F, and G.

Figure 30:
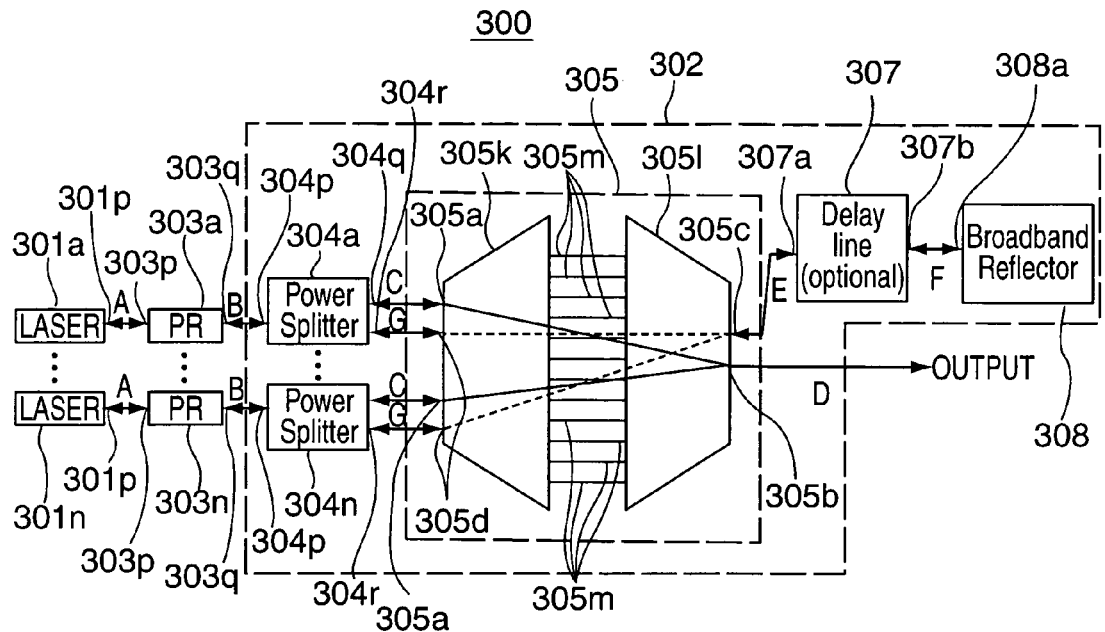
FIG. 30 shows a schematic diagram of a system for multiple laser sources in accordance with the fourth embodiment of the present invention.

Referring now to FIG. 30, there is shown a schematic diagram of a stabilized laser system 300 for a plurality of n laser sources 301a–301n (of which only laser sources 301a and 301n are shown) in accordance with the fourth embodiment of the present invention. The system 300 comprises the plurality of n laser sources 301a–301n, a plurality of n optional polarization rotators (PR) 303a–303n (of which only PR 303a and 303n are shown), and a blue shift feedback stabilizing arrangement 302 (shown within a dashed line area). The blue shift feedback stabilizing arrangement 302 comprises a plurality of n power splitters 304a–304n (of which only power splitters 304a and 304n are shown), an Arrayed Waveguide Grating (AWG) multiplexer 305 (shown within a dashed line rectangle), an optional delay line 307, and a broadband reflector 308. The system 300 is a modified version of the system 290 of FIG. 29 in that the functioning of the first and second AWG multiplexers 295 and 296 of FIG. 29 have been combined into a single AWG multiplexer 305. A front facet 301p of each of the plurality of n laser sources 301a–301n is coupled to a first input/output port 303p of a separate corresponding one of the polarization rotators 303a–303n via an optical path A. A second input/output port 303q of each of the polarization rotators 303a–303n is coupled to an first input/output port 304p of a separate corresponding one of the power splitters 304a–304n via an optical path B. A second input/output port 304q of each of the power splitters 304a–304n is coupled to a separate corresponding one of a plurality of n first input ports 305a of the AWG multiplexer 305 via an optical path C, while a third input/output port 304r of each of the power splitters 304a–304n is coupled to a separate corresponding one of a plurality of n fourth input/output ports 305d of the AWG multiplexer 305 via an optical path G. A second output of the AWG multiplexer 305 provides an output signal from the system 300 via an optical path D to any downstream remote device (not shown). A third input/output port 305c of the AWG multiplexer 305 is coupled to a first input/output port 307a of the optional delay line 307 via an optical path E, while a second input/output port 307b of the optional delay line 307 is coupled to an input/output port 308a of the broadband reflector 308 via an optical path F.

The functioning of the polarization rotators 303a–303n corresponds to that described hereinbefore for, for example, the polarization rotators 243a–243n of FIG. 24. Still further, the functioning of the system 300 provides the same results as that described for the feedback stabilization system 210 of FIGS. 21, where the of the optical paths between ports 305a to 305b, and ports 305c and 305a in the AWG multiplexer 305 provide the functions of the optical paths between ports 214a to 214b, and ports 214c and 214a, respectively, in the forward and feedback multiplexer 214 of FIG. 22. The spectral response curves obtained in the system 300 are the same as those obtained for the system 210 of FIG. 21. As described for each of the prior systems of the present invention, the entire optical path A→B→G→E→F in which the feedback signal is propagating must preserve the polarization state (polarization maintaining, PM). This means that all components and interconnects, except the forward multiplexing portion provided by the AWG multiplexer, $f_i^j(w)$, 305 and its input/output ports 305a and 305b are maintaining the polarization state of the laser sources 301a–301n. Still further, one or multiple optional delay lines (not shown) can be added between any two components in the feedback optical signal path of A, B, E, F, and G.

Figure 31:
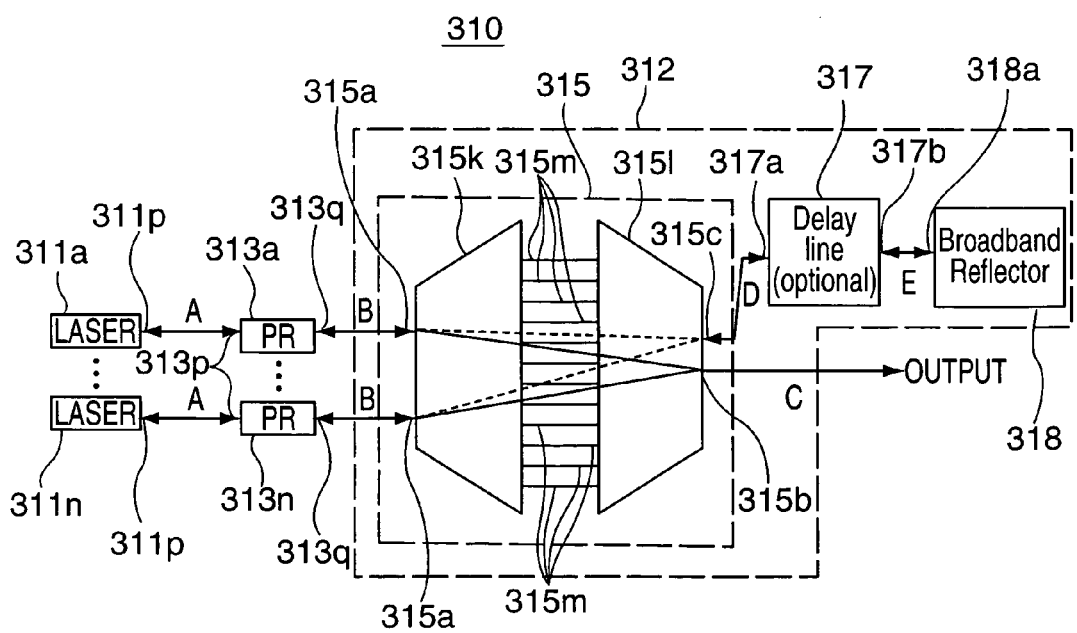
FIG. 31 shows a schematic diagram of a system for multiple laser sources in accordance with the fourth embodiment of the present invention.

Referring now to FIG. 31, there is shown a schematic diagram of a stabilized laser system 310 for a plurality of n laser sources (LASER) 311a–311n (of which only laser sources 311a and 311n are shown) in accordance with the fourth embodiment of the present invention. The system 310 comprises the plurality of n laser sources 311a–311n, a plurality of n optional polarization rotators (PR) 313a–313n (of which only PRs 313a and 313n are shown), and a blue shift feedback stabilizing arrangement 312 (shown within a dashed line area). The blue shift feedback stabilizing arrangement 312 comprises an Arrayed Waveguide Grating (AWG) multiplexer 315 (shown within a dashed line rectangle), an optional delay line 317, and a broadband reflector 318. The system 310 is a modified version of the system 300 of FIG. 30 in that the power splitters 304a–304n of FIG. 30 are eliminated, and the design of the AWG multiplexer 305 of FIG. 30 has been slightly modified to provide the AWG multiplexer 315 of FIG. 31. In the system 310, a front facet 311p of each of the plurality of n laser sources 311a–311n is coupled to a first input/output port 313p of a separate corresponding one of the polarization rotators 313a–313n via an optical path A. A second input/output port 313q of each of the polarization rotators 313a–313n is coupled to a separate corresponding one of a plurality of n first input ports 315a of the AWG multiplexer 315 via an optical path B. A second output port 315b of the AWG multiplexer 315 provides an output signal from the system 310 via an optical path C to any downstream remote device (not shown). A third input/output port 315c of the AWG multiplexer 315 is coupled to a first input/output port 317a of the optional delay line 317 via an optical path D. A second input/output port 317b of the optional delay line 317 is coupled to an input/output port 318a of the broadband reflector 318 via an optical path E.

The functioning of the polarization rotators 313a–313n corresponds to that described hereinbefore for, for example, the polarization rotators 243a–243n of FIG. 24. Still further, the functioning of the system 310 provides the same results as that described for the feedback stabilization system 210 of FIG. 21, where the optical paths between ports 315a to 315b, and ports 315c and 315a in the AWG multiplexer 315 provide the functions of the optical paths between ports 214a to 214b, and ports 214c and 214a, respectively, in the forward and feedback multiplexer 214 of FIG. 21. The spectral response curves obtained in the system 310 are the same as those obtained for the system 210 of FIG. 21. As described for each of the prior systems of the present invention, the entire optical path A→B→D→E in which the feedback signal is propagating must preserve the polarization state (polarization maintaining, PM). This means that all components and interconnects, except the forward multiplexing portion provided by optical paths from plurality of n input/output ports 315a to the single input/output port 315b in the AWG multiplexer, $f_1^j(w)$, 315, and its input/output port 315b are maintaining the polarization state of the laser sources 301a–301n. Still further, one or multiple optional delay lines (not shown) can be added between any two components in the feedback optical signal path of A, B, D, E, and F.

Figure 32:
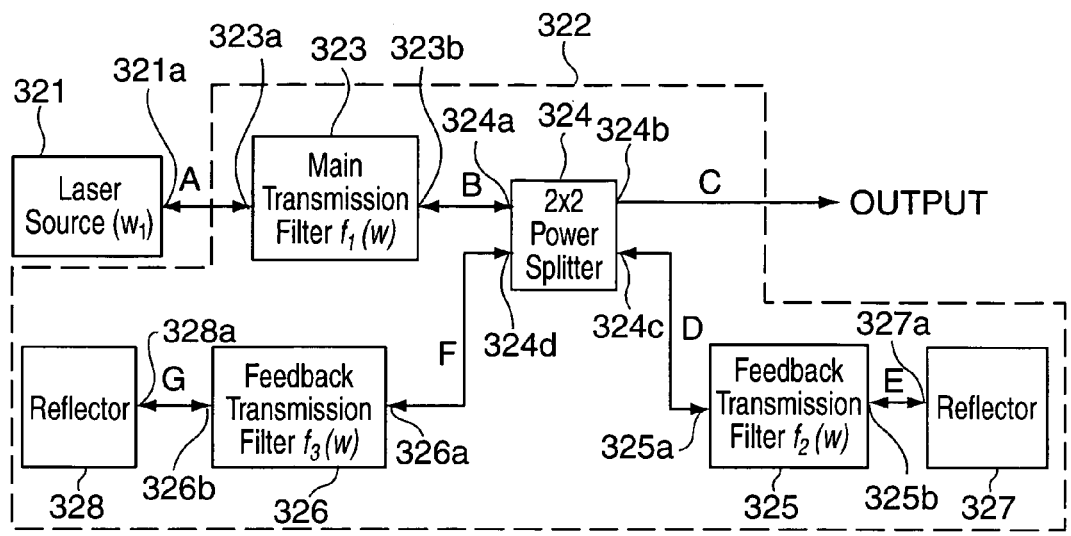
FIG. 32 shows a schematic of a system for blue shift feedback stabilizing a single radiation source in accordance with the third embodiment of the present invention.

Referring now to FIG. 32, there is shown a schematic of a system 320 for blue shift feedback stabilizing a single radiation source (Laser Source) 321 in accordance with the third embodiment of the present invention. The system 320 comprises the laser source 321, and a feedback stabilizing arrangement 322 (shown within a dashed line area) comprising a main transmission filter, $f_1(w)$, 323, a 2×2 power splitter 324, a first feedback transmission filter, $f_2(w)$, 325, a second feedback transmission filter, $f_3(w)$, 326, a first reflector 327, and a second reflector 328. The laser source 321 is coupled at a front facet 321a thereof to a first input/output port 323a of the main transmission filter 323 via an optical path A. A second input/output port 323b of the main transmission filter 323 is coupled to a first input/output port 324a of the power splitter 324 via an optical path B. A second output port 324b of the power splitter 324 provides an output signal from the feedback stabilizing arrangement 322 via an optical path C that was generated by the laser source 321 and is the system 320 output. A third input/output 324c of the power splitter 324 is coupled to a first input/output port 325a of the first feedback transmission filter 325 via an optical path D, and a fourth input/output 324d of the power splitter 324 is coupled to a first input/output port 326a of the second feedback transmission filter 326 via an optical path F. A second input/output port 325b of the first feedback transmission filter 325 is coupled to an input/output port 327a of the first reflector 327 via an optical path E. A second input/output port 326b of the second feedback transmission filter 326 is coupled to an input/output port 328a of the second reflector 328 via an optical path G.

In operation, an output signal from the laser source 321 is received by the main transmission filter 323 at a first input/output port 323a thereof via the optical path A. The received signal is filtered by the main transmission filter 323, $f_1(w)$, and transmitted to a first input/output port 324a of the power splitter 324 via the optical path B. In the power splitter 324, a first portion carrying most of the power of the filtered signal received at the first input/output port 324a is tapped and delivered to a second output port 324b thereof for transmission as an output signal from the system 320 via the optical path C. A second portion of the received filtered signal is tapped and routed by the power splitter 324 via a third input/output port 324c thereof to a first input/output port 325a of the first feedback transmission filter, $f_2(w)$, via the optical path D. A filtered signal from the first feedback transmission filter 325 is transmitted from a second input/output port 325b thereof to a an input/output port 327a of the first reflector via the optical path E, and is reflected back through the first feedback transmission filter, $f_2(w)$, 326 where it is filtered again and transmitted back to the third input/output port of the power splitter 323 via the optical path D. The returned feedback signal is split in the power splitter 324, and a first portion is returned to the laser source 321 via the main transmission filter 323 and the optical paths B and A. A second portion of the returned feedback signal is transmitted via the input/output port 324d of the power splitter 324 to the second feedback transmission filter $f_3(w)$, 326 where it is filtered and the resultant filter signal is transmitted from the second input/output port 326b thereof to the input/output port 328a of the second reflector 328 via the optical path G. The signal received by the second reflector 328 is reflected and transmitted back through the second feedback transmission filter 326 to the fourth input/output port 324d of the power splitter 324. The signal received at the fourth input/output port 324d is split and a first portion thereof adds a component to the output signal transmitted at the second output port 324b, and a second portion is transmitted through the first feedback transmission filter, $f_2(w)$, 325 and then to the first reflector 327, and fed back as described hereinabove.

The optical path for the main component of the output signal propagates from the laser source 321, through the main transmission filter, $f_1(w)$, 323, and through the power splitter 324 via optical paths ABC. However, the output signal propagating via optical path C has other components due to a cavity between the first and second reflectors 327 and 328 including the first feedback transmission filter 325, $f_2(w)$, the second feedback transmission filter 326, $f_3(w)$, and the power splitter 324 using optical paths DEDFGF. Each signal round trip in the cavity adds another component to the output signal propagating via optical path C. The feedback signal returning to the laser source 321 also has other components due to the cavity between the first and second reflectors 327 and 328. Each signal round trip in the cavity adds another component to the feedback signal. The spectral responses obtained by the feedback stabilizing arrangement 322 is essentially the same as that shown in FIG. 4, where curve 36 represents the forward filter spectral response $F_o(w)$, and curve 37 represents the feedback filter spectral response $F_f(w)$. The desired blue shift ($\delta w$) is accomplished by the proper choice of the coupling ratio of power splitter 324, and the spectral responses $f_1(w)$, $f_2(w)$, and $f_3(w)$ when designing the main transmission filter 324, the first feedback transmission filter 325, and the second feedback transmission filter 326, respectively.

As described hereinbefore for the feedback stabilizing arrangement in each of the other systems, the entire optical path in which the feedback signal is propagating must preserve the polarization state (polarization maintaining, PM). This means that all components and interconnects, except the output port 324b of the power splitter 324, maintains the polarization state. Still further one or more optional delay lines can be added between any two components in the path of the feedback signal.

Figure 33:
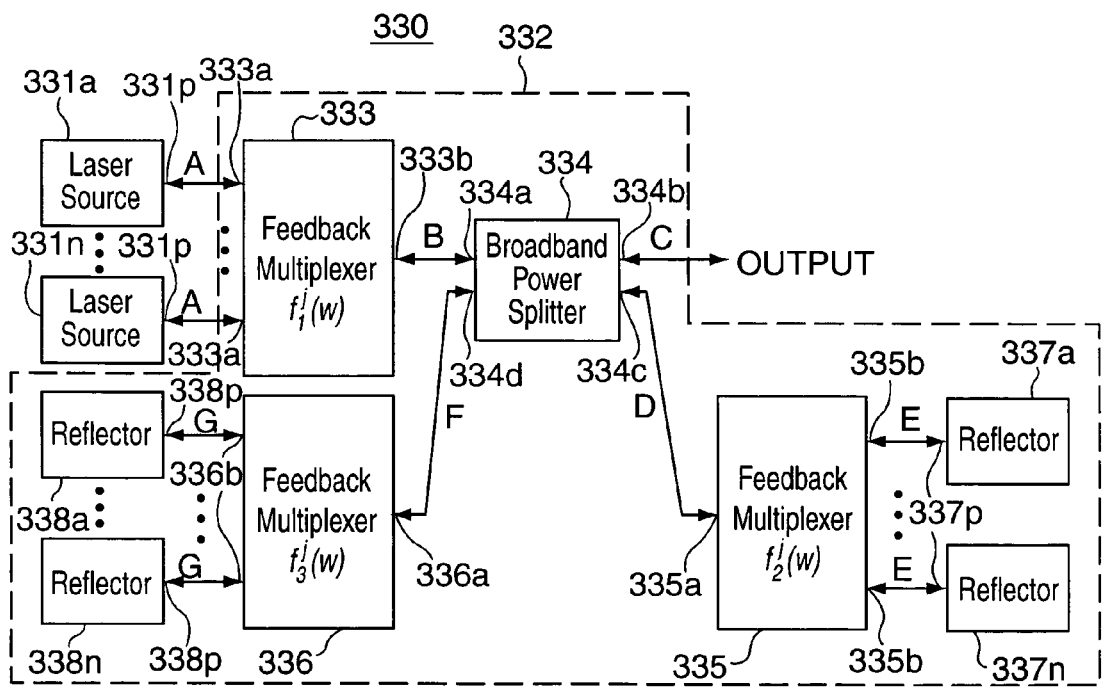
FIG. 33 shows a schematic of a system for blue shift feedback stabilizing multiple radiation sources in accordance with the third embodiment of the present invention.

Referring now to FIG. 33, there is shown a schematic of a system 330 for blue shift feedback stabilizing a plurality of n radiation sources (Laser Source) 331a–331n (of which only laser sources 331a and 331n are shown) in accordance with the third embodiment of the present invention. The system 330 comprises the plurality of n laser sources 331a–331n, and a feedback stabilizing arrangement 332 (shown within a dashed line area) comprising a forward multiplexer, $f_1^j(w)$, 333, a broadband power splitter 334, a first feedback multiplexer, $f_2^j(w)$, 335, a second feedback multiplexer, $f_3^j(w)$, 336, a plurality of n first reflectors 337a–337n (of which only first reflectors 337a and 337n are shown), and a plurality of n second reflectors 338a–338n (of which only second reflectors 338a and 338n are shown). Each of the laser sources 331a–331n is coupled at a front facet 331p thereof to a separate corresponding one of a plurality of n first input/output ports 333a of the forward multiplexer 333 via an optical path A. A second input/output port 333b of the main transmission filter 323 is coupled to a first input/output port 334a of the power splitter 334 via an optical path B. A second output port 334b of the power splitter 334 provides an output signal from the feedback stabilizing arrangement 332 via an optical path C that was generated by the laser source 321 and is an output of the system 330. A third input/output 334c of the power splitter 334 is coupled to a first input/output port 335a of the first feedback multiplexer 335 via an optical path D, and a fourth input/output 334d of the power splitter 334 is coupled to a first input/output port 336a of the second feedback multiplexer 326 via an optical path F. Each of a plurality of n second input/output ports 335b of the first feedback multiplexer 335 is coupled to an input/output port 337a of a separate corresponding one of the plurality of n first reflectors 327 via an optical path E. Each of a plurality of n second input/output ports 336b of the second feedback multiplexer 326 is coupled to an input/output port 338a of a separate corresponding one of the plurality of n second reflectors 328 via an optical path G.

The operation of the feedback stabilizing arrangement 332 is essentially the same as that described for the feedback stabilizing arrangement 322 of FIG. 32. More particularly, the output wavelength signals from the plurality of n laser sources 331a–331n are multiplexed in the forward multiplexer 333 into a multiplexed output signal delivered to its input/output port 333b. Similarly the multiplexed signals received at each of the input/output ports 335a and 336a of the first and second feedback multiplexers 335 and 336, respectively, are demultiplexed and the plurality of n demultiplexed signals are transmitted to the corresponding one of the respective plurality of n first reflectors 337a–337n and the plurality of n second reflectors 338a–338n, and vice versa. The signals propagating through the power splitter 334 to each of the input/output ports 334a, 334b, 334c, and 334d function in the same manner as described hereinbefore for the power splitter 324 of FIG. 32. Therefore, the output signal at output port 334b of the power splitter 334 has components that are added as a result of the cavities between the corresponding ones of the plurality of first reflectors 337a–337n and the plurality of second reflectors 338a–338n in the manner described hereinabove for the cavity between the reflectors 327 and 328 of FIG. 32. Similarly, the cavities between the corresponding ones of the plurality of first reflectors 337a–337n and the plurality of second reflectors 338a–338n also adds a component to the feedback signal to the corresponding one of the laser sources 331a–331n. The spectral responses obtained by the feedback stabilizing arrangement 332 is essentially the same as that shown in FIG. 6, where curves 46a–46n represent the forward filter spectral response $F_o(w)$, for each of the wavelengths generated by the corresponding one of the plurality of n laser sources 331a–331n, and curves 47a–47n represent the feedback filter spectral response $F_f(w)$ for each of the wavelengths fed back to the corresponding one of the plurality of n laser sources 331a–331n. The desired blue shift ($\delta w$) is accomplished by the proper choice of the coupling ratio of power splitter 334, and the spectral responses $f_1(w)$, $f_2(w)$, and $f_3(w)$ when designing the forward multiplexer 333, the first feedback multiplexer 335, and the second feedback multiplexer 336, respectively.

As described hereinbefore for the feedback stabilizing arrangement in each of the other prior systems of FIGS. 3–32, the entire optical path in which a feedback signal is propagating must preserve the polarization state (polarization maintaining, PM). This means that all components and interconnects, except the output port 334b of the power splitter 334, maintains the polarization state. Still further one or more optional delay lines can be added between any two components in the path of the feedback signal.

Figure 34:
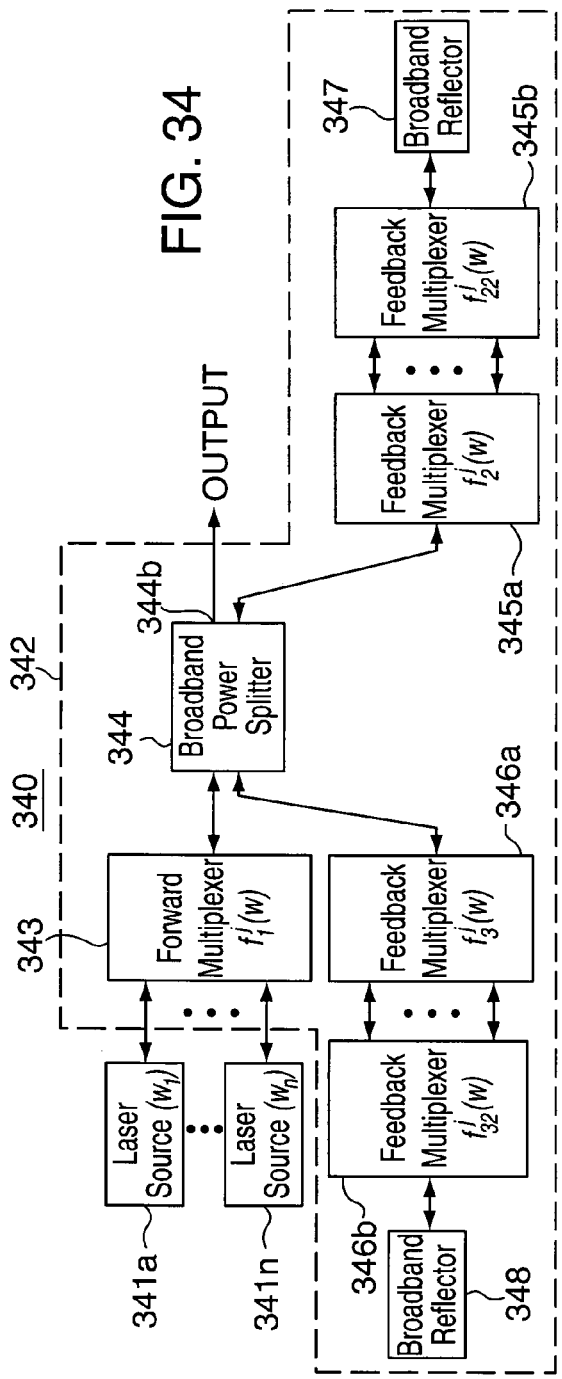
FIG. 34 shows a schematic of a system for blue shift feedback stabilizing multiple radiation sources in accordance with a third embodiment of the present invention.

Referring now to FIG. 34, there is shown a system 340 for the blue shift feedback stabilizing of a plurality of n radiation sources (Laser Sources $w_1$ to $w_n$) 341a–341n (of which only lasers sources 341a and 341n are shown) that is an alternative system to that of system 330 of FIG. 33 in accordance with the third embodiment of the present invention. The system 340 comprises the plurality of n laser sources 341a–341n, and a blue shift feedback stabilizing arrangement 342 (shown within a dashed line area). The blue shift feedback stabilizing arrangement 342 comprises a forward multiplexer, $f_1^j(w)$, 343, a broadband power splitter 344, a first feedback multiplexer, $f_2^j(w)$, 345a, a second feedback multiplexer, $f_{22}^j(w)$, 345b, a third feedback multiplexer, $f_3^j(w)$, 346a, a fourth feedback multiplexer, $f_{32}^j(w)$, 346b, a first broadband reflector 347, and a second broadband reflector 348. The blue shift feedback stabilizing arrangement 342 is essentially the same as the blue shift feedback stabilizing arrangement 332 of FIG. 33, except that the feedback multiplexers 335 and 336 of FIG. 33 have been replaced by a pair of feedback multiplexers 345a and 345b, and 346a and 346b, respectively, and the plurality of reflectors 337a–337n and 338a–338n of FIG. 33 have been replaced by individual reflectors 347 and 348, respectively. The overall interconnections and operation of the blue shift feedback stabilizing arrangement 342 is essentially the same as the blue shift feedback stabilizing arrangement 332 of FIG. 33 and will not be repeated here. The advantage of the blue shift feedback stabilizing arrangement 342 is that it saves the need for the many reflectors 337a–337n and 338a–338n of FIG. 33 by demultiplexing the output signals from the first and third feedback multiplexers 345a and 346a using the second and fourth feedback multiplexers 345b and 346b. The spectral responses $f_2^j(w)$, $f_{22}^j(w)$, $f_3^j(w)$, $f_{32}^j(w)$, of the first, second, third, and fourth feedback multiplexer 345a, 345b, 346a, and 346b, respectively, are designed to provide the same overall spectral responses $f_2^j(w)$, $f_3^j(w)$, provided by the first and second feedback multiplexers 335 and 336 of FIG. 33, respectively. As a result, the spectral responses obtained by the blue shift feedback stabilizing arrangement 342 is essentially the same as that shown in FIG. 6 and obtained with the system 330 of FIG. 33. As indicated for prior systems (e.g., 90, and 110), all components and interconnects, except the output port 344b of the power splitter 324, maintains the polarization state. Still further one or more optional delay lines can be added between any two components in the path of the feedback signal.

Figure 35:
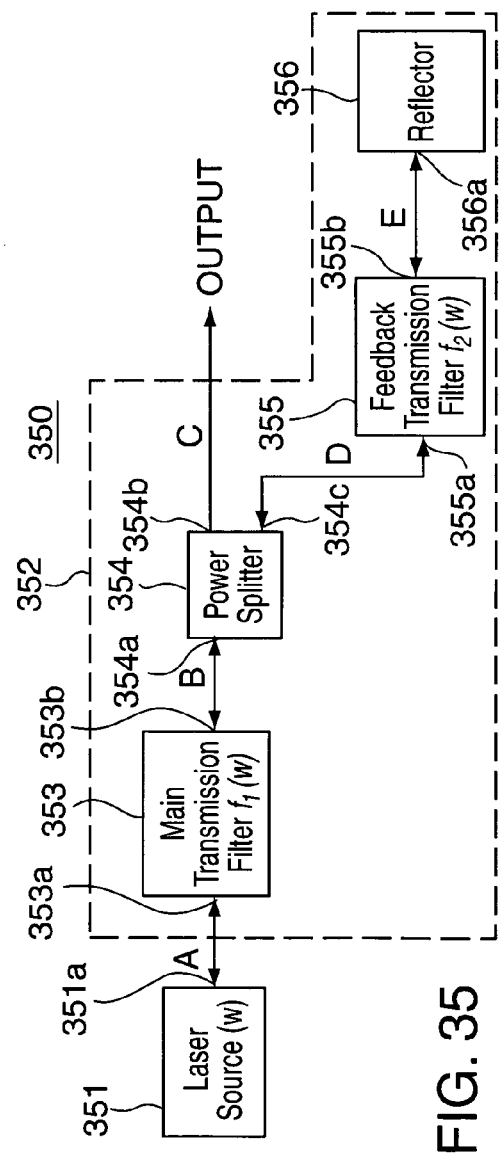
FIG. 35 shows a schematic of a system for blue shift feedback stabilizing a single radiation sources in accordance with the third embodiment of the present invention.

Referring now to FIG. 35, there is shown a schematic of a system 350 for blue shift feedback stabilizing a single radiation source [Laser Source (w)] 351 that is a simplified version of the system of 320 of FIG. 32 in accordance with the third embodiment of the present invention. The system 350 comprises the laser source 351, and a blue shift feedback stabilizing arrangement 352 (shown within a dashed line area) comprising a main transmission filter, $f_1(w)$, 353, a power splitter 354, a feedback transmission filter, $f_2(w)$, 355, and a reflector 356. The laser source 351 is coupled at its front facet 351a to a first input/output port 353a of the main transmission filter 353 via an optical path A, while a second input/output port 353b of the main transmission filter 353 is coupled to a first input/output port 354a of the power splitter 354 via an optical path B. A second output port of the power splitter 354 provides an output signal from the system 350 to a predetermined downstream device via an optical path C, and a third input/output port 354c of the power splitter 354 is coupled to a first input/output port 355a of the feedback transmission filter, $f_2(w)$, 355 via an optical path D. A second input/output port 355b of the feedback transmission filter 355 is coupled to an input/output port 356a of the reflector 356 via an optical path E. In the configuration of feedback stabilizing arrangement 352, the feedback transmission filter, $f_3(w)$, 326 and the second reflector 328 of the feedback stabilizing arrangement 322 of FIG. 32 are removed and the 2×2 power splitter 324 of FIG. 32 is replaced with a 1×2 power spitter 354.

In operation, the main output signal propagates through the feedback stabilizing arrangement 352 only once from the laser source 351 to the second output port 354b of the power splitter 354. The stabilized output signal from the laser source 351 is filtered only by the main transmission filter, $f_1(w)$, 353, and, therefore, a forward filter spectral response for the feedback stabilizing arrangement 352 is $F_o(w)=f_1(w)$. A feedback signal found at the front facet 351a comprises one component when propagating from laser source 351, through the main transmission filter, $f_1(w)$, 353, the power splitter 354, the feedback transmission filter, $f_2(w)$, 355, the reflector 356, and back again through the same path via optical paths A→B→D→E→D→B→A. As a result, the feedback signal passes twice through the feedback transmission filter, $f_2(w)$, 355 and the main transmission filter, $f_1(w)$, 353 such that the Feedback filter spectral response is $F_f(w)=[f_1(w)\cdot f_2(w)]^2$. Spectral response curves obtained with the system 350 correspond to the curves 100–102 shown in FIG. 10, where curve 100 represents the Forward Filter Spectral response $F_o(w)=f_1(w)$, curve 101 represents the Feedback transmission filter spectral response $f_2(w)$, and curve 102 represents the Feedback filter spectral response $F_f(w)=[f_1(w)\cdot f_2(w)]^2$. The transmission filter 353 [with the spectral response $f_1(w)$] and the transmission filter 355 [with the spectral response $f_2(w)$] must be designed such that the spectral responses $F_o(w)$ and $F_f(w)$ provide desired central wavelengths, bandwidths of forward and feedback spectral responses, and wavelength shift (δw) between the spectral responses $F_o(w)$ and $F_f(w)$. As indicated for prior systems (e.g., 90, and 110), all components and interconnects, except the output port 344b of the power splitter 324, maintains the polarization state. Still further one or more optional delay lines can be added between any two components in the path of the feedback signal.

Figure 36:
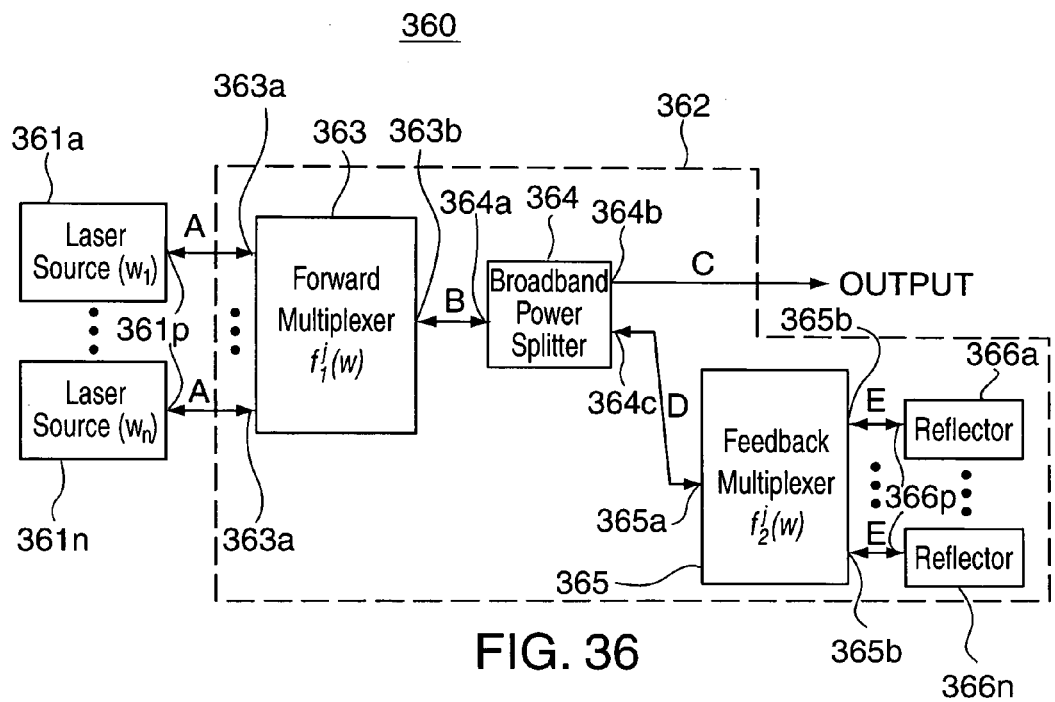
FIG. 36 shows a schematic of a system for blue shift feedback stabilizing multiple radiation sources in accordance with the third embodiment of the present invention.

Referring now to FIG. 36, there is shown a schematic of a system 360 for blue shift feedback stabilizing a plurality of n radiation sources [Laser Sources $w_1$ to $w_n$)] 361a–361n (of which only laser sources 361a and 361n are shown) that is a simplified version of the system of 330 of FIG. 33 in accordance with the third embodiment of the present invention. The system 360 comprises the plurality of n laser sources 361a–361n, and a blue shift feedback stabilizing arrangement 362 (shown within a dashed line area) comprising a forward multiplexer, $f_1^j(w)$, 363, a power splitter 364, a feedback multiplexer, $f_2^j(w)$, 365, and a plurality of reflectors 366a to 366n with only 366a and 366n being shown. Each of the plurality of n laser sources 361a–361n is coupled at its front facet 361p to a separate corresponding one of a plurality of n first input/output ports 363a of the forward multiplexer 363 via an optical path A, while a second input/output port 363b of the forward multiplexer 363 is coupled to a first input/output port 364a of the power splitter 364 via an optical path B. A second output port 364b of the power splitter 364 provides an output signal from the system 360 to a predetermined downstream device via an optical path C, and a third input/output port 364c of the power splitter 364 is coupled to a first input/output port 365a of the feedback multiplexer, $f_2^j(w)$, 365 via an optical path D. Each of a plurality of n second input/output ports 365b of the feedback multiplexer 365 is coupled to an input/output port 366p of a separate corresponding one of the plurality of n reflectors 366a–366n via an optical path E.

In operation, the main output signal from each of the plurality of n laser sources 361a–361n propagates through the feedback stabilizing arrangement 362 only once to the second output port 364b of the power splitter 364. The stabilized output signal from each of the plurality of n laser sources 361a–361n is filtered only by the forward multiplexer, $f_1(w)$, 363, and, therefore, a forward filter spectral response for a jth port is $F_o^j(w)=f_1(w)$. A feedback signal found at each of the front facets 361p of the laser sources 361a–361n comprises one component in propagating from the corresponding one of the laser sources 361a–361n [e.g., laser sources 361j (not shown)], through the forward multiplexer, $f_1^j(w)$, 363, the power splitter 364, the feedback multiplexer, $f_2^j(w)$, 365, the corresponding one of the plurality of n reflectors 366a–366n, and back again through the same path via optical paths A→B→D→E→D→B→A. As a result, the feedback signal passes twice through the feedback multiplexer, $f_2^j(w)$, 365 and the forward multiplexer, $f_1^j(w)$, 363 such that the resultant feedback filter spectral response is $F_f^j(w)=[f^j(w)\cdot f_2^j(w)]^2$. Spectral response curves obtained with the system 360 correspond to the curves 120a–120n, 121a–121n, and 102a–102n shown in FIG. 12, where each of the curves 120a–120n represent the Forward multiplexer response $F_o(w)=f_1(w)$ for each of the corresponding laser sources 361a–361n, curves 121a–121n represent the spectral response $f_2(w)$ provided by the feedback multiplexer 365 for each of the feedback signals, and curves 122a–122n represent the Feedback filter spectral response $F^j(w)=[f_1(w)\cdot f_2(w)]^2$ for each of the laser sources 361a–361n. The forward multiplexer 363 [with the spectral response $f_1(w)$] and the feedback multiplexer 365 [with the spectral response $f_2(w)$] must be designed such that the spectral responses $F_o(w)$ and $F_f(w)$ provide desired central wavelengths, bandwidths of forward and feedback spectral responses, and wavelength shift (δw) between the spectral responses $F_o(w)$ and $F_f(w)$. As indicated for prior systems (e.g., 90, and 110), all components and interconnects, except the output port 364*b* of the power splitter 364, maintains the polarization state. Still further one or more optional delay lines can be added between any two components in the path of the feedback signal.

Figure 37:
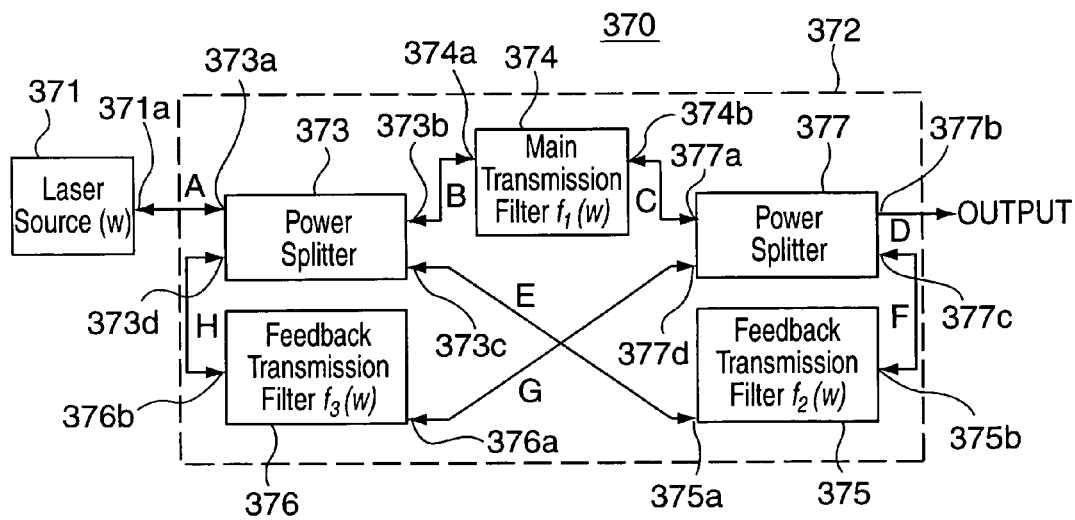
FIG. 37 shows a schematic of a system for blue shift feedback stabilizing a single radiation source in accordance with a fifth embodiment of the present invention.

Referring now to FIG. 37, there is shown a schematic of a system 370 for blue shift stabilizing a single radiation source [Laser Source (w)] 371 in accordance with a fifth embodiment of the present invention. The system 370 comprises the laser source 371, and a blue shift feedback stabilizing arrangement 372 (shown within a dashed line rectangle) comprising a first power splitter 373, a main transmission filter, $f_1(w)$, 374, a first feedback transmission filter, $f_2(w)$, 375, a second feedback transmission filter, $f_3(w)$, 376, and a second power splitter 377. The laser source 371 is coupled at its front facet 371*a* to a first input/output port 373*a* of the first power splitter 373 via an optical path A. For the first power splitter 373, a second input/output port 373*b* thereof is coupled to a first input/output port 374*a* of the main transmission filter 374 via an optical path B, a third input/output port 373*c* thereof is coupled to a first input/output port 375*a* of the first feedback transmission filter 375 via an optical path E, and a fourth input/output port 373*d* thereof is coupled to a second input/output port 376*b* of the second feedback transmission filter 376 via and an optical path H. A second input/output port 374*b* of the main transmission filter 374 is coupled to a first input/output port 377*a* of the second power splitter 377 via an optical path C. For the second power splitter 377, a second input/output port 377*b* thereof provides an output signal from the system 370 to a predetermined downstream device via an optical path D, a third input/output port 377*c* is coupled to a second input/output port 375*b* of the first feedback transmission filter 375 via an optical path F, and a fourth input/output port 377*d* thereof is coupled to a first input/output port 376*a* of the second feedback transmission filter 376 via an optical path G.

In operation, an output signal from the laser source 371 is tapped in the first power splitter 373, and a first portion thereof carrying most of the laser signal power is transmitted via optical path B to the first input/output port 374*a* of the main transmission filter 374 while a second portion thereof is transmitted via the optical path E to the first input/output port 375*a* of the first feedback transmission filter 375. The signal received by the main transmission filter 374, $f_1(w)$, is filtered and transmitted via the optical path C to the first input/output port 377*a* of the second power splitter 377. In the second power splitter 377, the received signal is tapped and a first portion thereof carrying most of the received signal power is provided as an output signal from the system 370 via optical path D to any predetermined downstream device, while a second portion thereof is transmitted via optical path F to the second input/output port 375*b* of the first feedback transmission filter 375. Therefore, the optical path (A→B→C→D) for the main component of the output signal from the system 370 involves the first power splitter 373, the main transmission filter, $f_1(w)$, 374, and the second power splitter 377. The output signal has other components due to the presence of a cavity comprising a twisted loop configuration involving the optical paths F→E→H→G→F. Each signal round trip in this cavity adds one component to the output signal propagating on optical path D. A feedback signal to the laser source 371 has two main components. A first main component in the feedback signal involves a round trip from the laser source 371 through the optical paths A→B→C→F→E→A, while a second main component in the feedback signal involves a round trip from the laser source 371 through the optical paths A→E→F→C→B→A. Each signal round trip in this cavity adds one component to the feedback signal to the laser source 371.

Spectral response curves obtained with the system 370 correspond to the spectral response curves 36 and 37 shown in FIG. 4, where curve 36 represents the Forward Filter Spectral response $F_o(w)$, and curve 37 represents the Feedback filter spectral response $F_f(w)$. The main transmission filter 373 [with the spectral response $f_1(w)$] and the first and second feedback transmission filters 375 and 376, respectively, [with the respective spectral response $f_2(w)$ and $f_3(w)$] must be designed such that the desired forward and feedback spectral responses $F_o(w)$ and $F_f(w)$ are achieved by a proper choice of the individual spectral responses $f_1(w)$, $f_2(w)$, and $f_3(w)$, coupling ratios, and cavity length. As indicated for prior systems (e.g., 90 of FIG. 9 and 110 of FIG. 11), all components and interconnects, except the output port 377*b* of the power splitter 377, maintains the polarization state. Still further, one or more optional delay lines can be added between any two components in the path of the feedback signal. Additionally, the broadband power splitter function for the first and second power splitters 373 and 377 can be achieved in different technology platforms such as planar waveguide technology using directional couplers (DC), multimode interference (MMI) couplers, asymmetric Y junctions, Mach-Zehnder interferometers, etc., and free space optics using thin film, etc.

Figure 38:
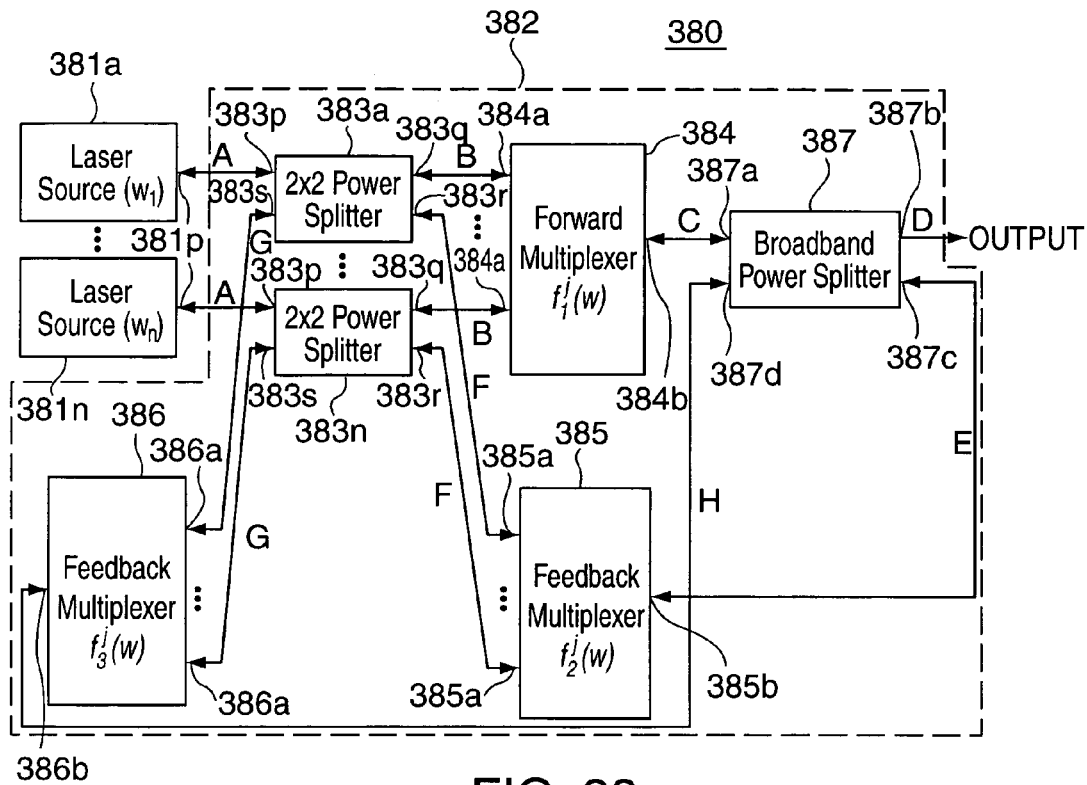
FIG. 38 shows a schematic of a system for blue shift feedback stabilizing multiple radiation sources in accordance with fifth embodiment of the present invention.

Referring now to FIG. 38, there is shown a schematic of a system 380 for blue shift stabilizing a plurality of n radiation sources [Laser Sources $w_1$ to $w_n$)] 381*a*–381*n* with only 381*a* and 381*n* being shown in accordance with a fifth embodiment of the present invention. The system 380 comprises the plurality of n laser sources 381*a*–381*n*, and a blue shift feedback stabilizing arrangement 382 (shown within a dashed line area) comprising a plurality of n 2×2 power splitters 383*a*–383*n*, a forward multiplexer, $f_1^j(w)$, 384, a first feedback multiplexer, $f_2^j(w)$, 385, a second feedback multiplexer, $f_3^j(w)$, 386, and a broadband power splitter 387. Each of the plurality of n laser sources 381*a*–381*n* is coupled at its front facet 381*p* to a first input/output port 383*p* of a separate corresponding one of the plurality of n 2×2 power splitters 383*a*–383*n* via an optical path A. For each of the 2×2 power splitters 383*a*–383*n*, a second input/output port 383*q* thereof is coupled to a corresponding one of a plurality of n first input/output ports 384*a* of the forward multiplexer 384 via an optical path B, a third input/output port 384*r* thereof is coupled to a corresponding one of a plurality of n first input/output port 385*a* of the first feedback multiplexer 385 via an optical path F, and a fourth input/output port 383*s* thereof is coupled to a corresponding one of a plurality of n first input/output port 386*a* of the second feedback multiplexer 386 via and optical path G. A second input/output port 384*b* of the forward multiplexer 384 is coupled to a first input/output port 387*a* of the second power splitter 387 via an optical path C. For the broadband power splitter 387, a second output port 387*b* thereof provides an output signal from the system 380 to a predetermined downstream device via an optical path D, a third input/output port 387*c* thereof is coupled to a second input/output port 385*b* of the first feedback multiplexer 385 via an optical path E, and a fourth input/output port 387*d* thereof is coupled to a second input/output port 386*b* of the second feedback multiplexer 386 via an optical path H.

The blue shift feedback stabilizing arrangement 382 is an implementation for a plurality of n laser sources 381*a*–381*n* similar to that described for the blue shift feedback stabilizing arrangement 372 of FIG. 37 for a single laser source 371. However, in the blue shift feedback stabilizing arrangement 382, the single channel main transmission filter, $f_1(w)$, 374, and the single channel first and second feedback transmission filters, $f_2(w)$ and $f_3(w)$, 375 and 376, respectively, of FIG. 37 have been replaced with a multiple channel forward multiplexer, $f_1^j(w)$, 384, and first and second feedback multiplexers, $f_2^j(w)$ and $f_3^j(w)$, 385 and 386, respectively, where "j" represents a jth port. The overall operation of the blue shift feedback stabilizing arrangement 382 is essentially the same as that described hereinbefore for the blue shift feedback stabilizing arrangement 372 of FIG. 37 except that the output signals from the plurality of n laser sources 381a–381n are selectively multiplexed or demultiplexed where a single multiplexed or a plurality of n demultiplexed output signals, respectively, are needed from each of the multiplexers 384, 385, or 386.

The spectral responses obtained by the blue shift feedback stabilizing arrangement 382 is essentially the same as that shown in FIG. 6, where curves 46a–46n represent the forward filter spectral response $F_o^j(w)$, for each of the wavelengths generated by the corresponding one of the plurality of n laser sources 381a–381n, and curves 47a–47n represent the feedback filter spectral response $F_f^j(w)$ for each of the wavelengths fed back to the corresponding one of the plurality of n laser sources 381a–381n. As was found in the blue shift feedback stabilizing arrangement 372 of FIG. 37, in the blue shift feedback stabilizing arrangement 382 the output signal in optical path D has components due to the presence of a cavity comprising a twisted loop configuration involving the optical paths E→F→G→H→E. Each signal round trip in this cavity adds one component to the output signal propagating on optical path D. A feedback signal to each of the plurality of n laser sources 381a–381n has two main components. A first main component in the feedback signal involves a round trip from a laser source (e.g., 381a) through the optical paths A→B→C→E→F→A, while a second main component in the feedback signal involves a round trip from the laser source 381a through the optical paths A→F→E→C→B→A. Each signal round trip in this cavity adds one component to the feedback signal to each of the plurality of n laser sources 381a–381n. The desired blue shift (δw) is accomplished by the proper choice of the spectral responses $f_1^j(w)$, $f_2^j(w)$, and $f_3^j(w)$ when designing the forward multiplexer 384, the first feedback multiplexer 385, and the second feedback multiplexer 386, respectively.

As described hereinbefore for other feedback stabilizing arrangements, the entire optical path in which a feedback signal is propagating must preserve the polarization state (polarization maintaining, PM). This means that all components and interconnects, except the output port 387b of the second power splitter 387, maintains the polarization state. Still further one or more optional delay lines can be added between any two components in the path of the feedback signal.

Figure 39:
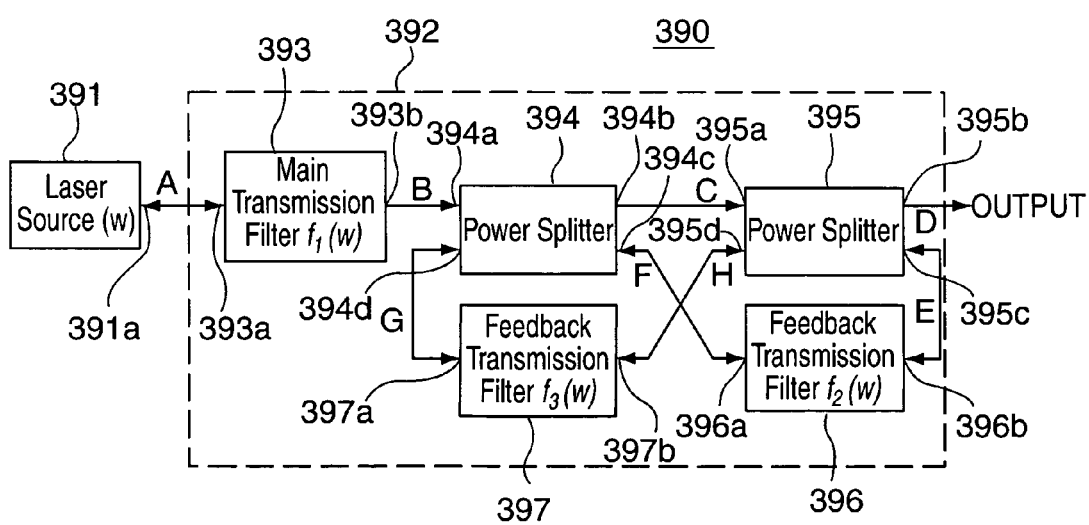
FIG. 39 shows a schematic of a system for blue shift feedback stabilizing a single radiation source in accordance with fifth embodiment of the present invention.

Referring now to FIG. 39, there is shown a schematic of a system 390 for a blue shift feedback stabilizing arrangement 392 (shown within a dashed line rectangle), similar to system 370 that is shown in FIG. 37, for a single radiation source [laser source (w)] 391 in accordance with the fifth embodiment of the present invention. The system 390 comprises the laser source 391, and a blue shift feedback stabilizing arrangement 392 (shown within a dashed line rectangle) comprising a main transmission filter, $f_1(w)$, 393, first power splitter 394, a second power splitter 395, a first feedback transmission filter, $f_2(w)$, 396, and a second feedback transmission filter, $f_3(w)$, 397. The laser source 391 is coupled at its front facet 391a to a first input/output port 393a of the main transmission filter, $f_1(w)$, 393 via an optical path A; and a second input/output port 393b of the main transmission filter 393 is coupled to a first input/output port 394a of the first power splitter 394 via an optical path B. For the first power splitter 394, a second input/output port 394b thereof is coupled to a first input/output port 395a of the second power splitter 395 via an optical path C, a third input/output port 394c thereof is coupled to a first input/output port 396a of the first feedback transmission filter 396 via an optical path F, and a fourth input/output port 394d thereof is coupled to a first input/output port 397a of the second feedback transmission filter 397 via and optical path G. For the second power splitter 395, a second input/output port 395b thereof provides an output signal from the system 390 to a predetermined downstream device via an optical path D, a third input/output port 395c is coupled to a second input/output port 396b of the first feedback transmission filter 396 via an optical path E, and a fourth input/output port 395d thereof is coupled to a second input/output port 397b of the second feedback transmission filter 397 via an optical path H.

In operation, an output signal from the laser source 391 is filtered by the main transmission filter 393 and a resultant output signal is transmitted to the first power splitter 394. The filtered signal is tapped in the first power splitter 394, and a first portion thereof, carrying most of the laser signal power, is transmitted via optical path C to the first input/output port 395a of the second power splitter 395, while a second portion thereof is transmitted via optical path F to the first input/output port 396a of the first feedback transmission filter 396. In the second power splitter 395, the received signal is tapped and a first portion thereof carrying most of the received signal power is provided as an output signal from the system 390 via optical path D to any predetermined downstream device, while a second portion thereof is transmitted via optical path E to the second input/output port 396b of the first feedback transmission filter 396. Therefore, the optical path (A→B→C→D) for the main component of the output signal from the system 390 involves the main transmission filter, $f_1(w)$, 393, the first power splitter 394, and the second power splitter 395. The output signal has other components due to the presence of a cavity comprising a twisted loop configuration involving the optical paths F→E→H→G→F. Each signal round trip in this cavity adds one component to the output signal propagating on optical path D. A feedback signal to the laser source 391 has two main components. A first main component in the feedback signal involves a round trip from the laser source 391 through the optical paths A→B→C→E→F→A, while a second main component in the feedback signal involves a round trip from the laser source 391 through the optical paths A→B→F→E→C→B→A. Each signal round trip in this cavity adds one component to the feedback signal to the laser source 391. An alternative arrangement to the feedback stabilizing arrangement 392 that provides a same result is to replace the second feedback transmission filter, $f_3(w)$, 347 with an optional delay line 347 (not shown).

Spectral response curves obtained with the system 390 correspond to the spectral response curves 36 and 37 shown in FIG. 4, where curve 36 represents the Forward Filter Spectral response $F_o(w)$, and curve 37 represents the Feedback filter spectral response $F_f(w)$. The main transmission filter 393 [with the spectral response $f_1(w)$] and the first and second feedback transmission filters 396 and 397, respectively, [with the respective spectral response $f_2(w)$ and $f_3(w)$] must be designed such that the desired forward and feedback spectral responses $F_o(w)$ and $F_f(w)$ are achieved by a proper choice of the individual spectral responses $f_1(w)$, $f_2(w)$, and $f_3(w)$, coupling ratios, and cavity length. As indicated for prior systems (e.g., 90, and 110), all components and interconnects, except the output port 395b of the second power splitter 395, maintains the polarization state. Still further, one or more optional delay lines can be added between any two components in the path of the feedback signal.

Figure 40:
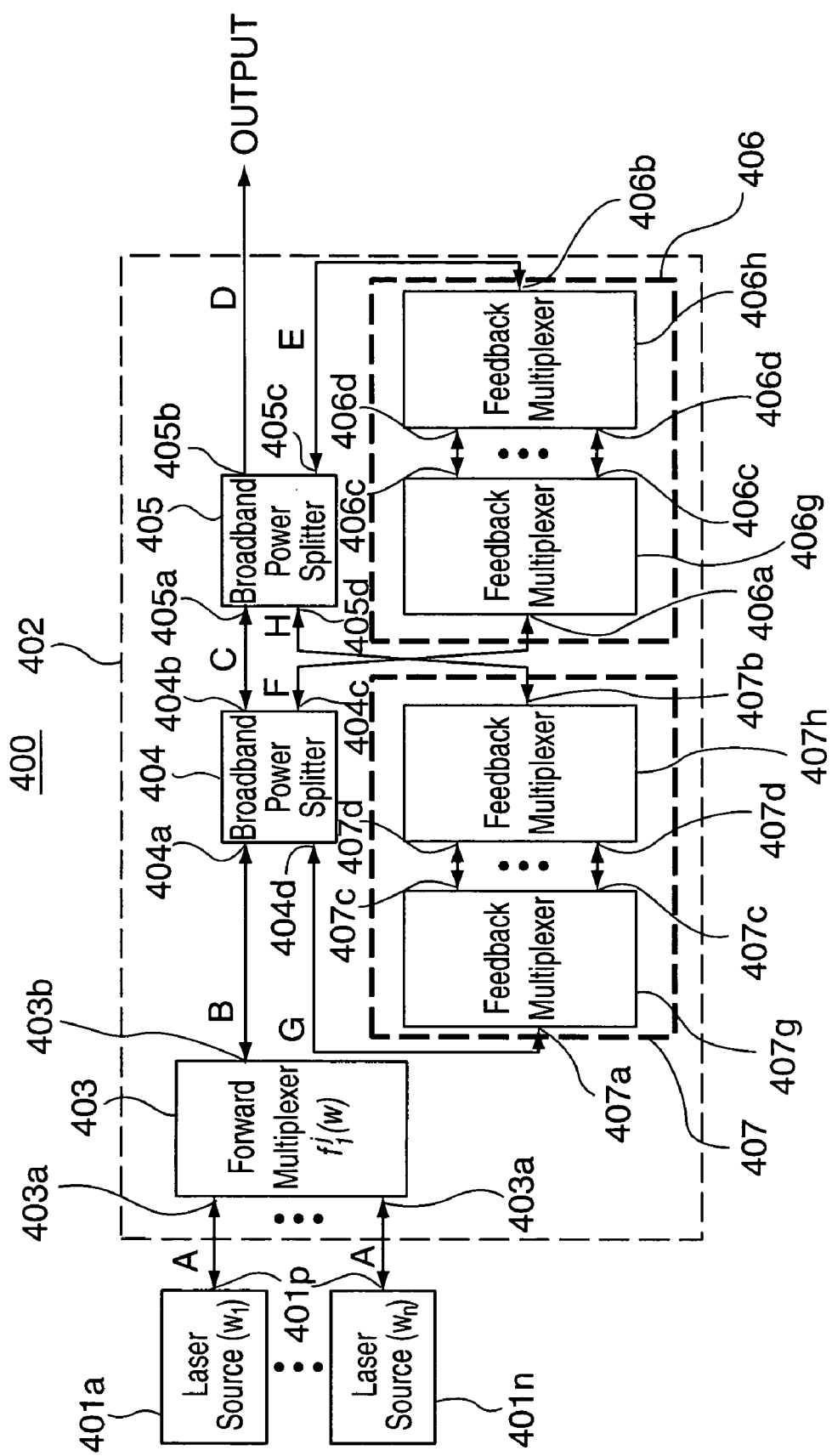
FIG. 40 shows a schematic of a system for blue shift feedback stabilizing a single radiation source in accordance with fifth embodiment of the present invention.

Referring now to FIG. 40, there is shown a schematic of a system 400, which is similar to the system 390 of FIG. 39, for blue shift stabilizing a plurality of n radiation sources [laser sources ($w_1$ to $w_n$)] 401a–401n in accordance with the fifth embodiment of the present invention. The system 400 comprises the plurality of n laser sources 401a–401n (with only 401a and 401n being shown), and a blue shift feedback stabilizing arrangement 402 (shown within a dashed line rectangle) comprising a forward multiplexer, $f_1^j(w)$, 403, a first broadband power splitter 404, a second broadband power splitter 405, a first feedback multiplexer arrangement, $f_2^j(w)$, 406 (shown within a dashed line rectangle), and a second feedback multiplexer arrangement, $f_3^j(w)$, 407 (shown within a dashed line rectangle. The first feedback multiplexer arrangement, $f_2^j(w)$, 406 comprises a cascaded feedback multiplexer 406g and a feedback multiplexer 406h; and the second feedback multiplexer arrangement, $f_3^j(w)$, 407 comprises cascaded feedback multiplexer 407g and feedback multiplexer 407h. Each of the plurality of n laser sources 401a–401n is coupled at its front facet 401p to a corresponding one of first input/output ports 403a of the forward multiplexer, $f_1^j(w)$, 403 via an optical path A; and a second input/output port 403b of the forward multiplexer 403 is coupled to a first input/output port 404a of the first broadband power splitter 404 via an optical path B. For the first power splitter 404, a second input/output port 404b thereof is coupled to a first input/output port 405a of the second power splitter 405 via an optical path C, a third input/output port 404c thereof is coupled to a first input/output port 406a of the first feedback multiplexer arrangement 406 via an optical path F, and a fourth input/output port 404d thereof is coupled to a first input/output port 407a of the second feedback multiplexer arrangement 407 via and optical path G. For the second power splitter 405, a second input/output port 405b thereof provides an output signal from the system 400 to a predetermined downstream device via an optical path D, a third input/output port 405c is coupled to a second input/output port 406b of the first feedback multiplexer arrangement 406 via an optical path E, and a fourth input/output port 405d thereof is coupled to a second input/output port 407b of the second feedback multiplexer arrangement 407 via an optical path H.

In the first feedback multiplexer arrangement 406, a signal received at the first input/output port 406a is demultiplexed into a plurality of n demultiplexed signals by the first feedback multiplexer 406g, and each demultiplexed signal is delivered to a corresponding one of a plurality of n input/output ports 406c thereof. Each of the plurality of n demultiplexed signals from the first feedback multiplexer 406g are received at a corresponding one of a plurality of n input/output ports 406d of the second feedback multiplexer 406h, and the plurality of n received signals are multiplexed into a single output signal at input/output port 406b thereof. The operation of the first and second feedback multiplexers 407g and 407h, respectively, in the second feedback multiplexer arrangement 407 are the same as that described for the operation of the in the first and second feedback multiplexers 406g and 406h in the first feedback multiplexer arrangement 406. Still further, the operation in each of the first and second feedback multiplexer arrangements 406 and 407 for signals propagating in an opposite direction therein is exactly the reverse of that described hereinabove. The operation of the feedback stabilizing arrangement 402 is substantially the same as that described for the feedback stabilizing arrangement 392 of FIG. 39 except that the output signals from the plurality of n laser sources 401a–401n are multiplexed into a filtered single multiplexed output signal from the forward multiplexer 403 before being similar processed by the remaining components 404, 405, 406, and 407. The advantage of providing a forward multiplexer 403 before the first broadband power splitter 404, and a pair of cascaded feedback multiplexers 406g and 406h, and 407g and 407h in the first and second feedback multiplexer arrangements 406 and 407, respectively, is to maintain a single multiplexed signal between the components 404, 405, 406 and 407 and avoid the necessity of a plurality of n same components to handle the separate demultiplexed signals.

The spectral responses obtained by the blue shift feedback stabilizing arrangement 402 is essentially the same as that shown in FIG. 6, where curves 46a–46n represent the forward filter spectral response $F_o(w)$, for each of the wavelengths generated by the corresponding one of the plurality of n laser sources 401a–401n, and curves 47a–47n represent the feedback filter spectral response $F_f(w)$ for each of the wavelengths fed back to the corresponding one of the plurality of n laser sources 401a–401n. As was found in the blue shift feedback stabilizing arrangement 372 of FIG. 37, in the blue shift feedback stabilizing arrangement 402 the output signal in optical path D has components due to the presence of a cavity comprising a twisted loop configuration involving the optical paths E→F→G→H→E. Each signal round trip in this cavity adds one component to the output signal propagating on optical path D. A feedback signal to each of the plurality of n laser sources 401a–401n has two main components. A first main component in the feedback signal involves a round trip from a laser source (e.g., 401a) through the optical paths A→B→C→E→F→A, while a second main component in the feedback signal involves a round trip from the laser source 401a through the optical paths A→B→F→E→C→B→A. Each signal round trip in this cavity adds one component to the feedback signal to each of the plurality of n laser sources 401a–401n. The desired blue shift (δw) is accomplished by the proper choice of the spectral responses $f_1^j(w)$, $f_2^j(w)$, and $f_3^j(w)$ when designing the forward multiplexer 403, the first feedback multiplexer arrangement 406, and the second feedback multiplexer arrangement 407, respectively.

As described hereinbefore for other feedback stabilizing arrangements, the entire optical path in which a feedback signal is propagating must preserve the polarization state (polarization maintaining, PM). This means that all components and interconnects, except the output port 405b of the second power splitter 405, maintains the polarization state. Still further one or more optional delay lines can be added between any two components in the path of the feedback signal.

Referring now to FIG. 41, there is shown a schematic of a system 410 that modifies the system 400 of FIG. 40 for feedback stabilizing a plurality of n radiation sources [laser sources $w_1$ to $w_n$)] 411a–411n (of which only laser sources 411a and 411n are shown) in accordance with the fifth embodiment of the present invention. The system 410 comprises the plurality of n laser sources 411a–411n, and a blue shift feedback stabilizing arrangement 412 (shown within a dashed line rectangle) comprising a forward multiplexer, $f_1^j(w)$, 413, a first broadband power splitter 414, a second power splitter 415, a feedback multiplexer arrangement, $f_2^j(w)$, 416 (shown within a dashed line rectangle) comprising cascaded first and second feedback multiplexers 416g and 416h, and an optional delay line 417. Each of the plurality of n laser sources 411a–411n is coupled at a front facet 411p thereof to a corresponding one of a plurality of n first input/output ports 413a of the forward multiplexer, $f_1^j(w)$, 413 via an optical path A; and a second input/output port 413b of the forward multiplexer 413 is coupled to a first input/output port 414a of the first broadband power splitter 414 via an optical path B. For the first broadband power splitter 414, a second input/output port 414b thereof is coupled to a first input/output port 415a of the second broadband power splitter 415 via an optical path C, a third input/output port 414c thereof is coupled to a first input/output port 416a of the feedback multiplexer arrangement 416 via an optical path F, and a fourth input/output port 414d thereof is coupled to a first input/output port 417a of the optional delay line 417 via and optical path G. For the second broadband power splitter 415, a second input/output port 415b thereof provides an output signal from the system 410 to a predetermined downstream device via an optical path D, a third input/output port 415c is coupled to a second input/output port 416b of the feedback multiplexer arrangement 416 via an optical path E, and a fourth input/output port 415d thereof is coupled to a second input/output port 417b of the optional delay line 417 via an optical path H.

The operation of the feedback stabilizing arrangement 412 is essentially the same as was described for the operation of the feedback stabilizing arrangement 402 of FIG. 40 except that the optional delay line 417 of FIG. 41 replaces second feedback multiplexer arrangement 407.

The spectral responses obtained by the blue shift feedback stabilizing arrangement 410 is essentially the same as that shown in FIG. 6, where curves 46a–46n represent the forward filter spectral response $F_o^j(w)$, for each of the wavelengths generated by the corresponding one of the plurality of n laser sources 411a–411n, and curves 47a–47n represent the feedback filter spectral response $F_f^j(w)$ for each of the wavelengths fed back to the corresponding one of the plurality of n laser sources 411a–411n. As was found in the blue shift feedback stabilizing arrangement 372 of FIG. 37, in the blue shift feedback stabilizing arrangement 412 the output signal in optical path D has components due to the presence of a cavity comprising a twisted loop configuration involving the optical paths E→F→G→H→E. Each signal round trip in this cavity adds one component to the output signal propagating on optical path D. A feedback signal to each of the plurality of n laser sourced 411a–411n has two main components. A first main component in the feedback signal involves a round trip from a laser source (e.g., 411a) through the optical paths A→B→C→E→F→B→A, while a second main component in the feedback signal involves a round trip from the laser source 411a through the optical paths A→B→F→E→C→B→A. Each signal round trip in this cavity adds one component to the feedback signal to each of the plurality of n laser sources 411a–411n. The desired blue shift ($\delta w$) is accomplished by the proper choice of the spectral responses $f_1^j(w)$, $f_2^j(w)$, when designing the forward multiplexer 413, the feedback multiplexer arrangement 416, respectively, and the optional delay line 417.

As described hereinbefore for other feedback stabilizing arrangements (e.g., arrangements 330 and 360), the entire optical path in which a feedback signal is propagating must preserve the polarization state (polarization maintaining, PM). This means that all components and interconnects, except the output port 415b of the second broadband power splitter 415, maintains the polarization state. Still further one or more optional delay lines can be added between any two components in the path of the feedback signal.

Referring now to FIG. 42, there is shown a schematic of a system 420 for blue shift feedback stabilizing a single radiation source [Laser Source (w)] 421 in accordance with the fifth embodiment of the present invention. The system 420 comprises the laser source 421, and a blue shift feedback stabilizing arrangement 422 shown within a dashed line enclosed area. The feedback stabilizing arrangement 422 comprises a main transmission filter, $f_1(w)$, 423, a first feedback transmission filter, $f_2(w)$, 424, a second feedback transmission filter, $f_3(w)$, 425, a third feedback transmission filter, $f_4(w)$, 426, a first 2×2 power splitter 427, a second 2×2 power splitter 428, a first reflector 429, and a second reflector 430. The laser source 421 is coupled from its front facet 421a to a first input/output port 423a of the main transmission filter 423 via an optical path A. A second input/output port 423b of the main transmission filter 423 is coupled to a first input/output port 427a of the first 2×2 power splitter 427 via an optical path B. In the first power splitter 427, a second input/output port 427b thereof is coupled to a first input/output port 428a of the second 2×2 power splitter 428 via an optical path C, a third input/output port 427c is coupled to a first input/output port 424a of the first feedback transmission filter, $f_2(w)$, 424 via an optical path F, and a fourth input/output port 427d is coupled to a first input/output port 425a of the second feedback transmission filter, $f_3(w)$, 425 via an optical path G. In the second power splitter 428, a second output port 428b thereof provides an output signal from the system 420 to any predetermined downstream device (not shown) via an optical path D, a third input/output port 428c thereof is coupled to a second input/output port 424b of the first feedback transmission filter, $f_2(w)$, 424 via an optical path E, and a fourth input/output port thereof is coupled to a first input/output port 426a of the third feedback transmission filter, $f_4(w)$, 426 via an optical path J. A second input/output port 425b of the second feedback transmission filter 425 is coupled to an input/output port 430a of the second reflector 430 via an optical path H. A second input/output port 426b of the third feedback transmission filter 426 is coupled to an input/output port 429a of the first reflector 429 via an optical path K.

In operation, the output signal from the laser source 421 is filtered by the main transmission filter, $f_1(w)$, 423 and a portion of the filtered signal is tapped and a first portion thereof, carrying most of the signal power, is transmitted to the second power splitter 428 via optical path C, and a second portion thereof is sent to the first input/output port 424a of the first feedback transmission filter 424 via optical path F. In the second power splitter 428, a first portion of the received signal received at input/output port 428a, carrying most of the received signal power, is transmitted as the output signal from the system 420 via optical path D, and a second portion is sent to the second input/output port 424b of the first feedback transmission filter 424 via optical path E. Therefore the optical path for the main component of the output signal on optical path D comprises the optical paths A→B→C→D. The output signal has other components due to the presence of two cavities in the blue shift feedback stabilizing arrangement 422. A first cavity is between the first and second reflectors 429 and 430 an involves the optical paths of K→J→E→F→G→H. Each signal round trip in this cavity adds two components to the output signal on optical path D, where one component is added by the signal from reflector 429 being tapped in the second power splitter 428 and sent to optical path D, and the second component is added by the signal from reflector 430 being tapped in the first power splitter 427 and sent to optical path C and then to optical path D via the second power splitter 428. The other cavity comprises the optical paths H→G→C→E→F→G→H. Each signal round trip in this other cavity adds one component to the output signal on optical path D.

The feedback signal to the laser source 421 has two main components. The optical path for the first main component involves the optical paths A→B→C→E→F→B→A. The optical path for the second main component involves the optical paths A→B→F→E→C→B→A. These two components are in-phase with equal amplitudes. A signal round trip between the first and second reflectors 429 and 430 involving optical paths K→J→E→F→G→H adds two components to the feedback signal, and a signal round trip in the cavity with the second reflector 430 involving optical paths H→G→C→E→F→G→H adds one component to the feedback signal.

Spectral response curves obtained with the system 420. correspond to the spectral response curves 36 and 37 shown in FIG. 4, where curve 36 represents the Forward Filter Spectral response $F_o(w)$, and curve 37 represents the Feedback filter spectral response $F^f(w)$. The main transmission filter 423 [with the spectral response $f_1(w)$] and the first, second, and third feedback transmission filters 424, 425, and 426, respectively, [with the respective spectral response $f_2(w)$, $f_3(w)$, and $f_4(w)$] must be designed such that the desired forward and feedback spectral responses $F_o(w)$ and $F_f(w)$ are achieved by a proper choice of the individual spectral responses $f_1(w)$, $f_2(w)$, $f_3(w)$, and $f_4(w)$ coupling ratios, and cavity length. As indicated for prior systems (e.g., 90, and 110), all components and interconnects, except the output port 428b of the second power splitter 428, maintains the polarization state. Still further, one or more optional delay lines can be added between any two components in the path of the feedback signal. Additionally, the power splitter function for the first and second power splitters 427 and 428 can be achieved in different technology platforms such as planar waveguide technology using directional couplers (DC), multimode interference (MMI) couplers, asymmetric Y junctions, Mach-Zehnder interferometers, etc., and free space optics using thin film, etc. A same spectral response effect can be achieved in the blue shift feedback stabilizing arrangement 422 when one or both of the second and third feedback transmission filters 425 and 426 are replaced with Delay Lines 425 and 426 (not shown).

Figure 43:
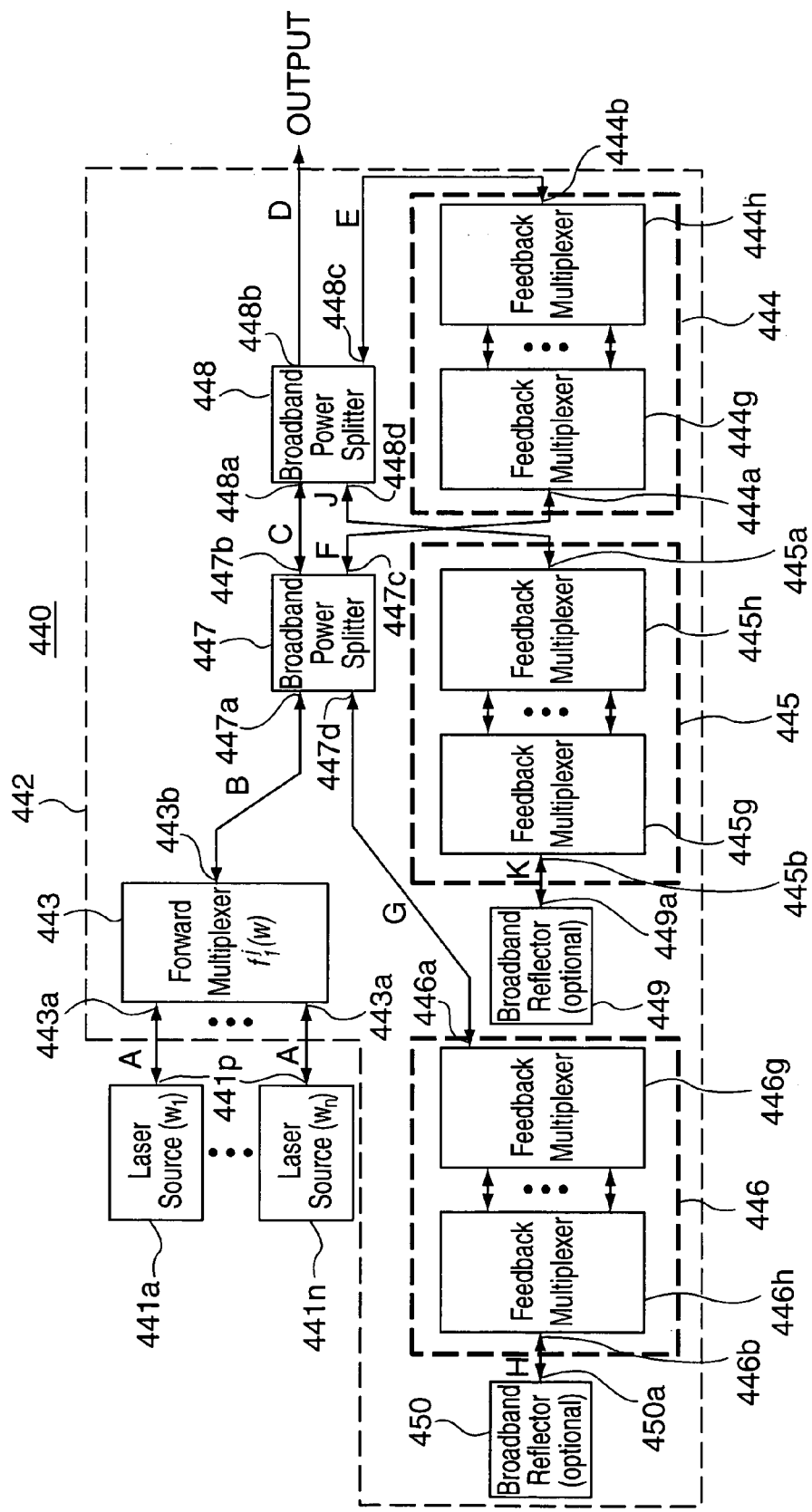
FIG. 43 shows a schematic of a system that implements the system of FIG. 42 for blue shift feedback stabilizing multiple radiation sources in accordance with fifth embodiment of the present invention.

Referring now to FIG. 43, there is shown a schematic of a system 440 that implements the system 420 of FIG. 42 for feedback stabilizing a plurality of n radiation sources [Laser Sources $w_1$ to $w_n$] 441a–441n (of which only radiation sources 441a and 441n are shown) in accordance with the fifth embodiment of the present invention. The system 440 comprises the plurality of n laser sources 441a–441n, and a blue shift feedback stabilizing arrangement 442 (shown within a dashed line enclosed area). The blue shift feedback stabilizing arrangement 442 comprises a forward multiplexer, $f_1^j(w)$, 443, a first feedback multiplexer arrangement, $f_2(w)$, 444 (shown within a dashed line rectangle), a second feedback multiplexer arrangement, $f_3(w)$ (shown within a dashed line rectangle), 445, a third feedback multiplexer arrangement, $f_4(w)$, 446 (shown within a dashed line rectangle), a first broadband power splitter 447, a second broadband power splitter 448, a first broadband reflector 449, and a second broadband reflector 450. The first feedback multiplexer arrangement, $f_2^j(w)$, 444 comprises cascaded feedback multiplexer 444g and feedback multiplexer 444h, and the second feedback multiplexer arrangement, $f_3^j(w)$, 445 comprises cascaded feedback multiplexer 445g and feedback multiplexer 445h, and the third feedback multiplexer arrangement, $f_4^j(w)$, 446 comprises cascaded feedback multiplexer 446g and feedback multiplexer 446h.

Each of the plurality of n laser sources 441a–441n is coupled from its front facet 441p to a corresponding one of a plurality of n first input/output ports 443a of the forward multiplexer 443 via an optical path A. A second input/output port 443b of the forward multiplexer 443 is coupled to a first input/output port 447a of the first broadband power splitter 447 via an optical path B. In the first power splitter 447, a second input/output port 447b thereof is coupled to a first input/output port 448a of the second broadband power splitter 448 via an optical path C, a third input/output port 447c is coupled to a first input/output port 444a of the first feedback multiplexer, $f_2(w)$, 444 via an optical path F, and a fourth input/output port 447d is coupled to a first input/output port 446a of the third feedback multiplexer, $f_3(w)$, 446 via an optical path G. In the second broadband power splitter 448, a second output port 448b thereof provides an output signal from the system 440 to any predetermined downstream device (not shown) via an optical path D, a third input/output port 448c thereof is coupled to a second input/output port 444b of the first feedback multiplexer, $f_2(w)$, 444 via an optical path E, and a fourth input/output port 448d thereof is coupled to a first input/output port 445a of the second feedback multiplexer, $f_4(w)$, 445 via an optical path J. A second input/output port 446b of the third feedback multiplexer 446 is coupled to an input/output port 450a of the second reflector 450 via an optical path H. A second input/output port 445b of the second feedback multiplexer 445 is coupled to an input/output port 449a of the first reflector 449 via an optical path K.

The operation of the system 440 is essentially the same as that described for the system 420 of FIG. 42 for the single laser source 421. The main difference between the systems 440 and 420 is that, in the system 440, the output signals from the plurality of n laser sources 441a–441n are multiplexed into a single multiplexed output signal by the forward multiplexer 443, and each of the first, second, and third feedback multiplexer arrangements 444, 445, and 446 first demultiplex a single input multiplexed signal received at a first side and then multiplex the demultiplexed signals to provide a single multiplexed output signal at the other side. The feedback stabilizing arrangement 442 also contains the first and second cavities as were described for the feedback stabilizing arrangement 422 of FIG. 42. The first cavity is the first and second reflectors 449 and 450 an involves the optical paths of K→J→E→F→G→H, and the other cavity comprises the optical paths H→C→E→F→G→H which add components to the output and feedback signals as was described for the cavities of FIG. 42.

The spectral responses obtained by the blue shift feedback stabilizing arrangement 442 is essentially the same as that shown in FIG. 6, where curves 46a–46n represent the forward filter spectral response $F_o(w)$, for each of the wavelengths generated by the corresponding one of the plurality of n laser sources 441a–441n, and curves 47a–47n represent the feedback filter spectral response $F_f(w)$ for each of the wavelengths fed back to the corresponding one of the plurality of n laser sources 441a–441n. The forward multiplexer 443 [with the spectral response $f_1^j(w)$] and the first, second, and third feedback transmission filters 444, 445, and 446, respectively, [with the respective spectral response $f_2^j(w)$, $f_3^j(w)$, and $f_4^j(w)$] must be designed such that the desired forward and feedback spectral responses $F_o(w)$ and $F_f(w)$ are achieved by a proper choice of the individual spectral responses $f_1^j(w)$, $f_2^j(w)$, $f_3^j(w)$, and $f_4^j(w)$ coupling ratios, and cavity length. As indicated for prior systems (e.g., 90, and 110), all components and interconnects, except the output port 448b of the second power splitter 448, maintains the polarization state. Still further, one or more optional delay lines can be added between any two components in the path of the feedback signal. Additionally, the power splitter function for the first and second power splitters 447 and 448 can be achieved in different technology platforms such as planar waveguide technology using directional couplers (DC), multimode interference (MMI) couplers, asymmetric Y junctions, Mach-Zehnder interferometers, etc., and free space optics using thin film, etc. A same spectral response effect can be achieved in the blue shift feedback stabilizing arrangement 422 when one or both of the second and third feedback transmission filters 445 and 446 are replaced with Delay Lines as is shown and described hereinafter in FIG. 44.

Figure 44:
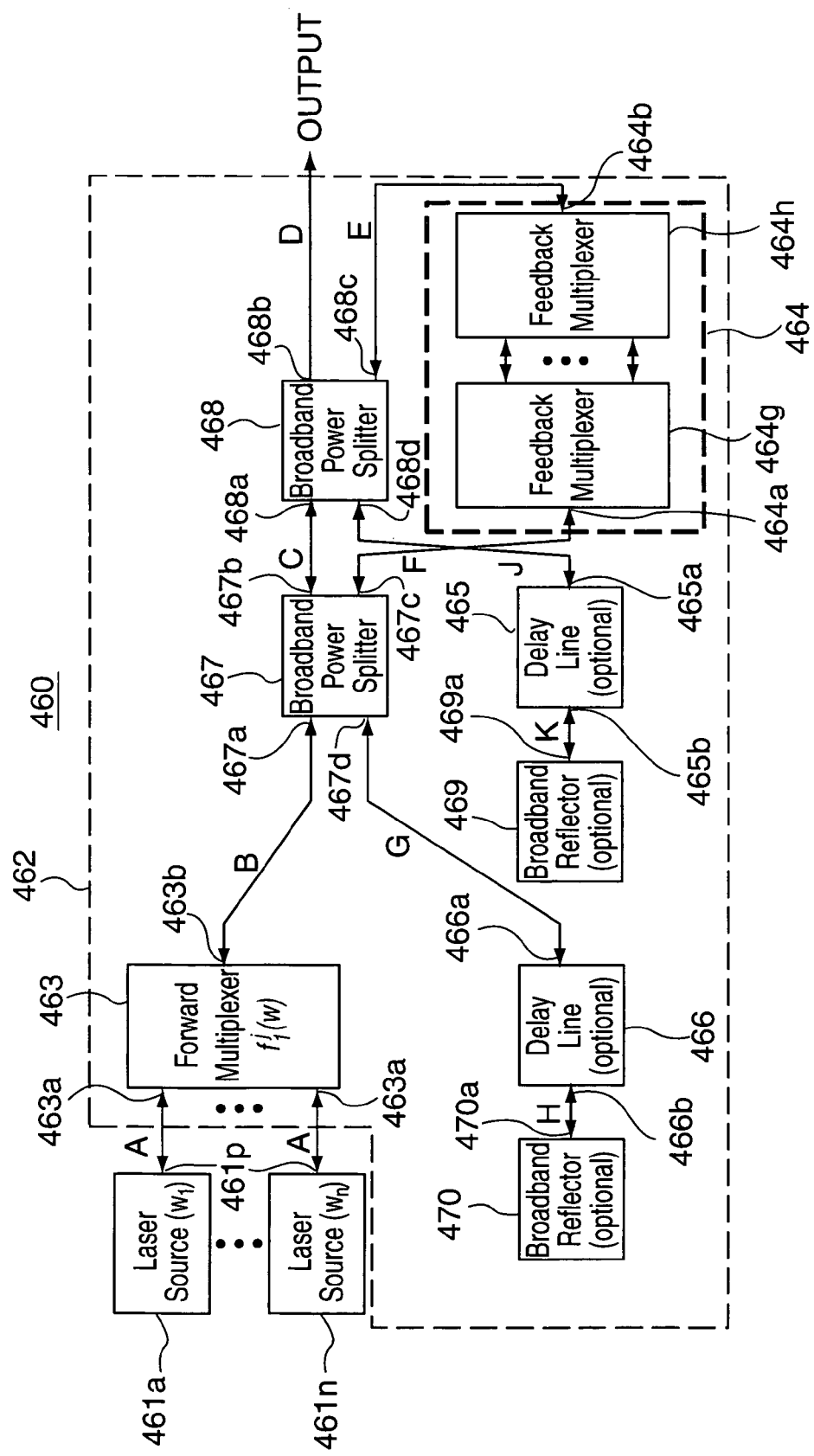
FIG. 44 shows a schematic of a system that implements the system of FIG. 42 for blue shift feedback stabilizing multiple radiation sources in accordance with the fifth embodiment of the present invention.

Referring now to FIG. 44, there is shown a system 460 similar to the system 440 of FIG. 43 for blue shift feedback stabilizing a plurality of n radiation sources [Laser Sources ($w_1$ to $w_n$)] 461a–461n (of which only radiation sources 461a and 461n are shown) in accordance with the fifth embodiment of the present invention. The system 460 comprises the plurality of n laser sources 461a–461n, and a blue shift feedback stabilizing arrangement 462 (shown within a dashed line enclosed area). The blue shift feedback stabilizing arrangement 462 comprises a forward multiplexer, $f_1^j(w)$, 463, a first feedback multiplexer arrangement, $f_2(w)$, 464 (shown within a dashed line rectangle), a first optional delay line 465, a second optional delay line 466, a first broadband power splitter 467, a second broadband power splitter 468, a first broadband reflector 469, and a second broadband reflector 470. The first feedback multiplexer arrangement, $f_2^j(w)$, 464 comprises cascaded feedback multiplexer 464g and feedback multiplexer 464h. The interconnection of the devices of the system 460 is the same as that of the system 440 of FIG. 43 except that the first and second delay lines 465 and 466 replace the second and third feedback multiplexers 425 and 426 of the system 440 FIG. 43. The operation and spectral responses of the system 460 correspond to the operation and spectral responses obtained by the system 440 of FIG. 43.

Figure 45:
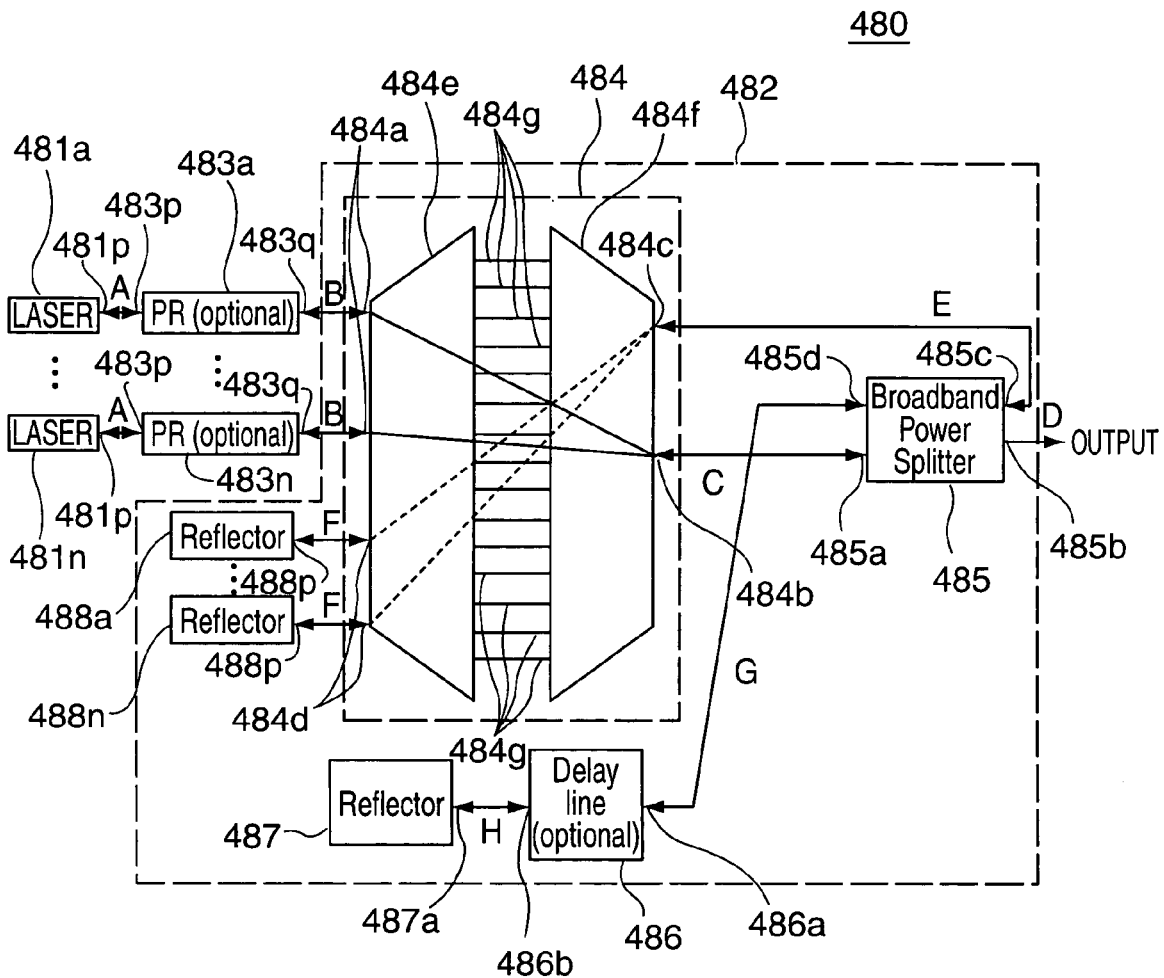
FIG. 45 shows a schematic of a system for blue shift feedback stabilizing multiple radiation sources in accordance with the fifth embodiment of the present invention.

Referring now to FIG. 45, there is shown a schematic of a system 480 providing a same functioning as found in the system 330 of FIG. 33 for blue shift feedback stabilizing a plurality of n radiation pump sources (Laser) 481a–481n (of which only lasers 481a and 481n are shown) in accordance with the fifth embodiment of the present invention. The system 480 comprises the plurality of n laser radiation sources (lasers) 481a–481n, a plurality of n optional polarization rotators (PR) 483a–483n (of which only PR 483a and 483n are shown), and a blue shift feedback stabilizing arrangement 482 (shown within a dashed line enclosed area). The blue shift feedback stabilizing arrangement 482 comprises an Arrayed Waveguide Grating (AWG) multiplexer 484, a broadband power splitter 485, an optional delay line 486, a first reflector 487, and a plurality of n second reflectors 488a–488n (of which only reflectors 488a and 488n are shown). The AWG multiplexer 484 comprises a first Free Propagating Region (FPR) 484e, a second FPR 484f, and a plurality of optical paths 484g interconnecting the first and second FPRs 484e and 484f as is well known in the art. Each of the plurality of laser sources 481a–481n is coupled at a front facet 481p thereof to an input/output port 483p of a corresponding one of the plurality of n optional polarization rotators (PR) 483a–483n via an optical path A. An input/output port 483q each of the optional PRs 483a–483n is coupled to a corresponding one of a plurality of n input/output ports 484a of the AWG multiplexer 484 via an optical path B. A second input/output port 484b of the AWG multiplexer 484 is coupled to a first input/output port 485a of the broadband power splitter 485 via an optical path C. In the power splitter 485, a second output port 485b thereof provides an output signal from the system 480 to any predetermined downstream device (not shown) via an optical path D, a third input/output port 485c thereof is coupled to a third input/output port 484c of the AWG multiplexer 484 via an optical path E, and a fourth input/output port 485d thereof is coupled to a first input/output port 486a of the optional delay line 486 via an optical path G. A second input/output port 486b of the delay line 486 is coupled to an input/output port 487a of the first reflector 487 via an optical path H. Each of a plurality of n fourth input/output ports 484d of the AWG multiplexer 484 is coupled to an input/output port 488p of a corresponding one of the plurality of n second reflectors 488a–488n. The AWG multiplexer 484 can be replaced by an Eschelle grating that provides essentially the same function as the AWG multiplexer 484.

In operation, the optical signal from each of the lasers 481–481n is transmitted via optical path A to the corresponding one of the plurality of n optional polarization rotators (PRs) 483a–483n. The optional PRs 483a–483n are included to rotate a laser output state of polarization (TE or TM or vice versa). Depending on the application of the system 480 and the number of PRs 483a–483n used, the input signals to the AWG multiplexer 484 may have the same polarization state (all TE or all TM) or different states of polarizations. For some applications such as Raman amplification, the polarization states of the adjacent ports (in the wavelength domain) must be orthogonal (TE and TM polarizations) to reduce a degree of polarization (DoP) and, therefore, reduce or eliminate the Raman amplification polarization dependent gain (PDG). Where there are even numbers of lasers 481a–481n in such application, they are grouped in pairs. The system 480 can be designed such that the resulting stabilized wavelengths of each pair of lasers of the lasers 481a–481n with orthogonal polarizations are exactly the same, or there is a slight shift between the two wavelengths.

In the AWG multiplexer 484 each of the received signals at the first input/output ports 484a via optical path B is filtered and multiplexed with other input signals from the other lasers 481a–481n, and is routed to the second input/output port 484b thereof and sent to the first input/output port 485a of the broadband power splitter 485 via optical path C. The filter spectral response between ports 484a and 484b in the AWG multiplexer 484 is $f_1^j(w)$ for a jth port which effectively represents any one of the plurality of n input/output ports 484a. In the power splitter 485, the multiplexed signal received at input/output port 485a is tapped and a major portion of the tapped signal is routed to the second output port 485b as the main output signal from the system 480 and the other portion is transmitted via the third input/output port 468c and optical path E to the third input/output port 484c of the AWG multiplexer 484 to be filtered and demultiplexed into their plurality of n wavelength signals and routed to the corresponding one the plurality of n input/output ports 484d. In the AWG multiplexer 484 the spectral response between the third input/output port 485c and the fourth input/output ports 484d, in either direction, is $f_2^j(w)$. Each of the demultiplexed signals is sent to the corresponding one of the plurality of n second reflectors 488a–488n and returned via the corresponding fourth and third input/output ports 484d and 484c in the AWG multiplexer 484 where the signals are filtered and multiplexed and then transmitted to the input/output ports 485c of the power splitter 485. In the power splitter 485 the reflected signal is tapped and a first portion is routed to the first input/output port 485a. A second portion of the reflected signal is routed to the fourth input/output port 485d and through the optional delay line 486 to the first reflector 487 via optical paths G and H. The reflected signal from the first reflector 487 is returned to the fourth input/output port 485d of the power splitter 485 and tapped where first and second portions thereof are routed to the second and third ports 485b and 485c. The first portion of the tapped signal from the third input/output port 485c is transmitted back through the AWG multiplexer 484 and the lasers 481a–481n via optical paths C→B→A and second portion is routed to the first reflector 487 via optical paths G→H.

The main output signal from the second output port 485b of the power splitter 485 has one main component obtained from the propagation of output signals from the lasers 481a–481n via optical paths A→B→C→D includes the spectral response of $f_1^j(w)$ caused by the AWG multiplexer 484. The output signal has other components due to the presence of a cavity between the first reflector 487 and the plurality of second reflectors 488a–488n including the optical paths F→E→G→H. Each signal round trip in the cavity adds one component to the output signal at output port 485b of the power splitter 485. The feedback signal has one main component involving the optical paths of A→B→C→E→F→E→C→B→A. Each round trip in the cavity adds one component to the feedback signal.

The spectral responses obtained by the blue shift feedback stabilizing arrangement 482 is essentially the same as that shown in FIG. 6, where curves 46a–46n represent the forward filter spectral response $F_o(w)$, for each of the wavelengths generated by the corresponding one of the plurality of n laser sources 441a–441n, and curves 47a–47n represent the feedback filter spectral response $F_f(w)$ for each of the wavelengths fed back to the corresponding one of the plurality of n laser sources 481a–481n. The AWG multiplexer 484, $f_1^j(w)$ and $f_2^j(w)$, is designed such that the center wavelength of a Feedback filter spectral response for a jth port, $F_f^j(w)$, (not shown in FIG. 6) is shifted by δw toward the shorter wavelength with regard to the center wavelength of the Forward filter spectral response for the jth port, $F_o^j(w)$. The wavelength shift [(δw) or blue shift] and their respective bandwidth can be controlled through the design of the AWG multiplexer 484. As indicated for prior systems (e.g., 90, and 110), all components and interconnects, except the output port 485b of the broadband power splitter 485, maintains the polarization state. Still further, one or more optional delay lines can be added between any two components in the path of the feedback signal.

Figure 46:
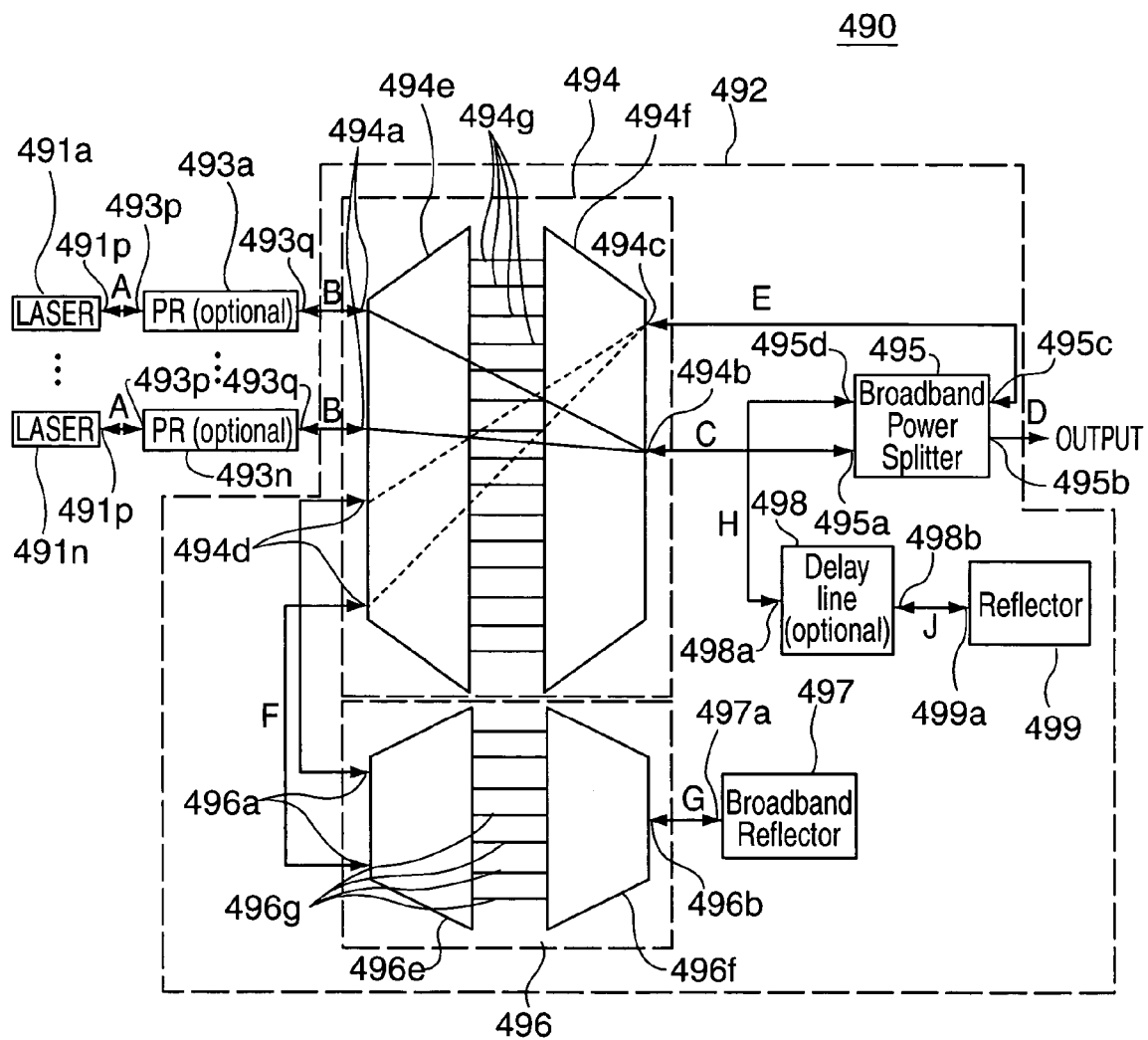
FIG. 46 shows a schematic of a system for blue shift feedback stabilizing multiple radiation sources in accordance with the fifth embodiment of the present invention.

Referring now to FIG. 46, there is shown a schematic of a system 490 as an alternative arrangement to the system 480 of FIG. 45 for blue shift feedback stabilizing a plurality of n radiation sources (laser) 491a–491n in accordance with a fifth embodiment of the present invention. The system 490 comprises the plurality of n lasers 491a–491n of which only 491a and 491n are shown, a plurality of n optional polarization rotators (PR) 493a–493n, and a blue shift feedback stabilizing arrangement 492. The blue shift feedback stabilizing arrangement 492 comprises a first Arrayed Waveguide Grating (AWG) multiplexer 494, a broadband power splitter 495, a second AWG multiplexer 496, a first broadband reflector 497, an optional delay line 498, and a second reflector 499. The first AWG multiplexer 494 comprises a first Free Propagating Region (FPR) 494e, a second FPR 494f, and a plurality of optical paths 494g interconnecting the first and second FPRs 494e and 494f as is well known in the art. Similarly, the second AWG multiplexer 496 comprises a first Free Propagating Region (FPR) 496e, a second FPR 496f, and a plurality of optical paths 496g interconnecting the first and second FPRs 496e and 496f. Each of the plurality of laser sources 491a–491n is coupled at a front facet 491p thereof to an input/output port 493p of a corresponding one of the plurality of n optional polarization rotators (PR) 493a–493n via an optical path A. An input/output port 493q each of the optional PRs 493a–493n is coupled to a corresponding one of a plurality of n input/output ports 494a of the AWG multiplexer 494 via an optical path B. A second input/output port 494b of the AWG multiplexer 494 is coupled to a first input/output port 495a of the broadband power splitter 495 via an optical path C.

In the power splitter 495, a second output port 495b thereof provides an output signal from the system 490 to any predetermined downstream device (not shown) via an optical path D, a third input/output port 495c thereof is coupled to a third input/output port 494c of the AWG multiplexer 494 via an optical path E, and a fourth input/output port 495d thereof is coupled to a first input/output port 498a of the optional delay line 498 via an optical path H. A second input/output port 498b of the delay line 498 is coupled to an input/output port 499a of the second reflector 499 via an optical path J. Each of a plurality of n fourth input/output ports 494d of the AWG multiplexer 494 is coupled to a corresponding one of a plurality of n input/output port 496a of the second AWG multiplexer 496. A second input/output port 496b of the second AWG multiplexer 496 is coupled to an input/output port 497a of the first broadband reflector 497. The AWG multiplexer 484 can be replaced by an Eschelle grating that provides essentially the same function as the AWG multiplexer 484. The only difference between the feedback stabilizing arrangement 480 of FIG. 45 and the feedback stabilizing arrangement 490 of FIG. 46 is that the plurality of n reflectors 488a–488n of FIG. 45 have been replaced by the second AWG multiplexer 496 and a single broadband reflector 497 of FIG. 46. The operation and spectral responses obtained with the feedback stabilizing arrangement 490 is essentially the same as that provided by the feedback stabilizing arrangement 480 of FIG. 45 and will not be repeated here. As indicated for prior systems (e.g., 90, and 110), all components and interconnects, except the output port 495b of the broadband power splitter 495, maintains the polarization state. Still further, one or more optional delay lines can be added between any two components in the path of the feedback signal.

Figure 47:
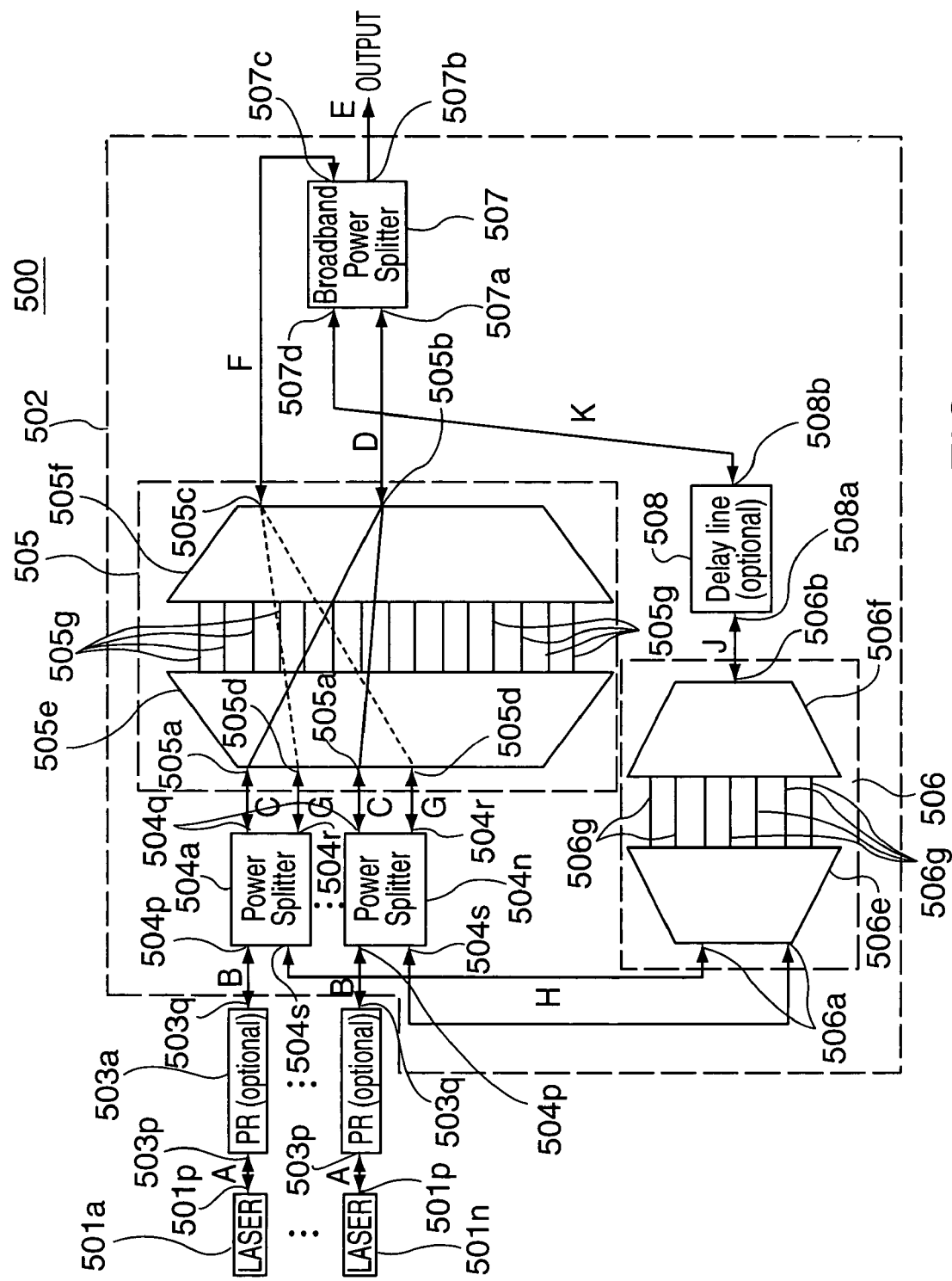
FIG. 47 shows a schematic of a system for blue shift feedback stabilizing multiple radiation sources in accordance with the fifth embodiment of the present invention.

Referring not to FIG. 47, there is shown a schematic of a system 500 for feedback stabilizing a plurality of n radiation sources (laser) 501a–501n (of which only lasers 501a and 501n are shown) in accordance with the fifth embodiment of the present invention. The system 500 comprises the plurality of n lasers 501a–501n, a plurality of n polarization rotators (PR) 503a–503n (of which only PRs 503a and 503n are shown), and a blue shift feedback stabilizing arrangement 502 (shown within a dashed line enclosed area. The blue shift feedback stabilizing arrangement 502 comprises a plurality of n first power splitters 504a–504n (of which only power splitters 504a and 504n are shown), a first Arrayed Waveguide Grating (AWG) multiplexer 505, a second AWG multiplexer 506, a second broadband power splitter 507, and an optional delay line 508. The first AWG multiplexer 505 comprises a first Free Propagating Region (FPR) 505e, a second FPR 505f, and a plurality of optical paths 505g interconnecting the first and second FPRs 505e and 505f as is well known in the art. Similarly, the second AWG multiplexer 506 comprises a first Free Propagating Region (FPR) 506e, a second FPR 506f, and a plurality of optical paths 506g interconnecting the first and second FPRs 506e and 506f. Each of the plurality of laser sources 501a–501n is coupled at a front facet 501p thereof to a first input/output port 503p of a corresponding one of the plurality of n optional polarization rotators (PR) 503a–503n via an optical path A. A second input/output port 503q of each of the optional PRs 503a–503n is coupled to a first input/output port 504p of a corresponding one of the plurality of n first power splitters 504a–504n via an optical path B. In each of the plurality of n first power splitters 504a–504n, a second input/output port 504q is coupled to a corresponding one of a plurality of n first input/output ports 505a of the first AWG multiplexer 505 via an optical path C, a third input/output port 504r is coupled to a corresponding one of a plurality of n fourth input/output ports 505d AWG multiplexer 505 via an optical path G, and a fourth input/output port 504s is coupled to a corresponding one of a plurality of n first input/output ports 506a of the second AWG multiplexer 506 via an optical path H. A second input/output port 505b of the first AWG multiplexer 505 is coupled to a first input/output port 507a of the second power splitter 507 via an optical path D. In the second power splitter 507, a second output port 507b provides an output signal from the system 500 to any predetermined downstream device (not shown) via an optical path E, a third input/output port 507c thereof is coupled to a third input/output port 505c of the first AWG multiplexer 505 via an optical path F, and a fourth input/output port 507d thereof is coupled to a second input/output port 508b of the optional delay line 508 via an optical path K. A first input/output port 508a of the delay line 508 is coupled to a second input/output port 506b of the second AWG multiplexer 506 via an optical path J. The first and second AWG multiplexers 505 and 506 can be replaced by an Eschelle grating that provides essentially the same function as the AWG multiplexers 505 and 506.

In operation, the output signals from the lasers 501a–501n are optionally polarization rotated by the PRs 503a–503n and transmitted to the plurality of n first power splitters 504a–504n. In the first power splitters 504a–504n, the received signal from the corresponding one of the PRs 503a–503n is tapped and a first major portion is transmitted via second input/output port 504q to the corresponding one of the first input/output ports 505a of the first AWG multiplexer 505 for transmission to the first input/output port 507a of the second power splitter 507 via optical paths C and D. The spectral response in the AWG multiplexer 505 between the input/output ports 505a and 505b is $f_1^j(w)$. A second portion of the tapped signal is transmitted via a third input/output port 504r to the corresponding one of the fourth input/output ports 505d for transmission to the third input/output port 507c of the second power splitter 507 via optical paths G and F. In the second power splitter 507, the first portion received at input/output port 507a is tapped and a first major portion thereof is routed to the second output port 507b as the main output signal from the system 500 via optical path E, and the other portion thereof is transmitted via the third input/output port 507c to the third input/output port 505c of the first AWG multiplexer 505 to be filtered and demultiplexed into the individual plurality of n wavelength signals and routed to the corresponding one the plurality of n first power splitters 504a–504n via optical paths F and G. The spectral response in the first AWG multiplexer 505 between the input/output ports 505c and 505d is $f_2^j(w)$.

In the second power splitter 507, the second portion received at the third input/output port 507c is tapped and a first portion thereof is routed through the first AWG multiplexer 505 via optical path D, where it is filtered and demultiplexed, and each demultiplexed signal is routed to the corresponding one of the first power splitters 504a–504n via optical path C. The other portion is routed through the optional delay line 508 and to the second port 506b of the second AWG multiplexer 506 via optical paths K and J where the signal is demultiplexed and each of the demultiplexed signals is routed via optical path H to the corresponding one of the first power splitters 504a–504n where they are tapped and both portions are sent back through the first AWG multiplexer 504. The spectral response in the second AWG multiplexer 506 between the input/output ports 506b and 506a is $f_3^j(w)$.

The feedback stabilizing arrangement 502 includes a twisted loop reflector arrangement comprising the optical paths C→F→K→J→H→C. The feedback signal at the front facet 501p of each of the lasers 501a–501n comprises two main in-phase components with equal amplitudes. One component is obtained via the optical paths A→B→C→D→F→D→F→G→B→A, and the other component is obtained via the optical paths A→B→G→F→D→C→B→A. Each of the tapped signals in the plurality of n first power splitters 504a–504n is multiplexed and demultiplexed by the first and second AWG multiplexers 505 and 506. Each signal round trip in the twisted loop reflector arrangement contributes an additional component to the feedback signal to the lasers 501a–501n as well as the output signal on optical path E. The purpose of selectively adding multiple components into a feedback signal is to provide the conditions that cause each of the plurality of lasers 501a–501n to enter into coherence collapse mode of operation and the laser output signal to become very stable. The spectral responses obtained by the blue shift feedback stabilizing arrangement 502 is essentially the same as that shown in FIG. 6, where curves 46a–46n represent the forward filter spectral response $F_o(w)$, for each of the wavelengths generated by the corresponding one of the plurality of n laser sources 501a–501n, and curves 47a–47n represent the feedback filter spectral response $F_f(w)$ for each of the wavelengths fed back to the corresponding one of the plurality of n laser sources 501a–501n. As indicated for prior systems (e.g., 90, and 110), all components and interconnects, except the output port 507b of the broadband power splitter 507, maintains the polarization state. Still further, one or more optional delay lines (not shown) can be added between any two components in the path of the feedback signal.

Figure 48:
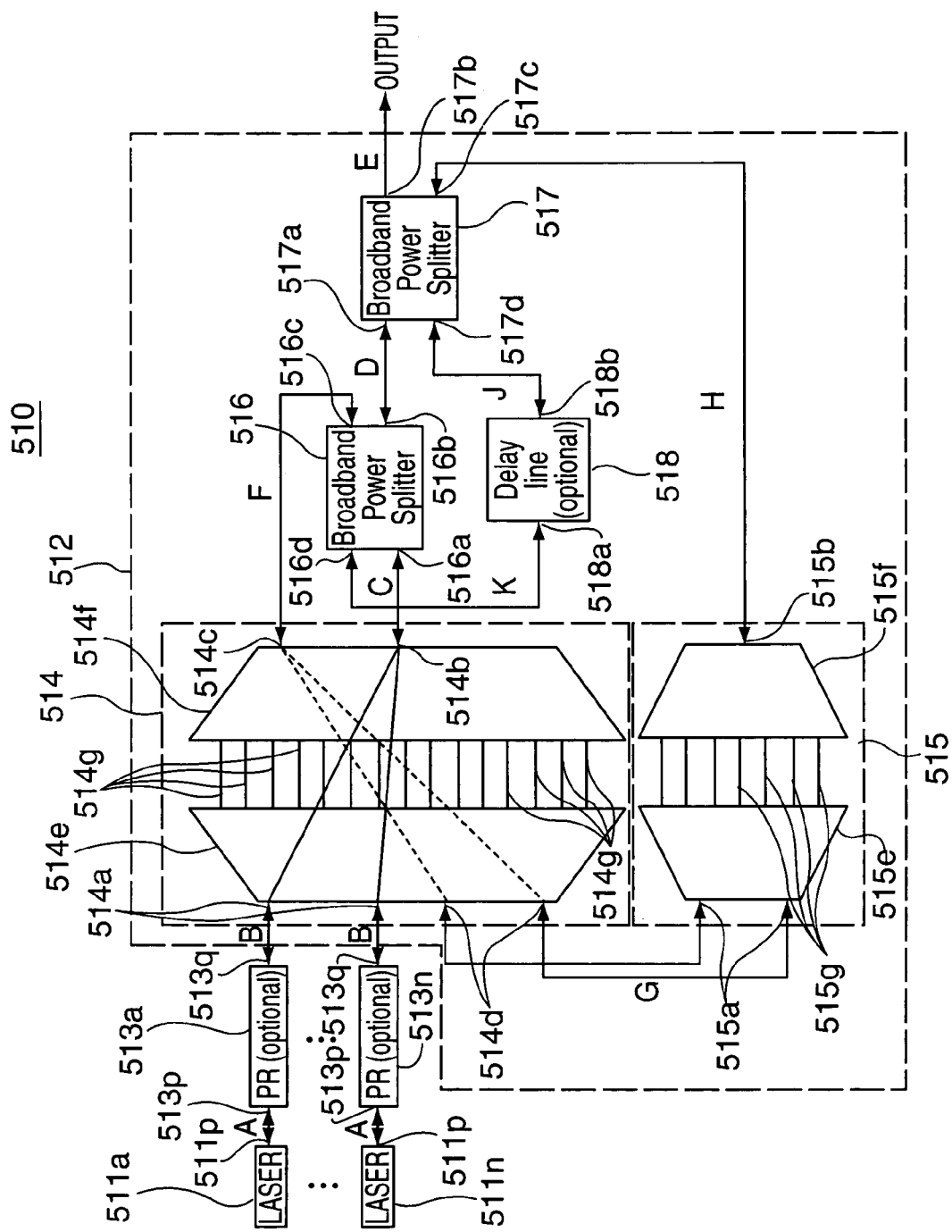
FIG. 48 shows a schematic of a system for blue shift feedback stabilizing multiple radiation sources in accordance with the fifth embodiment of the present invention.

Referring now to FIG. 48, there is shown a schematic of a system 510 for feedback stabilizing a plurality of n radiation sources (laser) 511a–511n (of which only lasers 511a and 511n are shown) in accordance with the fifth embodiment of the present invention. The system 510 comprises the plurality of n lasers 511a–511n, a plurality of n polarization rotators (PR) 513a–513n (of which only PRs 513a and 513n are shown), and a blue shift feedback stabilizing arrangement 512 (shown within a dashed line enclosed area). The blue shift feedback stabilizing arrangement 512 comprises a first Arrayed Waveguide Grating (AWG) multiplexer 514, a second AWG multiplexer 515, a first broadband power splitter 516, a second broadband power splitter 517, and an optional delay line 518. The first AWG multiplexer 514 comprises a first Free Propagating Region (FPR) 514e, a second FPR 514f, and a plurality of optical paths 514g interconnecting the first and second FPRs 514e and 514f as is well known in the art. Similarly, the second AWG multiplexer 515 comprises a first Free Propagating Region (FPR) 515e, a second FPR 515f, and a plurality of optical paths 515g interconnecting the first and second FPRs 515e and 515f. Each of the plurality of laser sources 511a–511n is coupled at a front facet 511p thereof to an input/output port 513p of a corresponding one of the plurality of n optional polarization rotators (PR) 513a–513n via an optical path A. An input/output port 513q each of the optional PRs 513a–513n is coupled to a corresponding one of a plurality of n input/output ports 515a of the first AWG multiplexer 515 via an optical path B. A second input/output port 514b of the first AWG multiplexer 515 is coupled to a first input/output port 516a of the first power splitter 516 via an optical path C.

In the first power splitter 516, a second input/output port 516b is coupled to a first input/output port 517a of the second power splitter 517, a third input/output port 516c is coupled to a third input/output port 514c of the first AWG multiplexer 514 via an optical path F, and a fourth input/output port 516d thereof is coupled to a first input/output port 518a of the optional delay line 518. In the second power splitter 517, a second output port 517b provides an output signal from the system 510 to any predetermined downstream device (not shown) via an optical path E, a third input/output port 517c thereof is coupled to a second input/output port 515b of the second AWG multiplexer 515 via an optical path H, and a fourth input/output port 517d thereof is coupled to a second input/output port 518b of the optional delay line 518 via an optical path J. Each of a plurality of n first input/output ports 515a of the second AWG multiplexer 515 is coupled to a corresponding one of a plurality of n input/output ports 514d of the first AWG multiplexer 514. Each of the AWG multiplexers 514 and 515 can be replaced by an Eschelle grating that provides essentially the same function as the AWG multiplexer 514 and 515.

In operation, optical signals from the lasers 511a–511n go through the optional polarization rotators (PR) 513a–513n to rotate the signal state of polarization as required. Each of the signals from the PRs 513a–513n is filtered and multiplexed with the signals from the other laser 511a–511n in the first AWG multiplexer 514. The multiplexed signal from the second input/output port 514b of the first AWG multiplexer 514 propagates through the first and second power splitters 516 and 517 to tap a portion of the multiplexed signal for feedback purposes, and a major portion of the signal is routed as the main output signal from the system 510 on optical path D. A twisted loop arrangement is implemented in the feedback stabilizing arrangement 512 after the output signals from the lasers 511a–511n have been multiplexed in the first multiplexer 514 using the optical paths F→G→H→J→K→F. A feedback signal at the front facet 511p of each one of the laser 511a–511n comprises two main in-phase components with equal amplitudes. One component is obtained via the optical paths A→B→C→F→G→H→D→C→B→A, and the other component is obtained via the optical paths A→B→C→D→H→G→F→C→B→A. Each signal round trip in the twisted loop arrangement contributes an additional component to the feedback signal as well as the main output signal on optical path D.

The filter spectral response between the input/output ports 514a and 514b of the first AWG multiplexer 514 is $f_1^j(w)$ for a jth port, while the filter spectral response between the input/output ports 514c of the first AWG multiplexer 514 and the second input/output port 515b of the second AWG multiplexer is $f_2(w)$. The spectral responses obtained by the blue shift feedback stabilizing arrangement 512 is essentially the same as that shown in FIG. 6, where curves 46a–46n represent the forward filter spectral response $F_o(w)$, for each of the wavelengths generated by the corresponding one of the plurality of n laser sources 511a–511n, and curves 47a–47n represent the feedback filter spectral response $F_f(w)$ for each of the wavelengths fed back to the corresponding one of the plurality of n laser sources 511a–511n. The first and second AWG multiplexers 514 and 515 are each designed such that the center wavelength of the feedback spectral response for the jth port $F_f^j(w)$ is slightly shifted by an amount $\delta w^j$ toward a shorted wavelength with respect to a center wavelength of the Forward filter spectral response $F_o^j(w)$ for the jth port. As indicated for prior systems (e.g., 90, and 110), all components and interconnects, except the output port 517b of the broadband power splitter 517, maintains the polarization state. Still further, one or more optional delay lines (not shown) can be added between any two components in the path of the feedback signal.

Figure 49:
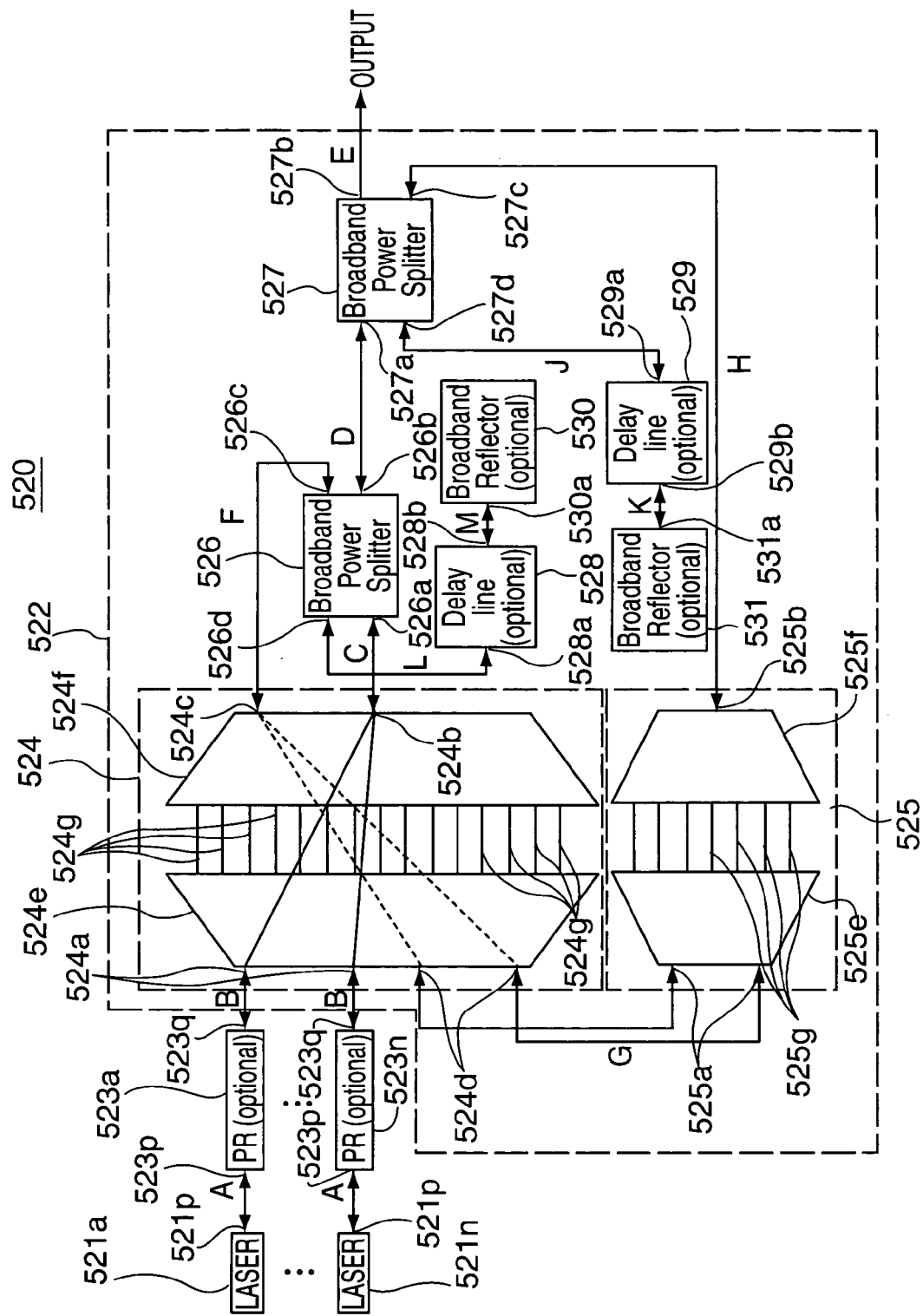
FIG. 49 shows a schematic of a system for blue shift feedback stabilizing multiple radiation sources in accordance with the fifth embodiment of the present invention.

Referring now to FIG. 49, there is shown a schematic of a system 520 for blue shift feedback stabilizing a plurality of n radiation sources (LASER) 521a–521n (of which only lasers 521a and 521n are shown) in accordance with the fifth embodiment of the present invention. The system 520 comprises the plurality of n lasers 521a–521n, a plurality of n optional polarization rotators (PR) 523a–523n, and a blue shift feedback stabilizing arrangement 522 (shown within a dashed line enclosed area). The blue shift feedback stabilizing arrangement 522 comprises a first Arrayed Waveguide Grating (AWG) multiplexer 524, a second AWG multiplexer 525, a first broadband power splitter 526, a second broadband power splitter 527, a first optional delay line 528, a second optional delay line 529, a first optional broadband reflector 530, and a second optional broadband reflector 531. The first AWG multiplexer, $f_1^j(w)$, 524 comprises a first Free Propagating Region (FPR) 524e, a second FPR 524f, and a plurality of optical paths 524g interconnecting the first and second FPRs 524e and 524f as is well known in the art. Similarly, the second AWG multiplexer 525 comprises a first Free Propagating Region (FPR) 525e, a second FPR 525f, and a plurality of optical paths 525g interconnecting the first and second FPRs 525e and 525f. The devices of the feedback stabilizing arrangements 512 of FIG. 48 and the present 522 are essentially connected in a same manner except that the direct interconnection via the optional delay line 518 between the fourth output ports 516d and 517d of the first and second power splitters 516 and 517 of the feedback stabilizing arrangement 512 is replaced in the feedback stabilizing arrangement 522 by separate optical paths L and M including the delay line 528 and reflectors 530, and J and K including the delay line 529 and reflectors 531.

In operation, the output wavelength signal (w) from each of the lasers 521a–521n is transmitted through a corresponding one of the plurality of n optional PRs 523a–523n to rotate the signal state of polarization. This signal is then filtered and multiplexed with the other lasers 521a–521n in the AWG multiplexer 524 and transmitted through a first and second broadband power splitter 526 and 527 to tap a first portion of the multiplexed signal for feedback purposes, and route a major portion of the multiplexed signal to the output port 527b of the second power splitter 527 as the main output signal from the system 520. The feedback stabilizing arrangement 522 contains a cavity between the first and second reflectors 530 and 531 via optical paths M→L→F→G→H→J→K. The feedback signal received at the front facet 521p of each of the lasers 521a–521n comprises two main in-phase components with equal amplitudes. One component is obtained via optical paths A→B→C→F→G→H→D→C→B→A while the other component is obtained via the optical paths A→B→C→D→H→G→F→C→B→A. The tapped signals in the cavity is multiplexed and demultiplexed by the AWG multiplexers 524 and 525. Each signal round trip in the cavity contributes two additional components to feedback signal as well as the main output signal on optical path E.

The spectral response for a jth wavelength between the input/output ports 524c of the first AWG multiplexer 524 and the input/output port 527b of the second AWG multiplexer 525 is $f_2^j(w)$. The spectral responses obtained by the blue shift feedback stabilizing arrangement 522 is essentially the same as that shown in FIG. 6, where curves 46a–46n represent the forward filter spectral response $F_o(w)$, for each of the wavelengths generated by the corresponding one of the plurality of n laser sources 521a–521n, and curves 47a–47n represent the feedback filter spectral response $F_f(w)$ for each of the wavelengths fed back to the corresponding one of the plurality of n laser sources 521a–521n. The AWG multiplexers 524 and 525 are designed such that a center wavelength of the Feedback filter spectral response for the jth port, $F_f^j(w)$, is slightly shifted by an amount $\delta w^j$ toward a shorter wavelength with respect to the center wavelength of the Forward filter spectral response of port j of $F_o^j(w)$.

As indicated for prior systems (e.g., 90, and 110), all components and interconnects, except the output port 527b of the broadband power splitter 527, maintains the polarization state. Still further, one or more optional delay lines (not shown) can be added between any two components in the path of the feedback signal.

Figure 50:
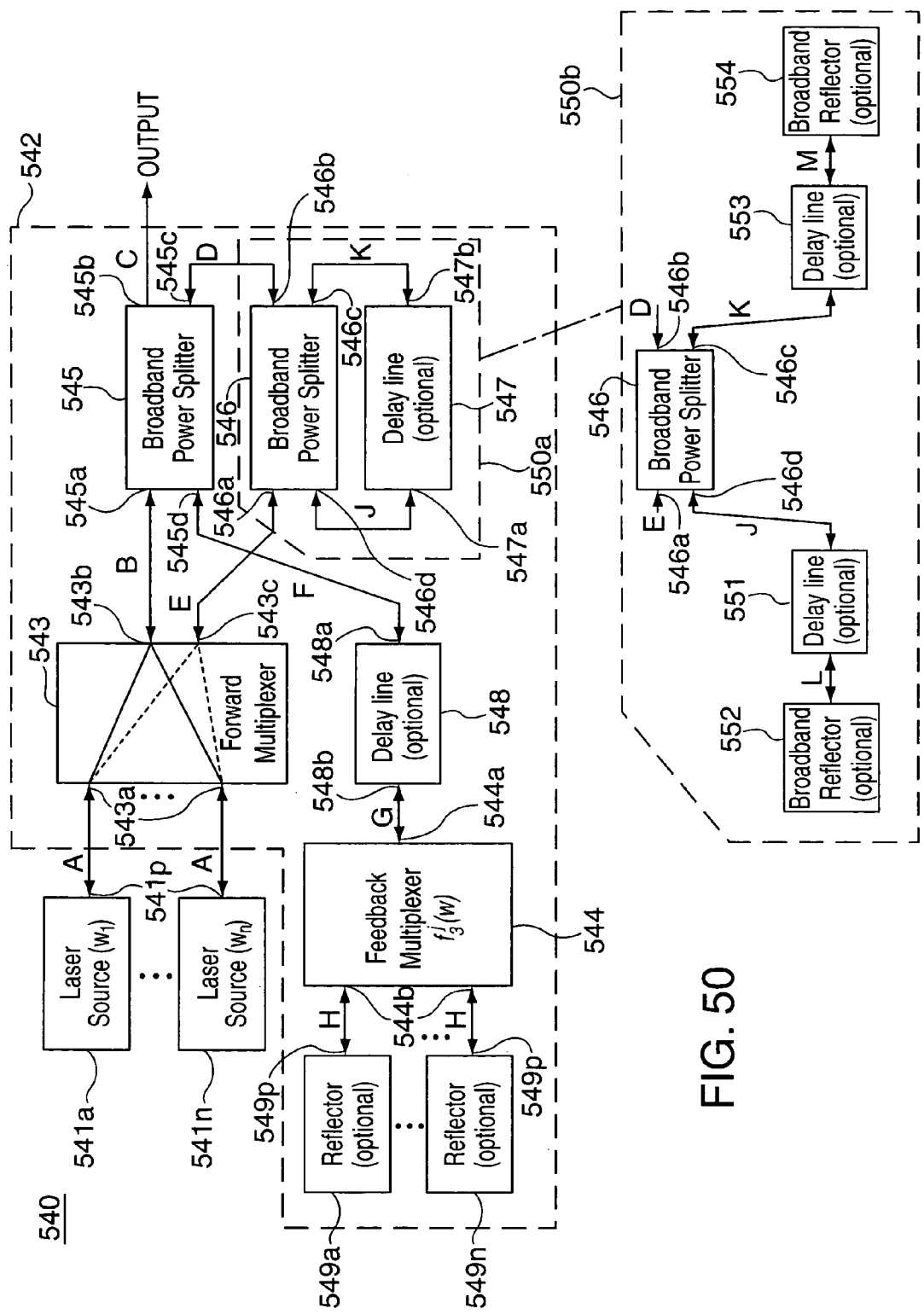
FIG. 50 shows a schematic of a system for blue shift feedback stabilizing multiple radiation sources in accordance with the fifth embodiment of the present invention.

Referring now to FIG. 50, there is shown a schematic of a system 540 that is similar to the system 70 of FIG. 8 for blue shift stabilizing a plurality of n radiation sources [Laser Sources ($w_1$ to $w_n$)] 541a–541n (of which only laser sources 541a and 541n are shown) in accordance with the fifth embodiment of the present invention. The system 540 comprises the plurality of n laser sources 541a–541n and a blue shift feedback stabilizing arrangement 542 (shown within a dashed line enclosed area). The blue shift feedback stabilizing arrangement 542 comprises a forward multiplexer 543, a feedback multiplexer, $f_3^j(w)$, 544, a first broadband power splitter 545, a first optional delay line 548, a plurality n optional reflectors 549a–549n (of which only reflectors 549a and 549n are shown), and a loop arrangement 550a (shown within a dashed line area) comprising a broadband power splitter 546 and a second optional delay line 547. Each of the plurality of laser sources 541a–541n is coupled at a front facet 541p thereof to a corresponding one of a plurality of n first input/output port 543a of the forward multiplexer 543 via an optical path A. A second input/output port 543b of the forward multiplexer 543 is coupled to a first input/output port 545a of the first broadband power splitter 545 via an optical path B. In the first power splitter 545, a second output port 545b thereof provides an output signal from the system 540 to any predetermined downstream device (not shown) via an optical path C, a third input/output port 545c thereof is coupled to a second input/output port 546b of the second broadband power splitter 546 of the loop arrangement 550a via an optical path D, and a fourth input/output port 545d thereof is coupled to a first input/output port 548a of the second optional delay line 548 via an optical path F. In the loop arrangement 550a, a first input/output port 546a of the second broadband power splitter 546 is coupled to a third input/output port 543c of the forward multiplexer 543 via an optical path E, and third and fourth input/output ports 546c and 546d are coupled to a second and first input/output port 547b and 547a, respectively, of the delay line 547 via a respective optical path K and J. A second input/output port 548b of the second delay line 548 is coupled to a first input/output port 544a of the second feedback multiplexer 544 via an optical path G; and each of a plurality of n input/output ports 544b of the second feedback multiplexer, $f_3^j(w)$, 544 are connected to an input/output port 549p of a corresponding one of the plurality of n reflectors 549a–549n.

In operation, the output wavelength signals from the lasers sources 541a–541n are multiplexed in the forward multiplexer 543, and the multiplexed signal is transmitted via optical path B to the first broadband power splitter 545 where it is tapped and a main portion thereof is transmitted as the output signal from the system 540 via optical path C. The other portion is used as a feedback signal to the laser sources 541a–541n and initially routed to the loop arrangement 550a comprising the second broadband power splitter 546 and first delay line 547. Therefore, the optical path for the main output signal is A→B→C. The feedback signal has three main components. A first main component of the feedback signal involves the optical paths A→B→D→E→A. A second main component of the feedback signal comprises the optical paths of A→E→D→B→A, and a third main component involves the optical paths of A→E→D→F→G→H→G→F→D→E→A which includes the feedback multiplexer, $f_3^j(w)$, 544. When the signal passes through optical path of the feedback's third main component A→E→D→F→G→H→G→F→D→E→A, it also adds a component to the main output signal at the first power splitter 545. Each signal round trip in the loop arrangement 550a, or cavity arrangement 550b, contributes additional components to the feedback signal to lasers 541a to 541n. The forward multiplexer 543 is designed such that it provides two multiplexed output signals at the second and third output ports 543b and 543c, where the second input/output port 543b is the main multiplexed output port, $f_1^j(w)$, and the third output port 543c is a secondary multiplexer output port, $f_2^j(w)$. In the forward multiplexer 543, $f_1^j(w)$ is the spectral response between the jth input/output port 543a (not shown) and the second input/output port 543b, and $f_2^j(w)$ is the spectral response between the jth input port 543a and the third input/output port 543c. The center wavelength of $f_2^j(w)$ is slightly shifted toward shorter wavelength relative to the center wavelength of $f_1^j(w)$.

An alternative arrangement for the loop arrangement 550a is shown as the cavity arrangement 550b (shown within a dashed line area). The cavity arrangement 550b comprises the broadband power splitter 546 found in the loop arrangement 550a, a first optional delay line 551 and a first broadband reflector 552 coupled in series to the fourth input/output port 546d of a broadband power splitter 546 via optical paths J and L, and a second optional delay line 552 and a second broadband reflector 553 coupled in series to the third input/output port 546c of the broadband power splitter 546 via optical paths K and M.

The operation for multiplexed signals received at the second input/output port 546b of the power splitter 546 is to provide multiple feedback signal components back to the laser sources 541a–541n. The same operation occurs for any multiplexed signal received at the first input/output port 546a of the second power splitter 546 from the third input/output port 543c of the forward multiplexer 543 via optical path E. The main difference between, for example, of the systems 110, 130, 140, 280, and 380 of FIGS. 11, 13, 14, 28, and 38, respectively, is the presence of an additional loop arrangement 550a or 550b in the feedback signal path. The main concept is to tap a portion of the signal traveling through the feedback signal paths of D and E to generate additional components for the feedback signal. The purpose of selectively adding multiple components into a feedback signal using the loop arrangement 550a or 550b is to provide the conditions that cause each of the plurality of lasers 541a–541n to enter into a coherence collapse mode of operation and the laser output signal to become very stable.

Referring now to FIG. 51, there is shown a schematic of a system 580 for feedback stabilizing a plurality of n radiation sources (Laser) 581a–581n (of which only lasers 581a and 581n are shown) in accordance with the fifth embodiment of the present invention. The system 590 comprises the plurality of n lasers 581a–581n, a plurality of n optional Polarization Rotators (PR) 583a–583n (of which only PR 583a and 583n are shown), and a blue shift feedback stabilizing arrangement 582 (shown within a dashed line enclosed area). The blue shift feedback stabilizing arrangement 582 comprises a plurality of n first power splitters 583a–583n (of which only power splitters 584a and 584n are shown), an Arrayed Waveguide Grating (AWG) multiplexer 585, a first broadband power splitter 586, and a loop arrangement 587a comprising a broadband power splitter 588 and a second optional delay line 589. The AWG multiplexer 585 comprises a first Free Propagating Region (FPR) 585e, a second FPR 585f, and a plurality of optical paths 585g interconnecting the first and second FPRs 585e and 585f as is well known in the art. Each of the plurality of laser sources 581a–581n is coupled at a front facet 581p thereof to an input/output port 583p of a corresponding one of the plurality of n optional polarization rotators (PR) 583a–583n via an optical path A. A second input/output port 583q of each the optional PRs 583a–583n is coupled to a first input/output ports 584p of a corresponding one of the plurality of n first power splitters 584a–584n via an optical path B. In each of the plurality of n first power splitters 584a–584n, a second input/output port 584q thereof is coupled to a corresponding one of a plurality of n first input/output ports 585a of the AWG multiplexer 585 via an optical path C, and a third input/output port 584r is coupled to a corresponding one of a plurality of n input/output ports 585d of the AWG multiplexer 585 via an optical path H. A second input/output port 585b of the AWG multiplexer 585 is coupled to a first input/output port 586a of the broadband power splitter 586 via an optical path D. In the broadband power splitter 586, a second output port 586b thereof provides an output signal from the system 580 to any predetermined downstream device (not shown) via an optical path E, and a third input/output port 587c thereof is coupled to a first input/output port 588a of the broadband power splitter 588 in the loop arrangement 587a via an optical path F. A second input/output port 588b of the broadband power splitter 588 in the loop arrangement 587a is coupled to a third input/output port 585c of the AWG multiplexer 585 via an optical path G. The AWG multiplexer 585 can be replaced by an Eschelle grating that provides essentially the same function as the AWG multiplexer 585.

In operation, the output signals from the lasers 581a–581n are optionally polarization rotated by the PRs 583a–583n and transmitted to the plurality of n first power splitters 584a–584n. In the first power splitters 584a–584n, the received signal from the corresponding one of the PRs 583a–583n is tapped and a first major portion is transmitted via input/output port 584q to the corresponding one of the first input/output ports 585a of the AWG multiplexer 585 for transmission to the first input/output port 586a of the broadband power splitter 586 via optical paths C and D. The spectral response in the AWG multiplexer 505 between the input/output ports 585a and 585b is $f_1^j(w)$. A second portion of the tapped signal is transmitted via input/output port 584r to the corresponding one of the fourth input/output ports 585d of the AWG multiplexer 585 for transmission to the second input/output port 588b of the broadband power splitter 588 in the loop arrangement 587a via optical paths H and G. In the broadband power splitter 586, the received multiplexed signal received via optical path D at the first input/output port 586a is tapped and a first major portion thereof is routed to the second output port 586b as the main output signal from the system 580 via optical path E, and the other portion thereof is transmitted via the third input/output port 586c to the first input/output port 588a of the broadband power splitter 588 of the broadband power splitter 588 of the loop arrangement 587a. In the loop arrangement 587a, a multiplexed signal received at either one of the first and second input/output ports 588a and 588b are split and a first portion is sent to the second and first input ports 588b and 588a, respectively, and a second portion is transmitted through the optional delay line 589. The first portion transmitted via the second input/output port 588b of the broadband power splitter 588 is a feedback signal being sent via the AWG multiplexer 585 and the optical paths G→H→B→A to the plurality of lasers 581a–581n. The spectral response in the first AWG multiplexer 585 between the input/output ports 585c and 585d is $f_2^j(w)$.

An alternative arrangement for the loop arrangement 587 is shown as the loop arrangement 587b (shown within a dashed line area). The loop arrangement 587b comprises the broadband power splitter 588, a first optional delay line 590 and a first broadband reflector 591 coupled in series to the third input/output port 588c of a broadband power splitter 588 via optical paths L and M, and a second optional delay line 592 and a second broadband. reflector 593 coupled in series to the fourth input/output port 588d of the broadband power splitter 588 via optical paths O and P. The operation and purpose of each of the loop arrangements 587a and 587b is the same as that described for the loop arrangements 550a and 550b, respectively, shown in FIG. 50.

It is to be appreciated and understood that the specific embodiments of the present invention that have been described are merely illustrative of the general principles of the present invention. Various modifications may be made by those skilled in the art that are consistent with the principles of the present invention. For example, one or more optional delay lines can be placed in the feedback path of the feedback arrangements of each of the systems of each of the embodiments to produce a desired incoherent feedback signal at the output port of each laser source in order to place the laser source in a "coherence collapse" mode, as is well known in the art, and thereby stabilize the laser source. In this regard see, for example, the paper entitled "Wavelength and intensity stabilization of 980 nm diode lasers coupled to fibre Bragg gratings" by B. F. Ventrudo et al., in Electronics Letters, 8th Dec. 1984, Vol. 30, No. 25, at pages 2147–2149, and the book entitled "Diode Lasers and Photonic Integrated Circuits" by L. A. Coldren and S. W. Corzine, Published by Wiley & Sons, 1995, at pages 252–257. When in the specification the terms coupled or coupling or couples are used, it is meant to describe that two elements (components, devices) are connected together, either directly, or through some third element. For example, an output port of a laser can be coupled via air, or an optical waveguide, to an input of a power splitter, or a filter, or a multiplexer/filter. Still further, an output port of a first filter, whose input is coupled to an output of a laser, can be coupled through a second filter to an output of a laser. Furthermore, the part of a laser at which light is emitted during operation thereof may also be denoted as an output or as an input/output of the laser. In the case where a laser inherently generates an output signal having blue shift in wavelength in response to a feedback signal, the arrangements 34 and 44 of FIGS. 3 and 5, respectively, are more accurately described as "a red shift feedback stabilizing arrangement 34".

What is claimed is:

1. A stabilized laser system comprising:
   at least one laser; and
   a main transmission filter and a feedback transmission filter, each transmission filter having first and second ports with the first ports of both transmission filters being coupled to an output of the at least one laser, and each of the transmission filters comprising a different spectral wavelength response as a function of wavelength;
   the second port of the main transmission filter being coupled to an output of the stabilized laser system; and
   a feedback arrangement comprising one of a group consisting of a reflector coupled to the second port of the feedback transmission filter, and a loop coupled between the second ports of the main and feedback transmission filters for generating a feedback signal to the output of the at least one laser.

2. The stabilized laser system of claim 1 wherein the main and feedback transmission filters comprising one of a group consisting of (a) separate sections of a single transmission filter, and (b) separate first and second transmission filters, respectively.

3. The stabilized laser system of claim 1 wherein:
   the at least one laser comprises a plurality of n lasers;
   the main and feedback transmission filters comprising one of a group consisting of (a) separate multiplexer sections of a single multiplexer, and (b) separate first and second multiplexers, respectively; and
   each multiplexer having a plurality of n first ports coupled to corresponding ones of the plurality of n lasers, and said second port.

4. The stabilized laser system of claim 3 wherein each multiplexer comprises one of a group consisting of an Arrayed Waveguide grating, Eschelle grating, Mach-Zehnder interferometer, bulk grating, thin film filters, and optical fiber filters.

5. The stabilized laser system of claim 1 wherein:
   the at least one laser comprises a plurality of n lasers:
   the main transmission filter is a forward multiplexer comprising a plurality of n first and fifth ports, and second, third, and fourth ports, the plurality of n first ports being coupled to corresponding ones of output ports of the plurality of n lasers;
   the feedback transmission filter is a feedback multiplexer comprising a plurality of n first ports and a second port, the plurality of n first ports being coupled to the plurality of n fifth ports of the forward multiplexer;
   a reflector coupled to the second port of the feedback multiplexer;
   a power splitter comprising first, second, third and fourth ports, the first, third, and fourth ports port being coupled to the second, third, and fourth ports of the forward multiplexer, and the second port being coupled to an output of the laser system; and
   the power splitter causing a signal received at each of the first and fourth ports to be split into first and second portions that are delivered to the second and third ports thereof, respectively, and a signal received at third port is split into first and second portions that are delivered to the first and fourth ports thereof, respectively.

6. The stabilized laser system of claim 5 wherein each multiplexer comprises one of a group consisting of an Arrayed Waveguide grating, Eschelle grating, Mach-Zehnder interferometer, bulk grating, thin film filters, and optical fiber filters.

7. A stabilized laser system for generating a signal at an output thereof having a desired wavelength comprising:
   at least one laser; and
   means coupled to the at least one laser for generating, from a portion of a signal generated thereby, a feedback signal having a wavelength that is different from the desired wavelength and feeding the feedback signal back to an output of the laser for stabilizing the laser system at the desired wavelength.

8. A stabilized laser system for generating a signal at an output thereof having a desired center wavelength comprising:
   at least one laser, which, while emitting light and having a preselected portion thereof fed back to an output thereof thereto, causes the output signal of the at least one laser source to be shifted in wavelength in a first direction which is spaced apart from the center wavelength of the fed back signal; and
   means coupled to the at least one laser for generating a feedback signal to the output of the at least one laser having a spectral response peaking at a wavelength shifted in an opposite direction to the first direction generated by at least one laser in response to the feedback signal so as to provide an output signal at the output of the stabilized laser system having a spectral response that peaks essentially at the desired wavelength.

9. The stabilized laser system of claim 8 wherein an entire path of the feedback signal generating means in which the feedback signal for the at least one laser is propagating must preserve a polarization state of the feedback signal.

10. The stabilized laser system of claim 8 wherein:
    the at least one laser is a single laser, and
    the feedback generating means comprising:
    a main transmission filter having a first filter spectral response as a function of wavelength and coupled in a first signal path between an output port of the laser and the output of the stabilized laser system;
    a power splitter coupled in the signal path between an output of the laser and the output of the stabilized laser system for splitting the output signal from the laser received at a first port thereof into first and second portions, the first portion being directed to a second port thereof and transmitted along the first signal path towards the output of the stabilized laser system, and the second portion being directed to a third port thereof and transmitted along a second signal path; and
    a feedback transmission filter comprising a second spectral response peaking at a wavelength that is shifted in an opposite direction to the first direction for receiving the second portion from the power splitter at a first port thereof and generating therefrom a filtered output signal at a second port thereof that is coupled back to the output of the laser along one of a group consisting of the first signal path and the second signal path.

11. The stabilized laser system of claim 10 wherein the power splitter is formed from one of a group consisting of a directional coupler (DC), a multimode interference (MMI) coupler, asymmetric Y junctions, a Mach-Zehnder interferometer, and free space optics using thin film.

12. The stabilized laser system of claim 10 wherein the feedback signal generating means further comprises one of a group consisting of a reflector for returning the signal from the second port of the feedback transmission filter back to said second port and then through the power splitter to the output port of the laser, and a loop for coupling the signal from the second port of the feedback transmission filter back through the main transmission filter and the power splitter to the output port of the laser.

13. The stabilized laser system of claim 10 wherein:
the power splitter is coupled in the signal path between one of a group consisting of an output of the laser and the main transmission filter and the main transmission filter and the output of the laser system, and splits any signals received concurrently at the second and third ports from the first and second paths, respectively, that are propagating towards the laser into first and second portions thereof, the first portion being coupled back to the laser as the feedback signal and the second portion being delivered to a fourth port of the power splitter; and
the feedback signal generating means further comprises:
a second feedback transmission filter comprising a third filter spectral response as a function of wavelength for receiving at a first port thereof a signal appearing at the fourth port of the power splitter and generating therefrom a filtered output signal at a second port thereof; and
a reflector coupled to the second port of the second feedback transmission filter for returning a reflected signal back through the second feedback transmission filter to the fourth port of the power splitter.

14. The stabilized laser system of claim 10 wherein:
the power splitter is coupled in the signal path between an output of the laser and the main transmission filter; and
the feedback signal generating means further comprises a second power splitter coupled between the main transmission filter and the output of the stabilized laser system for receiving at a third port thereof the output signal from the second port of the feedback transmission filter and directing said output signal via a first port thereof back through the main transmission filter and the first power splitter as the feedback signal to the laser.

15. The stabilized laser system of claim 14 wherein:
the first power splitter splits any signals received from the main transmission filter at the second port thereof and the first feedback transmission filter at the third port thereof into first and second portions thereof, the first portion being directed back to the laser as a feedback signal and the second portion is delivered to a fourth port thereof;
the second power splitter splits the signals received from the second port of the first feedback transmission filter into first and second portions, the first portion being transmitted back through the main transmission filter and the first power splitter to the laser as the feedback signal, and the second portion being delivered to a fourth port of the second power splitter; and the feedback signal generating means further comprises:
a second feedback transmission filter comprising a third filter spectral response for receiving at a first port thereof a second portion of the output signal from the fourth port of the second power splitter and generating therefrom an output signal at a second port thereof; and
a third feedback transmission filter having a fourth filter spectral response for receiving at a first port thereof a portion of the output signal from the fourth port of the first power splitter and generating therefrom an output signal at a second port thereof; and
first and second reflectors that are coupled to the second ports of the second and third feedback transmission filters, respectively.

16. The stabilized laser system of claim 14 wherein each of the first and second power splitters is formed from one of a group consisting of a directional coupler (DC), a multimode interference (MMI) coupler, asymmetric Y junctions, a Mach-Zehnder interferometer, and free space optics using thin film.

17. The stabilized laser system of claim 14 wherein:
the first power splitter is serially coupled between the main transmission filter and the second power splitter: and
the feedback signal generating means further comprises:
a second feedback transmission filter comprising a third filter spectral response for receiving at a first port thereof a second portion of the output signal from the fourth port of the second power splitter and generating therefrom an output signal at a second port thereof;
a third feedback transmission filter having a fourth filter spectral response for receiving at a first port thereof a portion of the output signal from the fourth port of the first power splitter and generating therefrom an output signal at a second port thereof; and
first and second reflectors that are coupled to the second ports of the second and third feedback transmission filters, respectively.

18. The stabilized laser system of claim 8 wherein:
the at least one laser comprises a plurality of n lasers that generate separate wavelength output signal, and
the feedback signal generating means comprises a forward multiplexer coupled in a first signal path between an output port of each of the plurality of n lasers and the output of the stabilized laser system for filtering with a first predetermined spectral response as a function of wavelength and concurrently multiplexing output wavelength signals received at a plurality of n first ports from the plurality of n lasers, respectively, to generate a first multiplexed output signal at a second port thereof for transmission as the output signal from the laser system, and for filtering with a second predetermined spectral response as a function of wavelength any signals being multiplexed while propagating between the first ports and a third port thereof, and a feedback signal being demultiplexed while propagating between the third port and the first ports thereof and fed back to the plurality of n lasers.

19. The stabilized laser system of claim 18 wherein the feedback signal generating means further comprises one of a group consisting of (a) a power splitter comprising first and third ports coupled to the second and third ports of the forward multiplexer, and a second port for providing the output signal from the laser system, wherein a signal received at the first port thereof is split into first and second portions for delivery to the second and third ports thereof, respectively, and (b) a reflector coupled to the third port of the forward multiplexer for returning the received multiplexed signal as a feedback signal to said third port and in turn back to the plurality of n lasers.

20. The stabilized laser system of claim 19 wherein the feedback signal generating means further comprises a delay line coupled in a path between the third ports of the each of the power splitter and the forward multiplexer.

21. The stabilized laser system of claim 18 wherein the feedback signal generating means further comprises a power splitter comprising first, second, and third ports where the first and third ports thereof are coupled to the second and third ports, respectively, of the forward multiplexer such that the multiplexed signal received at the first port thereof is split into first and second portions and the first portion is transmitted via the second port thereof as the output signal from the laser system, and the second portion is delivered to the third port thereof as a feedback signal to the plurality of n lasers via the third and first ports of the forward multiplexer.

22. The stabilized laser system of claim 21 wherein the laser system further comprises a plurality of n polarization rotators, each polarization rotator being coupled between a corresponding one of the plurality of n lasers and the corresponding one of the plurality of n first port of the forward multiplexer.

23. The stabilized laser system of claim 21 wherein:
the forward multiplexer further comprises a fourth port and a plurality of n fifth ports;
the power splitter comprises a fourth port coupled to the fourth port of the forward multiplexer; and
the laser system further comprises an optional delay line coupled in the signal path between the fourth ports of the forward multiplexer and the power splitter.

24. The stabilized laser system of claim 23 wherein the feedback signal generating means further comprises a plurality of n reflectors, each reflector being coupled to a corresponding one of the plurality of n fifth ports of the forward multiplexer.

25. The stabilized laser system of claim 23 wherein the feedback signal generating means further comprises:
a first feedback multiplexer comprising a predetermined second spectral response, a plurality of n first ports, and a second port, each one of the plurality of n first ports is coupled to a corresponding one of the plurality of n fifth ports of the forward multiplexer for multiplexing wavelength signal received at the fifth ports to a multiplexed signal at the second port and vice versa; and
a reflector coupled to the second port of the first feedback multiplexer for returning a received signal back to said second port.

26. The stabilized laser system of claim 25 wherein each multiplexer comprises one of a group consisting of an Arrayed Waveguide grating, Eschelle grating, Mach-Zehnder interferometer, bulk grating, thin film filters, and optical fiber filters.

27. The stabilized laser system of claim 21 wherein:
the power splitter comprises a fourth port wherein a signal received at the fourth port is split into a first and second portions and delivered to the second and third ports thereof, respectively; and
the feedback signal generating means further comprises:
a reflector coupled to the fourth port of the power splitter: and
an optional delay line coupled in the signal path between the reflector and the fourth port of the power splitter.

28. The stabilized laser system of claim 21 wherein:
the power splitter is a broadband power splitter further comprising a fourth port such that a signal received at the third port is split into first and second portions and delivered to the first and fourth ports, respectively, and a signal received at the fourth port is split into first and second portions and delivered to the second and third ports, respectively; and
the laser system further comprising:
a feedback multiplexer comprising a first port and a plurality of n second ports, the first port thereof being coupled to the fourth port of the power splitter;
a plurality of n reflectors, each of the reflectors being coupled to a corresponding one of the plurality of n second ports of the feedback multiplexer; and
an optional loop arrangement coupled in the path between the third port of the forward multiplexer and the third port of the broadband power splitter, the optional loop arrangement comprising:
a power splitter comprising a first, a second, a third, and a fourth port, the first and second ports being coupled to the third port of the forward multiplexer and the third port of the broadband power splitter, respectively, where signals received at the first and fourth ports thereof are split into first and second portions for delivery to the second and third ports thereof, respectively, and signals received at the second and third ports thereof are split into first and second portions for delivery to the first and fourth ports thereof, respectively; and
a feedback cavity comprising one of a group consisting of (a) an optional delay line coupled between the third and fourth ports of the power splitter, and (b) a combination of a first optional delay line coupled to the third port of the power splitter that is serially coupled to a first optional reflector, and a second optional delay line coupled to the fourth port of the power splitter that is serially coupled to a second optional reflector.

29. The stabilized laser system of claim 8 wherein:
the at least one laser comprises a plurality of n lasers each laser generating a predetermined wavelength output signal at an output port thereof, and
the feedback signal generating means comprises:
a plurality of n first power splitters, each power splitter comprising first, second, and third ports, the first port being coupled to the output port of a corresponding one of the plurality of n lasers for splitting a signal received from the corresponding laser into first and second portions which are delivered to the second and third ports, respectively, and vice versa; and
a forward multiplexer comprising a plurality of n first ports and a second port, each of the plurality of n first ports being coupled to the second port of a corresponding one of the plurality of n power splitters, and the forward multiplexer couples the plurality of n first ports and the second port thereof while generating a multiplexed output signal using a respective first spectral response as a function of wavelength.

30. The stabilized laser system of claim 29 wherein:
the forward multiplexer further comprises a third port and a plurality of n fourth ports, each of said fourth ports being coupled to a third port of a corresponding one of the plurality of n first power splitters, and the forward multiplexer functions to demultiplex the signals received at the third port using a second spectral response as a function of wavelength and delivering the demultiplexed signals to the corresponding one of the plurality of n fourth ports thereof, and vice versa; and the feedback signal generating means further comprises a second power splitter comprising a first, second, and third port, the first port being coupled to the second port of the forward multiplexer, the second port providing the output of the stabilized laser system, and the third port being coupled to the third port of the forward multiplexer, the second power splitter functioning to split a signal received at the first port into first and second portions which are delivered to the second and third ports thereof, respectively.

31. The stabilized laser system of claim 30 further comprising a plurality of n polarization rotators, each polarization rotator being couple between a corresponding one of the plurality of n lasers and the plurality of n first power splitters.

32. The stabilized laser system of claim 30 wherein:
each of the plurality of n first power splitters further comprises a fourth port such that any signals received at the second and third ports thereof is split into first and second portions thereof for delivery to the first and fourth ports thereof, respectively;
the second power splitter further comprises a fourth port such that any signals received at the second and third ports thereof is split into first and second portions thereof for delivery to the first and fourth ports thereof, respectively; and vice versa; and
the feedback signal generating means further comprising:
a feedback multiplexer comprising a plurality of n first ports and a second port, each of the plurality of n first ports being coupled to a fourth port of a corresponding one of the plurality of n first power splitters, the second port being coupled to the fourth port of the second power splitter, and the feedback multiplexer functions to multiplex the signals received at the plurality of first ports using a second spectral response as a function of wavelength and delivering the multiplexed signal to the second port thereof, and vice versa; and
an optional delay line coupled in a signal path between the second port of the feedback multiplexer and the fourth port of the second power splitter.

33. The stabilized laser system of claim 30 wherein the feedback signal generating means further comprises:
an optional loop arrangement coupled in the path between the third port of the forward multiplexer and the third port of the second power splitter, the optional loop arrangement comprising:
a power splitter comprising a first, a second, a third, and a fourth port, the first and second ports being coupled to the third port of the first feedback multiplexer and the third port of the second power splitter, respectively, where signals received at the first and fourth ports thereof are split into first and second portions for delivery to the second and third ports thereof, respectively, and signals received at the second and third ports thereof are split into first and second portions for delivery to the first and fourth ports thereof, respectively; and
a feedback cavity comprising one of a group consisting of (a) an optional delay line coupled between the third and fourth ports of the power splitter, and (b) a combination of a first optional delay line coupled to the third port of the power splitter that is serially coupled to a first optional reflector, and a second optional delay line coupled to the fourth port of the power splitter that is serially coupled to a second optional reflector.

34. The stabilized laser system of claim 29 wherein:
each of the plurality of n first power splitters further comprises a fourth port such that any signals received at the second and third ports thereof is split into first and second portions thereof for delivery to the first and fourth ports thereof, respectively;
the laser system further comprises:
a second power splitter comprising a first, second, third, and fourth port such that any signals received at the second and third ports thereof is split into first and second portions thereof for delivery to the first and fourth ports thereof, respectively, and vice versa; and
the feedback signal generating means further comprising:
a first feedback multiplexer comprising a plurality of n first ports and a second port, each of the plurality of n first ports being coupled to a fourth port of a corresponding one of the plurality of n first power splitters, the first feedback multiplexer functions to multiplex the signals received at the plurality of first ports using a second spectral response as a function of wavelength and delivering the multiplexed signal to the second port thereof, and vice versa;
a first reflector coupled to the second port of the first feedback multiplexer;
a second feedback multiplexer comprising a plurality of n first ports and a second port, each of the plurality of n first ports being coupled to a third port of a corresponding one of plurality of n first power splitters, the second feedback multiplexer functions to multiplex the signals received at the plurality of n first ports using a third spectral response as a function of wavelength and delivering the multiplexed signal to the second port thereof, and vice versa;
an optional loop arrangement coupled in the path between the second port of the second feedback multiplexer and the third port of the second power splitter, the loop arrangement comprising:
a power splitter comprising a first, a second, a third, and a fourth port, the first and second ports being coupled to the second port of the second feedback multiplexer and the third port of the second power splitter, respectively, where signals received at the first and fourth ports thereof are combined and split into first and second portions for delivery to the second and third ports thereof, respectively, and signals received at the second and third ports thereof are combined and split into first and second portions for delivery to the first and fourth ports thereof, respectively; and
a feedback cavity comprising one of a group consisting of (a) an optional delay line coupled between the third and fourth ports of the power splitter, and (b) a combination of a first optional delay line coupled to the third port of the power splitter that is serially coupled to a first optional reflector, and a second optional delay line coupled to the fourth port of the power splitter that is serially coupled to a second optional reflector;
a third feedback multiplexer comprising a plurlaity of n first ports and a second port, the second port being coupled to the fourth port of the second power splitter, the third feedback multiplexer functions to multiplex the signals received at the plurality of n first ports using a fourth spectral response as a function of wavelength and delivering the multiplexed signal to the second port thereof, and vice versa; and
a plurlaity of n second reflectors, each reflector being couple to a corresponding one of the plurality of n first ports of the third feedback multiplexer.

35. The stabilized laser system of claim 29 wherein the feedback signal generating means further comprises:
- a feedback multiplexer comprising a plurality of n first ports and a second port, each of the plurality of n first ports being coupled to a third port of a corresponding one of the plurality of n first power splitters, and the feedback multiplexer functions to multiplex the signals received at the plurality of first ports using a second spectral response as a function of wavelength and delivering the multiplexed signal to the second port thereof, and vice versa; and
- a second power splitter comprising a first, second, and third port, the first port being coupled to the second port of the forward multiplexer, the second port providing the output of the stabilized laser system, and the third port being coupled to the second port of the feedback multiplexer, the second power splitter functioning to split a signal received at the first port into first and second portions which are delivered to the second and third ports thereof, respectively, and vice versa.

36. The stabilized laser system of claim 35 wherein:
- each of the plurality of n first power splitters further comprises a fourth port wherein a signal received at the fourth port is split into a first and second portions and delivered to the second and third ports thereof, respectively, and signals received at the second and third ports are split into a first and second portions and delivered to the first and fourth ports thereof, respectively;
- the second power splitter further comprises a fourth port such that any signals received at the second and third ports thereof is split into first and second portions thereof for delivery to the first and fourth ports thereof, respectively, and vice versa; and
- the feedback signal generating means further comprises a second feedback multiplexer comprising a plurality of n first ports and a second port, each of the plurality of n first ports being coupled to a fourth port of a corresponding one of the plurality of n first power splitters, the second port thereof is coupled to the fourth port of the second power splitter, and the second feedback multiplexer functions to multiplex the signals received at the plurality of first ports using a third spectral response and delivering the multiplexed signal to the second port thereof, and vice versa.

37. The stabilized laser system of claim 29 wherein the feedback signal generating means further comprises:
- a feedback multiplexer comprising a plurality of n first ports and a second port, each of the plurality of n first ports being coupled to a third port of a corresponding one of the plurality of n first power splitters, the feedback multiplexer functioning to multiplex wavelength signals received at the plurality of first ports using a second spectral response and delivering the multiplexed signal to the second port thereof; and
- a reflector coupled to the second port of the feedback multiplexer for returning a received signal back to said second port.

38. The stabilized laser system of claim 37 wherein:
- each of the plurality of n first power splitters further comprises a fourth port wherein a signal received at the fourth port is split into a first and second portions and delivered to the second and third ports thereof, respectively; and
- the feedback signal generating means further comprises:
- a second feedback multiplexer comprising a plurality of n first ports and a second port, each of the plurality of n first ports being coupled to the fourth third port of a corresponding one of the plurality of n first power splitters, the second feedback multiplexer functioning to multiplex wavelength signals received at the plurality of first ports using a third spectral response and delivering the multiplexed signal to the second port thereof; and
- a reflector coupled to the second port of the second feedback multiplexer for returning a received signal back to said second port.

39. The stabilized laser system of claim 37 further comprising a plurality of n polarization rotators, each polarization rotator being couple between a corresponding one of the plurality of n lasers and the plurality of n first power splitters.

40. The stabilized laser system of claim 39 further comprising:
- a plurality of n polarization rotators, each polarization rotator being coupled between a corresponding one of the plurality of n lasers and the first port of a corresponding one of the plurality of n power splitters;
- an optional delay line coupled in a signal path between the second port of the feedback multiplexer and the reflector; and
- each of the forward and feedback multiplexer comprises one of a group consisting of an Arrayed Waveguide grating, Eschelle grating, Mach-Zehnder interferometer, bulk grating, thin film filters, and optical fiber filters.

41. The stabilized laser system of claim 29 wherein:
- the forward multiplexer further comprises a third port and a plurality of n fourth ports, and functions to demultiplex the signals received at the third port thereof using a second spectral response as a function of wavelength and delivering the demultiplexed signal to corresponding ones of the plurality of fourth ports, and vice versa, the plurality of n fourth ports being coupled to corresponding ones of the plurality of third ports of the plurality of n first power splitters; and
- the feedback signal generating means further comprises a reflector coupled to the third port of the forward multiplexer for returning a received signal back to said third port.

42. The stabilized laser system of claim 41 further comprising a plurality of n polarization rotators, each polarization rotator being couple between a corresponding one of the plurality of n lasers and the plurality of n first power splitters.

43. The stabilized laser system of claim 8 wherein:
the at least one laser comprises a plurality of n lasers; and
the feedback generating means comprising:
- a forward multiplexer comprising a first filter spectral response as a function of wavelength a plurality of n first ports and a second port, each of the plurality of n first ports being coupled to an output port of a corresponding one the plurality of n lasers, and the second port being coupled to the output of the stabilized laser system;
- a broadband power splitter comprising first, second and third ports, the first port being coupled to the second port of the forward multiplexer, the second port being coupled to the output of the stabilized laser system where a signal received at the first port is split into first and second portions for delivery to the second and third ports, respectively; and
- a feedback multiplexer comprising a second filter spectral response as a function of wavelength, a plurality of first ports, and a second port, the second port being coupled to the third port of the broadband power splitter, and the plurality of first ports being coupled to one of a group consisting of (a) a plurality of n reflectors coupled to a corresponding one of the plurality of first ports of the feedback multiplexer, and (b) a corresponding one of a plurality of n second ports of a second section of the feedback multiplexer further comprising a second port coupled to a reflector.

44. The stabilized laser system of claim 43 wherein:
the broadband power splitter further comprises a fourth port; and
the feedback generating means further comprising:
a second feedback multiplexer comprising third filter spectral response as a function of wavelength, a plurality of first ports, and a second port, the second port being coupled to the fourth port of the broadband power splitter; and
a plurality of n reflectors, each reflector being coupled to a corresponding one the plurality of n second ports of the second feedback multiplexer.

45. The stabilized laser system of claim 43 wherein:
the broadband power splitter further comprises a fourth port; and
the feedback generating means further comprising:
a second feedback multiplexer arrangement comprising a first and second multiplexer subsection thereof, third filter spectral response as a function of wavelength, and each multiplexer subsection comprises a plurality of first ports, and a second port, the second port of the first multiplexer subsection being coupled to the fourth port of the broadband power splitter, and the plurality of n first ports of the first multiplexer subsection are coupled to corresponding ones of the plurality of n first ports of the second multiplexer subsection; and
a reflector coupled to the second port of the second multiplexer subsection.

46. The stabilized laser system of claim 8 wherein:
the at least one laser comprises a plurality of n lasers; and
the feedback generating means comprising:
a forward multiplexer comprising a first filter spectral response as a function of wavelength a plurality of n first ports and a second port, each of the plurality of n first ports being coupled to an output port of a corresponding one the plurality of n lasers;
a first broadband power splitter comprising first, second, third, and fourth ports, the first port being coupled to the second port of the forward multiplexer, where signals received at the first and fourth ports are split into first and second portions for delivery to the second and third ports, respectively, and vice versa;
a second broadband power splitter comprising first, second, third, and fourth ports, the first port being coupled to the second port of the first broadband power splitter, the second port being coupled to provide an output from the laser system, where signals received at the first and fourth ports are split into first and second portions for delivery to the second and third ports, respectively, and vice versa;
a first feedback multiplexer arrangement comprising a second filter spectral response as a function of wavelength, a first and second feedback multiplexer subsection where each multiplexer subsection comprises a plurality of first ports, and a second port, the plurality of first ports of the first multiplexer subsection being coupled to corresponding ones of the plurality of n first ports of the second multiplexer subsection, the second port of the first multiplexer subsection being coupled to the third port of the first broadband power splitter, and the second port of the second multiplexer subsection being coupled to the third port of the second broadband power splitter.

47. The stabilized laser system of claim 46 further comprising:
an optional delay line coupled in a path coupling the fourth ports of the first and second broadband power splitters.

48. The stabilized laser system of claim 46 further comprising:
first and second broadband reflectors coupled to the fourth ports of the first and second broadband power splitters, respectively, through respective separate first and second optional delay lines.

49. The stabilized laser system of claim 46 further comprising:
a second feedback multiplexer arrangement comprising a third filter spectral response as a function of wavelength, a first and second feedback multiplexer subsection thereof where each multiplexer subsection comprises a plurality of first ports, and a second port, the plurality of first ports of the first multiplexer subsection being coupled to corresponding ones of the plurality of n first ports of the second multiplexer subsection, the second port of the first multiplexer subsection being coupled to the fourth port of the first broadband power splitter, and the second port of the second multiplexer subsection being coupled to the fourth port of the second broadband power splitter.

50. The stabilized laser system of claim 46 further comprising:
a second feedback multiplexer arrangement comprising a third filter spectral response as a function of wavelength, a first and second feedback multiplexer subsection thereof where each multiplexer subsection comprises a plurality of first ports, and a second port, the plurality of first ports of the first multiplexer subsection being coupled to corresponding ones of the plurality of n first ports of the second multiplexer subsection, the second port of the first multiplexer subsection being coupled to the fourth port of the first broadband power splitter;
a third feedback multiplexer arrangement comprising a fourth filter spectral response as a function of wavelength, a first and second feedback multiplexer subsection thereof where each multiplexer subsection comprises a plurality of first ports, and a second port, the plurality of first ports of the first multiplexer subsection being coupled to corresponding ones of the plurality of n first ports of the second multiplexer subsection, the second port of the first multiplexer subsection being coupled to the fourth port of the second broadband power splitter; and
first and second broadband reflectors, the first reflector being coupled to the second port of the second multiplexer subsection of the second feedback multiplexer arrangement, and the second reflector being coupled to the second port of the second multiplexer subsection of the third feedback multiplexer arrangement.

51. A stabilized laser system for generating a signal at an output thereof having a desired central wavelength comprising:
at least one laser, each laser thereof, which while emitting light at the desired central wavelength and having a preselected portion thereof fed back to an output thereof, causes an output signal of the at least one laser source to be shifted in wavelength in a first direction which is spaced apart from the central wavelength of the fed back signal;

a first and a second transmission filter, each transmission filter comprising a different wavelength spectral response and first and second ports;

an output signal from the laser being coupled to the input of the first transmission filter such that at least a first portion of any signal emitted by the laser is transmitted to the first port of the first transmission filter, and the second port of the first transmission filter being coupled to an output of the stabilized laser system; and the output of the laser being coupled to the first port of the second transmission filter such that at least a second portion of any signal emitted by the laser is transmitted to the first port of the second transmission filter, and the second port of the second transmission filter being coupled to the output of the laser such that any signal generated at the second port of the second transmission filter, whose spectral response peaks at a wavelength shifted in an opposite direction to that generated by the at least one laser in response to a feedback signal, is fed back to the laser so as to provide at the output of the stabilized laser system an output signal having a spectral response that peaks at the desired central wavelength.

52. The stabilized laser system of claim 51 wherein the at least one laser is a single laser, and the laser system further comprises:

a power splitter comprising a first port coupled to one of a group consisting of (a) the output of the laser, and (b) the second port of the first transmission filter for splitting a signal received at a first port thereof into first and second portions for transmission from second and third ports, respectively, the second port being coupled to one of a group consisting of (a) the first port of the first transmission filter and (b) an output of the laser system, and the third port being coupled to the first port of the second transmission filter; and a feedback arrangement coupled to the second port of the second transmission filter for directing an output signal therefrom back to the output of the laser comprising one of a group consisting of a reflector for returning an output signal at the second port from the second transmission filter back through the second transmission filter, and a loop coupling the second ports of the first and second transmission filters for returning the output signal from the second transmission filter back through the first transmission filter.

53. The stabilized laser system of claim 52 wherein:

the second port of the second transmission filter is coupled to a reflector;

the power splitter further comprising a fourth port, the power splitter splitting a signal received at a fourth port thereof into a first and second portions for transmission from the second and third ports, respectively, and for splitting a signal received at each of the second and third ports thereof into a first and second portion for transmission from first and fourth ports, respectively; and the stabilized laser system further comprises:

a third transmission filter comprising a spectral response which is different than that of the first and second transmission filters and a first and second port, the first port thereof being coupled to the fourth port of the power splitter; and a second reflector coupled to the second port of the third transmission for returning a received signal back through the third transmission filter.

54. The stabilized laser system of claim 52 further comprising a second power splitter comprising a first, second, and third port, where the first port is coupled to the second port of the first transmission filter for dividing the signal at the first port of the second power splitter into a first and second portions thereof for transmission from the second and third ports thereof, respectively, and vice versa, the second port thereof being coupled for transmitting the first portion as an output signal from the stabilized laser system, and the third port thereof being coupled to the second port of the second transmission filter.

55. The stabilized laser system of claim 54 wherein each of the first and second power splitters is formed from one of a group consisting of a directional coupler (DC), a multi-mode interference (MMI) coupler, asymmetric Y junctions, a Mach-Zehnder interferometer, and free space optics using thin film.

56. The stabilized laser system of claim 54 wherein:

the first and second power splitters each further comprise a fourth port, each power splitter splitting a signal received at a fourth port thereof into a first and second portions for transmission from the second and third ports, respectively, and for splitting a signal received at each of the second and third ports thereof into a first and second portion for transmission from first and fourth ports, respectively; and the stabilized laser system further comprises a third transmission filter comprising a spectral response as a function of wavelength which is different than that of the first and second transmission filters and a first and second port, the first port thereof being coupled to the fourth port of the second power splitter and the second port thereof being coupled to the fourth port of the first power splitter.

57. The stabilized laser system of claim 51 further comprising:

a third transmission filter a different wavelength spectral response as a function of wavelength than the first and second transmission filters, and a first and second port;

a first power splitter comprising first, second, third, and fourth ports, the first port being coupled to the second port of the first transmission filter, the third port being coupled to the first port of the second transmission filter, and the fourth port being coupled to the second port of the third transmission filter, where signals received at the first and fourth ports are split into a first and second portions thereof for transmission from the second port and third ports thereof, respectively, and vice versa, and signals received at the second and third ports thereof are split into a first and second portions for transmission from the first and fourth ports thereof, respectively, and vice versa; and a second power splitter comprising first, second, third, and fourth ports, the first port being coupled to the second port of the first power splitter, the second port providing an output signal from the laser system, the third port being coupled to the second port of the second transmission filter, and the fourth port being coupled to the first port of the third transmission filter, where signals received at the first and fourth ports are split into a first and second portions thereof for transmission from the second port and third ports thereof, respectively, and vice versa, and signals received at the second and third ports thereof are split into a first and second portions for transmission from the first and fourth ports thereof, respectively, and vice versa.

58. The stabilized laser system of claim 51 further comprising:
a first power splitter comprising a first, second, third, and fourth port, the first port being coupled to the second port of the first transmission filter, the third port being coupled to the first port of the second transmission filter, and the fourth port being coupled to the second port of the second transmission filter, where signals received at the second and third ports thereof are split into first and second portions thereof for transmission from the first and fourth ports thereof, respectively, and vice versa;
a second power splitter comprising first, second, third, and fourth ports, the first port being coupled to the second port of the first power splitter, the second port providing the output signal from the laser system, and the third port being coupled to the second port of the second transmission filter, where signals received at the second and third ports thereof are split into first and second portions thereof for transmission from the first and fourth ports thereof, respectively, and vice versa; and
a third transmission filter comprising a spectral response as a function of wavelength which is different than that of the first and second transmission filters and a first and second port, the first port thereof being coupled to the fourth port of the second power splitter and the second port thereof being coupled to the fourth port of the first power splitter.

59. The stabilized laser system of claim 54 wherein:
the power splitter is a first power splitter and further comprises a fourth port where signals received and the first and fourth ports thereof are split into first and second portions that are delivered to the second and third ports, respectively, and a signal received at the third port is split into first and second portions that are delivered to the first and fourth ports, respectively; and
the laser system further comprises:
a second power splitter comprising first, second, third, and fourth ports, the first port thereof being coupled to an output port of the laser, the second port thereof being coupled to the first port of the first transmission filter, and the third port thereof being coupled to the first port of the second transmission filter;
a third and fourth transmission filter, each transmission filter comprising a separate spectral response as a function of wavelength that is different than the first and second spectral responses, and a first and second ports, the first port of the third and fourth transmission filters being coupled to the fourth ports of the first and second power splitters, respectively; and
a first and second reflector coupled to the second port of the third and fourth transmission filters, respectively.

60. A stabilized laser system for generating a signal at an output thereof having a desired central wavelength comprising:
a plurality of n lasers, each laser, which while emitting light at the desired central wavelength and having a preselected portion thereof fed back to an output thereof thereto, causes the output signals of the plurality of n laser sources to be shifted in wavelength in a first direction which is spaced apart from the central wavelength of the fed back signal;
a multiplexer/filter arrangement comprising a forward multiplexer/filter section and a feedback multiplexer/filter section, each of the forward and feedback multiplexer/filter sections comprising a different wavelength spectral response as a function of wavelength, a plurality of n first ports, and a second port;
an output signal from each of the lasers being coupled to a corresponding one of the plurality of n first ports of the forward multiplexer/filter section such that at least a first portion of the output signal emitted by each of the lasers is transmitted to a corresponding one of the first ports of the forward multiplexer/filter section, and the second port of the forward multiplexer/filter section being coupled to an output of the stabilized laser system; and
the output signal from the second port of the forward multiplexer/filter section is further coupled to the second port of the feedback multiplexer/filter section wherein the received signal is demultiplexed and delivered to the plurality of n first ports of the feedback multiplexer/filter section and each of the plurality of n first ports is coupled to one of a group consisting of (a) a corresponding one of a plurality of n reflectors for returning a received signal back through the forward and feedback multiplexer/filter sections to the corresponding one of the plurality of n lasers, and (b) a second feedback multiplexer/filter subsection comprising a plurality of n first ports, and a second port, where each one of the plurality of n first ports thereof is coupled to a corresponding one of the plurality of n first ports of the first feedback multiplexer/filter subsection, and the second port thereof being coupled to one of a group consisting of a reflector, and a loop for returning the feedback signal through the forward multiplexer/filter to the output of the plurality of n lasers such that any signal generated at the second port of the second multiplexer/filter subsection has a spectral response that peaks at a wavelength shifted in an opposite direction to that generated by each of the plurality of n lasers in response to a feedback signal so as to provide at the output of the stabilized laser system an output signal comprising a spectral response that peaks at the desired central wavelength.

61. The stabilized laser system of claim 60 wherein:
the forward and feedback multiplexer/filter sections comprise different subsections of a same multiplexer/filter; and
the laser system further comprises a broadband power splitter comprising first, second, and third ports, the first port being coupled to the second port of the forward multiplexer/filter section, the second port being coupled to provide an output signal from the laser system, and the third port being coupled to the second port of the feedback multiplexer/filter section.

62. The stabilized laser system of claim 61 wherein each of the forward and feedback multiplexer/filter sections comprises one of a group consisting of an Arrayed waveguide grating, Eschelle grating, Mach-Zehnder interferometer, bulk grating, thin film filters, and optical fiber filters.

63. The stabilized laser system of claim 61 wherein:
the broadband power splitter further comprises a fourth port where signals received at the first and fourth ports are split into first and second portions thereof and delivered to the second and third ports thereof, respectively, and vice versa; and
the laser system further comprises:
a reflector coupled to the fourth port of the broadband power splitter; and an optional delay line coupled between said reflector and the fourth port of the broadband power splitter.

64. The stabilized laser system of claim 61 wherein:
the feedback multiplexer/filter section comprises the first and second multiplexer/filter subsections, the first multiplexer/filter subsection being formed from a subsection of the forward multiplexer/filter section and the second feedback multiplexer/filter subsection being spaced apart from the first multiplexer/filter subsection;
the broadband power splitter further comprises a fourth port where signals received at the first and fourth ports are split into first and second portions thereof and delivered to the second and third ports thereof, respectively, and vice versa; and
the laser system further comprises:
a reflector coupled to the fourth port of the broadband power splitter; and
an optional delay line coupled between said reflector and the fourth port of the broadband power splitter.

65. The stabilized laser system of claim 64 further comprising:
a second broadband power splitter comprising first, second, third, and fourth ports, the first port being coupled to the second port of the first power splitter, the second port being coupled to provide an output signal from the laser system, the third port being coupled to the second port of the second feedback multiplexer/filter subsection where signals received at the first and fourth ports are split into first and second portions thereof and delivered to the second and third ports thereof, respectively, and vice versa;
a second reflector coupled to the fourth port of the second broadband power splitter; and
an second optional delay line coupled between said second reflector and the fourth port of the second broadband power splitter.

66. The stabilized laser system of claim 61 wherein:
the feedback multiplexer/filter section comprises the first and second multiplexer/filter subsections, the first multiplexer/filter subsection being formed from a subsection of the forward multiplexer/filter section and the second feedback multiplexer/filter subsection being spaced apart from the first multiplexer/filter subsection; and
the broadband power splitter is a first power splitter and further comprises a fourth port; and
the laser system further comprises:
a second broadband power splitter comprising first, second, third, and fourth ports, the first port being coupled to the second port of the first power splitter, the second port being coupled to provide an output signal from the laser system, the third port being coupled to the second port of the second feedback multiplexer/filter subsection where signals received at the first and fourth ports are split into first and second portions thereof and delivered to the second and third ports thereof, respectively, and vice versa; and
the fourth ports of the first and second broadband power spitters are coupled together through an optional delay line.

67. A method of stabilizing a laser system to generate an output signal at a desired center wavelength comprising the steps of:
(a) generating a light signal at a desired central wavelength at an input/output of a laser, which, while emitting light at the desired center wavelength and having a preselected portion thereof fed back thereto to its input/output thereof, causes the output signal of the laser to be shifted in wavelength in a first direction which is spaced apart from the center wavelength of the fed back signal;
(b) dividing the signal from the laser into a first and a second portion, said first portion being coupled to an output of the laser system;
(c) processing the second portion of the signal such that the wavelength is shifted in an opposite direction to the first direction; and
(d) feeding back the processed second portion of the signal to the input/output of the laser such that the output signal of the laser system is at essentially the desired wavelength.

68. The method of claim 67 wherein in step (c), performing the step of:
(c1) transmitting the second portion through a transmission filter having a spectral response that shifts the second portion in the opposite direction from the first direction.

69. The method of claim 68 wherein in step (c), performing the additional substep of:
(c2) causing the processed second portion to be reflected back through the transmission filter.

70. The method of claim 67 wherein in step (c), performing the substep of:
(c1) transmitting the first and second portions through first and second bidirectional paths, respectively, of a transmission filter having a first spectral response when processing the first portion propagating in the first directional path, and a second spectral response when processing the second portion propagating in the second directional path.

71. The method of claim 70 wherein in step (c), performing the additional step of:
(c2) transmitting the processed second portion through a loop and back through the first path of the transmission filter to the output of the laser.

72. The method of claim 70 wherein in step (c), performing the additional step of:
(c2) transmitting the processed second portion to impinge a reflector and sent back through the second path of the transmission filter to the output of the laser.

73. A method of stabilizing a laser system to generate an output signal at a desired central wavelength comprising the steps of:
(a) generating a light signal at a desired central wavelength at an input/output of each of a plurality of n laser sources, each laser source, which, while emitting light and having a preselected portion thereof fed back to its intut/output thereof, the output signal thereof is shifted in wavelength in a first direction which is spaced apart from a desired central wavelength of the fed back signal;
(b) dividing the signal from the plurality of n laser sources into a first and a second portions thereof, said first portion being multiplexed before being coupled to an output of the laser system;
(c) processing each of the second portions of the output signals from the plurality of n laser sources such that the wavelength thereof is shifted in an opposite direction to the first direction; and
(d) feeding back each of the processed second portions of the signals from step (c) back to the input/output of a corresponding one of the plurality of n laser sources such that the output signal of the laser system is at essentially the desired wavelength.

74. The method of claim 73 wherein in step (c), performing the substeps of:
- (c1) transmitting each of the second portions through a multiplexer/filter having a spectral response that shifts each of the second portions in the opposite direction from the first direction while concurrently multiplexing the second portions into a multiplexed output signal; and
- (c2) demultiplexing the multiplexed output signal from the multiplexer/filter of step (c1) prior to performing step (d).

75. The method of claim 74 wherein in step (c2), performing the substep of:
- (c3) causing the multiplexed output signal from the multiplexer/filter in step (c1) to be reflected back through the multiplexer/filter prior to performing step (c2).

76. The method of claim 73 wherein in step (c), performing the substep of:
- (c1) transmitting the first and second portions through first and second bidirectional paths, respectively, of a multiplexer/filter having a first spectral response when processing the first portions, and a second spectral response that shifts the second portions in the opposite direction from the first direction.

77. The method of claim 76 wherein in step (c1), performing the additional substep of:
- (c2) transmitting the processed second portions through a loop and back through the first path of the multiplexer/filter to the output of each of the plurality of n laser sources.

78. The method of claim 76 wherein in step (c), performing the additional substep of:
- (c2) transmitting the processed second portions to impinge a reflector and sent back through the second path of the transmission filter to the output of a corresponding one of the plurality of n laser sources.

* * * * *